(12) United States Patent
Elder et al.

(10) Patent No.: US 7,299,029 B2
(45) Date of Patent: *Nov. 20, 2007

(54) METHOD OF OPERATING RADIO RECEIVER IMPLEMENTED IN A SINGLE CMOS INTEGRATED CIRCUIT

(75) Inventors: Joseph S. Elder, Orlando, FL (US); Joseph T. Yestrebsky, Apopla, FL (US); Mohammed D. Islam, Winter Park, FL (US)

(73) Assignee: Micrel, Incorporated, San Jose, CA (US)

( * ) Notice: Subject to any disclaimer, the term of this patent is extended or adjusted under 35 U.S.C. 154(b) by 596 days.

This patent is subject to a terminal disclaimer.

(21) Appl. No.: 10/661,879

(22) Filed: Sep. 11, 2003

(65) Prior Publication Data

US 2004/0058663 A1    Mar. 25, 2004

Related U.S. Application Data

(62) Division of application No. 09/734,844, filed on Dec. 11, 2000, now Pat. No. 6,662,003, which is a division of application No. 09/495,323, filed on Jan. 31, 2000, now Pat. No. 6,278,866, which is a division of application No. 09/075,281, filed on May 8, 1998, now Pat. No. 6,167,246.

(60) Provisional application No. 60/046,023, filed on May 9, 1997.

(51) Int. Cl.
    *H04B 1/28* (2006.01)

(52) U.S. Cl. ............ 455/333; 455/266; 455/313; 455/323

(58) Field of Classification Search ............ 455/189.1, 455/192.1, 234.1, 245.1, 260, 266, 307, 313, 455/314, 318, 319, 323, 324, 333, 338, 339, 455/340, 131, 192, 245
See application file for complete search history.

(56) References Cited

U.S. PATENT DOCUMENTS 4,336,613 A    6/1982    Hewes (Continued)

FOREIGN PATENT DOCUMENTS

WO    WO 98/49779    11/1998

(Continued)

OTHER PUBLICATIONS

PCT Written Opinion for International Application No. PCT/US/99/09995, filed May 6, 1999.

(Continued)

*Primary Examiner*—Quochien B. Vuong
(74) *Attorney, Agent, or Firm*—Bever, Hoffman & Harms, LLP; Patrick T. Bever

(57) ABSTRACT

A single chip superhetrodyne AM receiver is disclosed herein. To compensate for process variations in the implementation of the IC, bias currents setting the operating conditions for various amplifiers and other components in the system are adjusted based on frequency control signals in a PLL circuit in the local oscillator. Since the magnitude of the control signal reflects the process variations, the bias currents are adjusted based on the control signal to offset these variations in other portions of the receiver. To further improve the signal to noise ratio of the receiver, the IF filter is tuned within a range so as not to include any integer multiple or integer divisor of the timing reference frequency. Various techniques are described for enabling a complete superhetrodyne AM receiver to be implemented on a single chip which receives an antenna input signal and outputs a digital data signal.

34 Claims, 78 Drawing Sheets

FULLY INTEGRATED CMOS AM RECEIVER

U.S. PATENT DOCUMENTS

| | | | |
|---|---|---|---|
| 4,554,678 | A | 11/1985 | Bowman |
| 5,012,490 | A | 4/1991 | Myer |
| 5,020,147 | A | 5/1991 | Okanobu |
| 5,077,835 | A | 12/1991 | Margairaz et al. |
| 5,134,406 | A | 7/1992 | Orr |
| 5,263,192 | A | 11/1993 | Mittel et al. |
| 5,263,195 | A | 11/1993 | Panther et al. |
| 5,283,532 | A | 2/1994 | Burkhart et al. |
| 5,475,871 | A | 12/1995 | Shalev et al. |
| 5,555,453 | A | 9/1996 | Kajimoto et al. |
| 5,564,098 | A | 10/1996 | Rodal et al. |
| 5,630,218 | A | 5/1997 | Muto |
| 5,640,698 | A | 6/1997 | Shen et al. |
| 5,710,997 | A | 1/1998 | Okanobu |
| 5,734,976 | A * | 3/1998 | Bartschi et al. ............. 455/333 |
| 5,930,695 | A | 7/1999 | Yamaguchi et al. |
| 5,933,769 | A | 8/1999 | Kaneko |
| 5,963,857 | A | 10/1999 | Greywall |
| 6,167,246 | A | 12/2000 | Elder et al. |
| 6,278,866 | B1 | 8/2001 | Elder et al. |
| 6,324,390 | B1 | 11/2001 | Elder et al. |
| 6,377,788 | B1 | 4/2002 | Elder et al. |

FOREIGN PATENT DOCUMENTS

| | | |
|---|---|---|
| WO | WO 99/59256 | 11/1999 |

OTHER PUBLICATIONS

Abidi, Asad A., "CMOS-only RF and Baseband Circuits for a Monolithic 900 MHz Wireless Transceiver*," *Bipolar Circuits & Tech. Mtg.*, Minneapolis, Oct. 1996, pp. 35-42.

Abidi, Asad A., "Radio-Frequency Integrated Circuits for Portable Communications," *Custom IC Conference*, Diego, CA, May 1994, pp. 151-158.

Chang, P. J., Rofougaran, A., and Abidi, A. A., "A CMOS Channel-Select Filter for a Direct-Conversion Wireless Receiver," *Symp. On VLSI Circuits*, Honolulu, pp. 62-63, 1996.

Chang, J., Abidi, A. A., and Viswanathan, C.R., "Flicker Noise in CMOS Transistors from Subthreshold to Strong Inversion at Various Temperatures," *IEEE Trans. On Electron Devices*, vol. 41, No. 11, pp. 1965-1971, 1994.

Rofougaran, A., et al., "A 900 MHz CMOS Frequency-Hopped Spread Spectrum RF Transmitter IC," *Custom Integrated Circuits Conf.*, San Diego, CA, May 1996, pp. 209-212.

Rofougaran, A., Chang, J. Y.-C., Rofougaran, M., Khorram, S., and Abidi, A. A., "A 1 GHz CMOS RF Front-End IC with Wide Dynamic Range," presented at *European Solid-State Circuits Conf.*, Lille, France, pp. 250-253, 1995.

Rudell, Jacques C., University of California, Berkeley, "CMOS VLSI Frequency Translation for Multi-Standard Wireless Communication Transceivers,"Qualifying Examination, Apr. 8, 1996, pp. 1-24.

* cited by examiner

FIG. 1   FULLY INTEGRATED CMOS AM RECEIVER

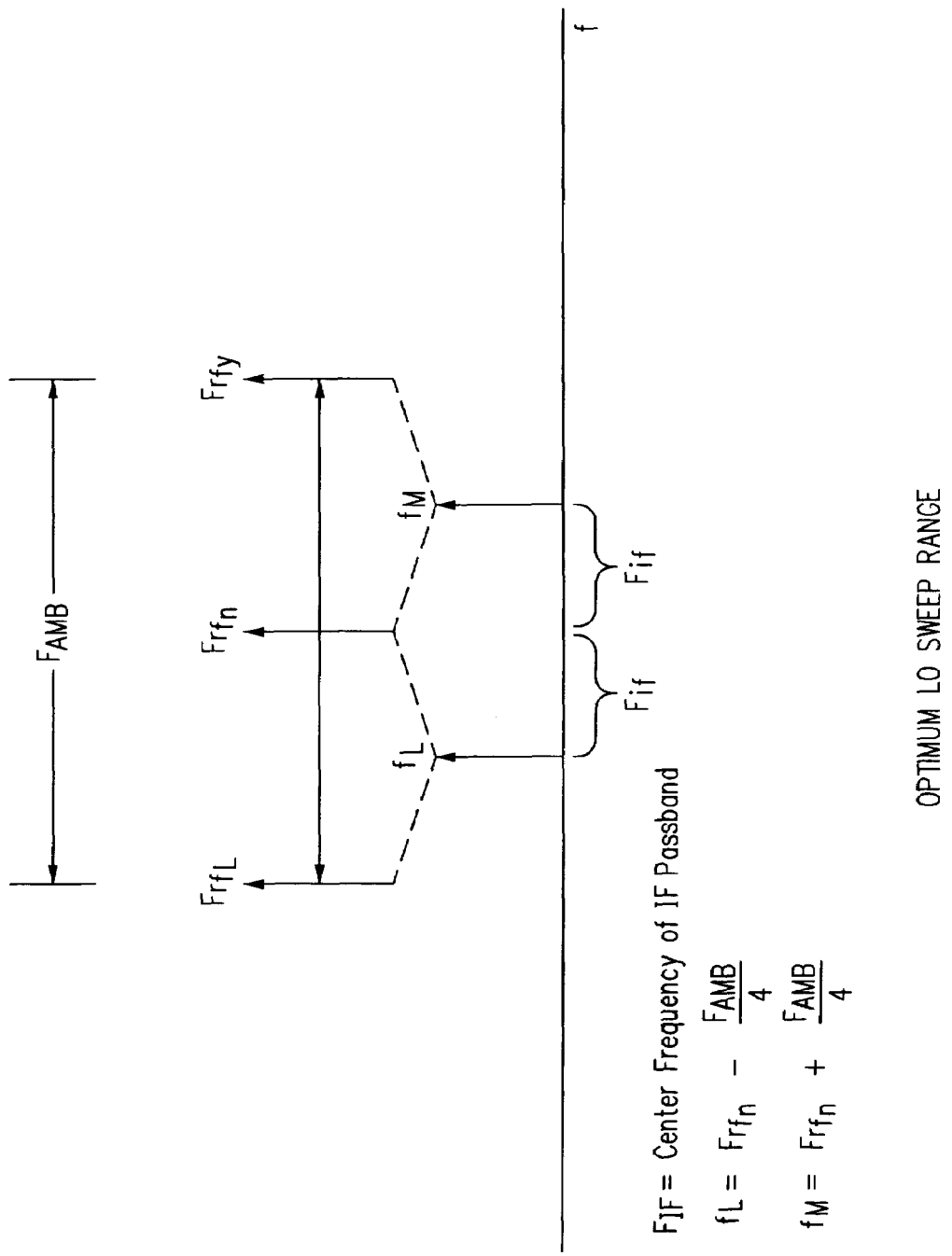

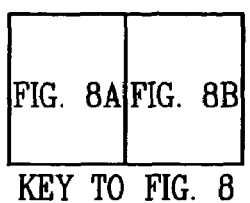
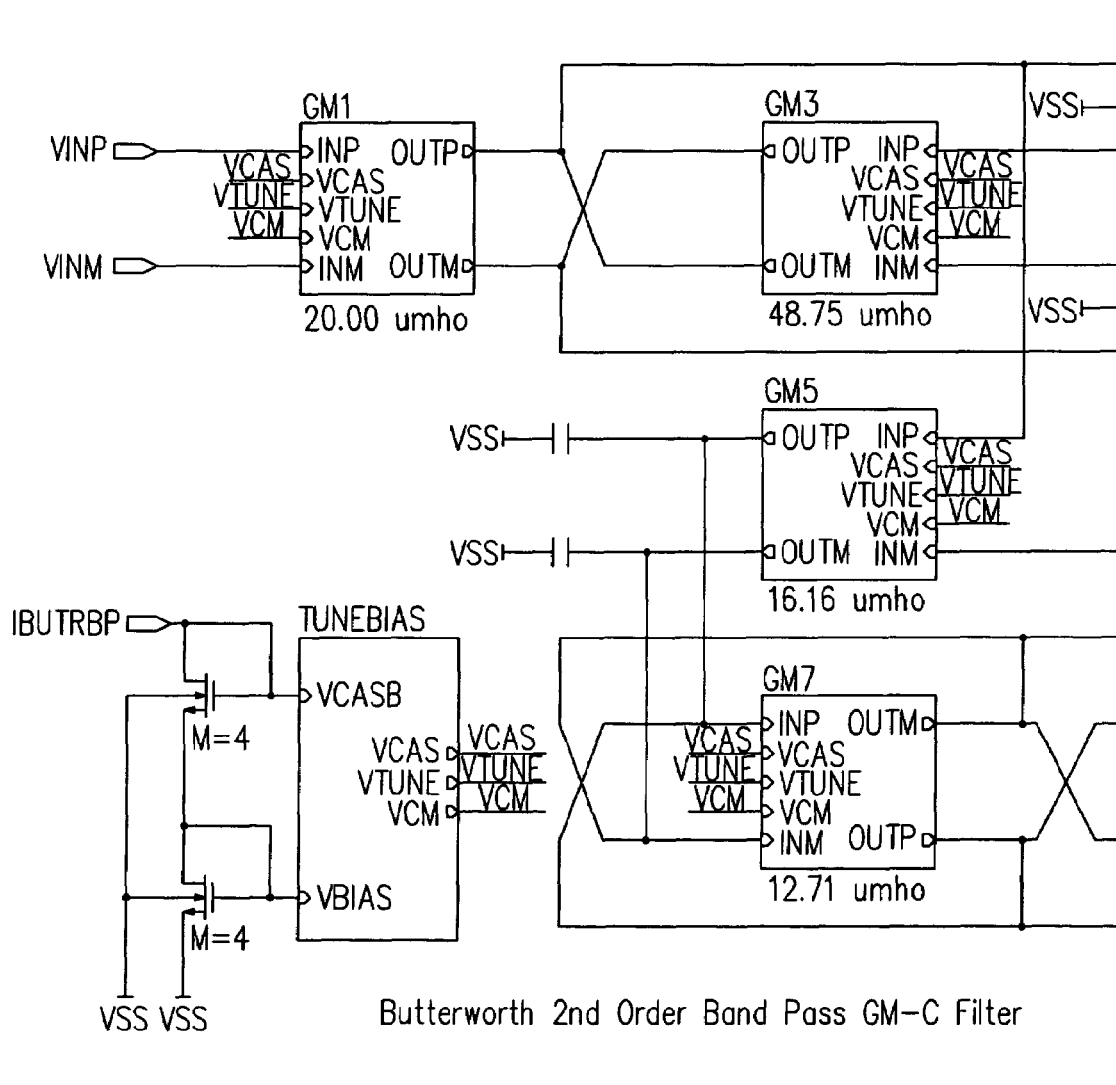
FIG. 8A

AGC CONTROL COMPARATOR

PHASE/FREQUENCY DETECTOR

VCC  VCC is the P-Channel Power Supply

VCO "B" PORT VOLTAGE BUFFER

CML Bias for 64/65 Prescaler

VCO Single-Ended Comparator

TOGGLE FLIP FLOP

FIG. 48  D TYPE FLIP FLOP WITH 3 INPUT NAND DATA

Butterworth 3rd Order Low Pass GM-C Filter
fc = 200Khz

UHF TOGGLE FLIP FLOP

| FIG. 66A | FIG. 66B |

KEY TO FIG. 66

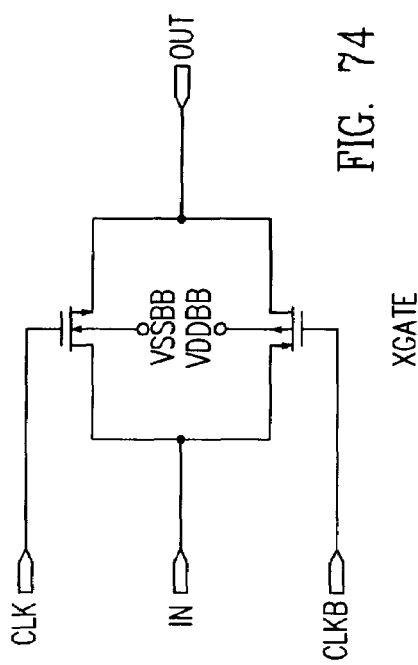
FIG. 74 XGATE
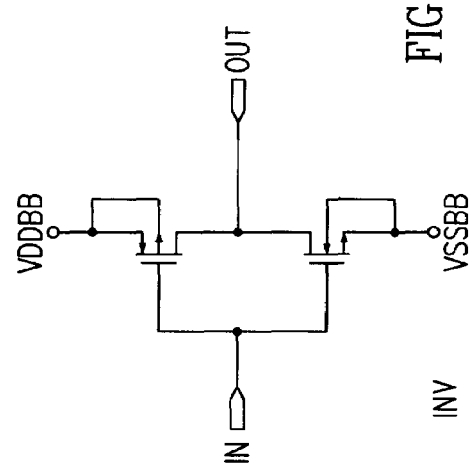
FIG. 76 INV
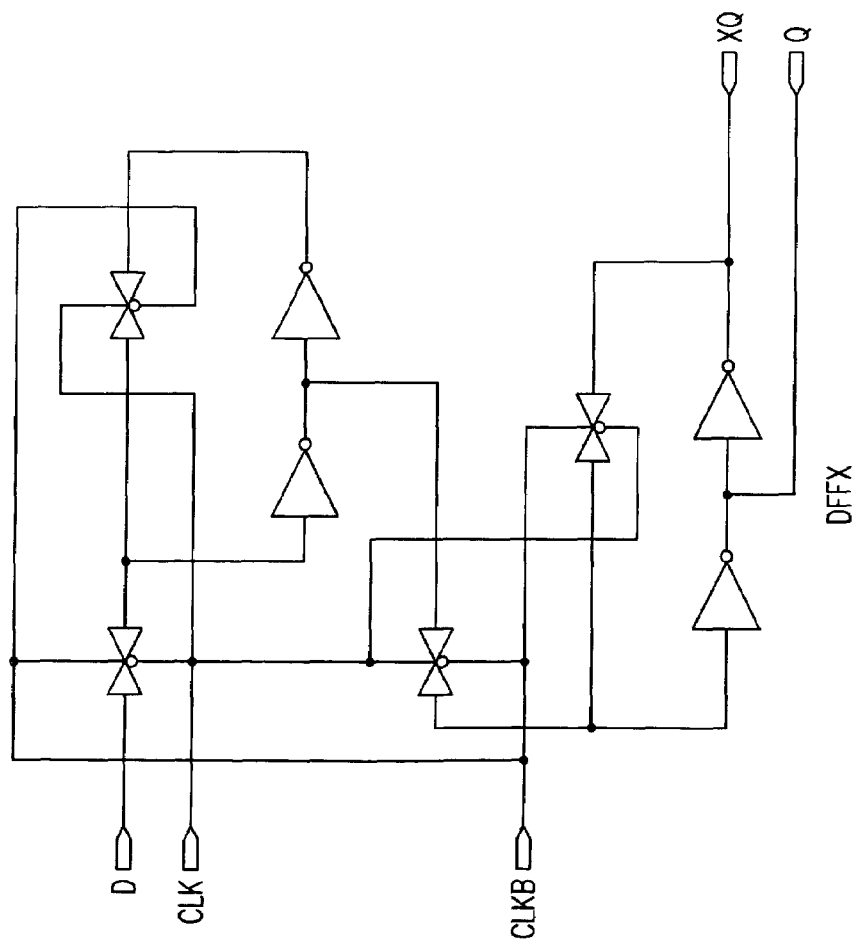
FIG. 75 DFFX

METHOD OF OPERATING RADIO RECEIVER IMPLEMENTED IN A SINGLE CMOS INTEGRATED CIRCUIT

CROSS-REFERENCE TO RELATED APPLICATIONS

This application is a divisional of application Ser. No. 09/734,844, filed Dec. 11, 2000, now U.S. Pat. No. 6,662,003 entitled "Superheterodyne Receiver", which is a divisional of application Ser. No. 09/495,323, filed Jan. 31, 2000, now U.S. Pat. No. 6,278,866, issued Aug. 21, 2001, entitled "Bias Signal Generator In Radio Receiver", which is a divisional of application Ser. No. 09/075,281, filed May 8, 1998, now U.S. Pat. No. 6,167,246, issued Dec. 26, 2000, entitled "Fully Integrated All-CMOS AM Receiver", which is based on the provisional application Ser. No. 60/046,023, by J. Scott Elder, et al., filed May 9, 1997, entitled "Fully Integrated All-CMOS AM Receiver", all of which applications are incorporated herein by reference in their respective entireties. Priority is hereby claimed to all of the above-listed applications.

FIELD OF THE INVENTION

This invention relates to radio wave receivers and, in particular, to a receiver formed as a single integrated circuit.

BACKGROUND

Radio receivers, such as amplitude modulation (AM) type receivers, are well known. It is desirable for cost and size reasons to implement such receivers on a single integrated circuit chip. However, obstacles have prevented a practical AM receiver from being implemented on a single chip.

SUMMARY

A single chip superheterodyne AM receiver is disclosed herein. Pin count may be 4 or more. The receiver is a OOK (ON-OFF keyed) Receiver IC for remote wireless applications. This device is an "antenna-in, data-out" monolithic device. All RF and IF tuning is accomplished automatically within the IC, which eliminates manual tuning, and reduces production costs. Receiver functions are completely integrated. The result is a highly reliable yet extremely low cost solution for high volume wireless applications. Because the receiver is a true single-chip radio receiver, it is extremely easy to apply, minimizing design and production costs, and improving time to market.

The receiver uses a novel architecture that allows the receiver to demodulate signals over a wide RF band, which eliminates the need for manual tuning. This is referred to as a swept LO mode. This also significantly relaxes the frequency accuracy and stability requirements of the Transmitter, allowing the receiver to be compatible with both SAW-based and LC-based transmitters. The receiver sensitivity and selectivity are sufficient to provide low bit error rates for decode ranges over 100 meters, equaling the performance of other more expensive solutions.

All tuning and alignment are accomplished on-chip with a reference frequency provided by a low-cost ceramic resonator or an externally supplied clock reference. The receiver performance is insensitive to data modulation duty cycle. The receiver may be used with such coding schemes as Manchester or 33/66% PWM.

To prevent noise from the clock reference decreasing the sensitivity of the receiver, the IF filter is tuned such the no integer multiple or integer divisor frequency of the timing reference occurs in the IF pass band.

All post-detection (demodulator) data filtering is provided on the receiver chip, so no external filters need to be designed. Any one of four filter bandwidths may be selected externally by the user. Bandwidths range from 0.6 kHz to 4.8 kHz in binary steps.

The various filters and demodulator have frequency characteristics based on the output of an internal timing generator which receives clock signals from an external reference. Therefore, tuning of the filters and demodulator may be accomplished by changing the external reference frequency.

BRIEF DESCRIPTION OF THE DRAWINGS

FIG. 3 illustrates an optimum LO sweep range.

FIGS. 4-76 illustrate actual circuitry for implementing a preferred embodiment of the single chip receiver. FIG. 4 identifies the functional elements from FIG. 1.

DETAILED DESCRIPTION OF THE EMBODIMENTS

Figure 1:
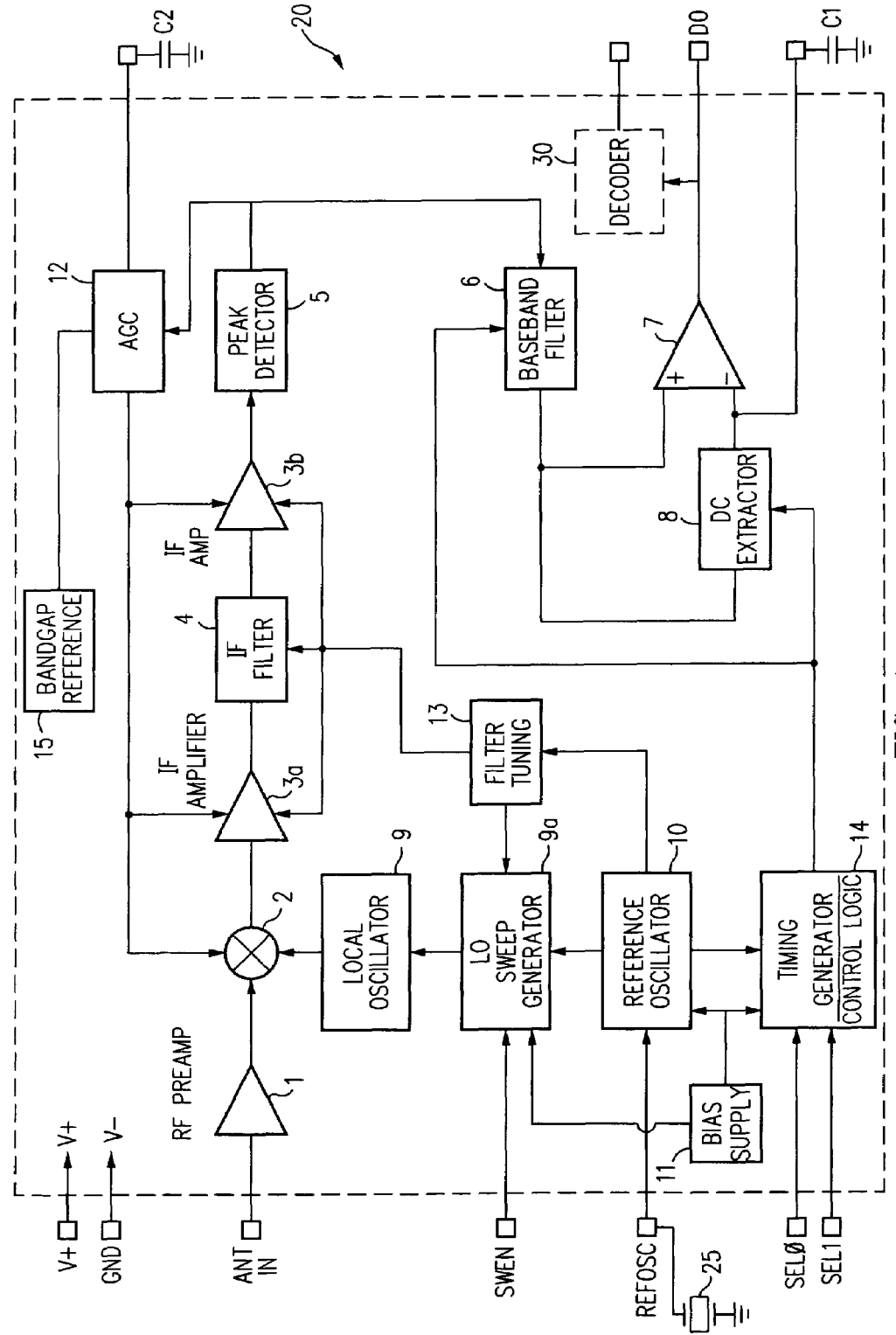
FIG. 1 is a block diagram of a single chip receiver in accordance with one embodiment of the invention.

FIG. 1 illustrates the basic structure and elements of one embodiment of the invention, a fully integrated all-CMOS AM receiver 20. Pins or pads of the integrated circuit are shown outside of the dashed outline. The receiver is a superheterodyne type, which means the incoming modulated RF signals are preamplified and then mixed with a local oscillator frequency. The mixed signal is then filtered to generate a modulated intermediate frequency (IF). The IF signal is then amplified and demodulated, and the data extracted.

All elements are constructed using Complementary Metal Oxide Semiconductor (CMOS) technology. CMOS technology also permits certain bipolar elements like diodes, transistors, and others to be combined in the receiver. Where appropriate, these devices are utilized. The elements of the system are as follows, with associated reference number:

| Functional Element | Reference No. |
|---|---|
| a. Radio Frequency (RF) or High Frequency (HF) Preamplifier | 1 |
| b. RF Mixer or Translator | 2 |
| c. Intermediate Frequency (IF) Amplifier | 3a, 3b |
| d. Intermediate Frequency (IF) Filter | 4 |
| e. Peak or Envelope Detector | 5 |
| f. Baseband Filter | 6 |
| g. Data Slicer or Comparator | 7 |
| h. DC Extractor | 8 |
| i. Local Oscillator (LO) | 9 |
| j. LO Sweep Generator | 9a |
| k. Reference Oscillator | 10 |
| l. 2Vt Bias Supply | 11 |
| m. Automatic Gain Control (AGC) | 12 |
| n. Filter Tuning | 13 |
| o. Timing Generator | 14 |
| p. Bandgap Reference | 15 |

In the context of this application, fully integrated means that all of these functions in their entirety have been simultaneously incorporated onto a single semiconductor die (integrated circuit or IC). Additional aspects of the receiver (to be detailed subsequently) reduce overall radio system complexity, cost, and transmitter performance requirements. Note that DC control lines for the receiver (described subsequently) may be either pinned-out for maximum end-user control, or may be fixed on the die via a metal mask, the latter allowing the most economical packaging.

The entire RF and IF signal path of the receiver employs a balanced, differential design approach, which is required for stability, power supply rejection, and decoupling of the RF circuits from the IF and baseband signals. Additionally, all AC currents are balanced to mitigate any AC terms on the bias supply.

Brief Description of the Component Features

The Internal Reference Oscillator 10, with an externally applied timing element or timing signal, supports a multiplicity of carrier frequencies. The timing element may be any known reference frequency generator, such as a crystal oscillator. The receiver is carrier frequency independent.

The Peak Detector 5 and Baseband Filter 6 time constants of their respective CR circuits are related to the Reference Oscillator 10 frequency and are selectable by one or more DC (logic) control lines SEL0, SEL1. The receiver can thus support a multiplicity of data rates, and the receiver is data rate independent. The time constants for these functions are highly precise and are independent of temperature and semiconductor processes.

The IF Filter 4 and Baseband Filter 6 are fully integrated on the IC. The result is an implementation which may be physically placed in an 8-pin IC package.

A package configuration as low as 4 pins is possible by modifying the receiver in the following ways. Firstly, use only one IC pin for power supply, and one IC pin for ground. Change the DC Extractor 8 design to a switched-capacitor lowpass filter, allowing integration of capacitor C1. Secondly, the AGC 12 function may be designed using a digital-to-analog (DAC) based structure, which allows integration of capacitor C2. Similarly, any pin configuration from 4 to 8 is possible, depending on the level of integration that the constructor chooses to use.

The Local Oscillator 9 (LO) can be operated in either fixed mode or swept mode, selectable via a DC control line SWEN. Fixed mode operation is preferred for precision or high-performance applications.

In Swept mode, the LO frequency is varied across a range of frequencies at a rate sufficiently higher than the data rate to allow for peak (envelope) detection. This mitigates the requirement for an accurately controlled and/or age and temperature stabilized transmitter carrier frequency.

The LO Sweep Generator 9a is a (÷m/÷m+1) phase-locked-loop (PLL) where the loop is forced to operate half the time at ÷m and the other half of the time at ÷m+1. The LO Sweep Generator 9a uses a (stable) bias current based on the Reference Oscillator 10. The sweep signal is thus a controlled excursion waveform with either a ramp (current into a capacitor) or resistor-capacitor (RC) response characteristic. This guarantees a minimum time of the mixer IF output signal within the (integrated) IF filter frequency response.

The LO Sweep Generator PLL employs a temperature compensated bandwidth scheme to linearize the LO sweeping process. LO sweep characteristic is thus independent of temperature and semiconductor processing.

The IF amplifier 3a, 3b design provides a bandpass characteristic, with no DC gain. This allows direct amplifier coupling without DC offset correction or coupling capacitors. Further, the bandpass characteristics are stabilized to the Reference Oscillator 10 for temperature and process independence. Other, less desirable embodiments include (1) capacitive coupling between amplifier stages, and (2) DC coupling with offset cancellation.

The IF signal is AC-coupled from IF amplifier 3b to Peak Detector 5, eliminating any DC-offset related peak detector time constant errors.

The Peak Detector 5 is configured as a closed-loop voltage follower driving an open-loop peak detector. Both circuits use matched average load currents to remove DC errors. This configuration provides faster attack time on peak detection. Alternative embodiments are either a single closed-loop or open-loop peak detector, or conventional envelope detector.

The RF Preamplifier 1 and RF Mixer 2 are biased with LO Oscillator 9 based currents to achieve temperature and process independence. In one embodiment, the bias is based on the magnitude of a VCO control signal used to generate the LO frequency. Since process variations change the characteristics of components (e.g., transistors) across the entire chip, the signal controlling the VCO reflects variations in other functional units. Hence, the control signal may be used to adjust the magnitudes of bias currents for other functional units to offset the effects of process variations.

Back-to-back non-rectangular drain FET structures are used at critical high frequency nodes to minimize capacitance and improve bandwidth. Various embodiments of the structure are circular, hexagonal, octagonal, etc. Circular is preferred.

The RF preamplifier 1 output is taken from the second stage of a (three stage) feedback amplifier, where gain-bandwidth product is maximum. An alternative embodiment is to take the signal from the first or third stages.

A 2 Vt bias supply 11 is constructed on the IC for all logic circuits. This mitigates logic switching noise which allows further logic function integration without impacting receiver sensitivity due to IC or power supply noise. Alternative embodiments are to build supply voltages ranging from 2 Vt to the positive supply voltage. (Here Vt refers to the threshold voltage of a FET transistor.)

The Data Comparator 7 output stage is current limited, which reduces output switching noise.

The DC Extractor 8 provides a transfer impedance related to the reference oscillator, providing a very precise temperature and process independent value. The transfer impedance also varies with data rate, as selected by DC control lines SEL0, SEL1, so that the Data Comparator 7 slicing threshold voltage time constant adjusts automatically with data rate.

The RF Preamplifier 1 input is ac-coupled to tailor the lower cutoff frequency to provide additional rejection of lower frequency interference (e.g., from FM transmitters).

The Bandgap Reference 15 provides a temperature and power supply stabilized set of reference voltages which are used to set certain critical bias points within the invention.

Operation of Receiver of FIG. 1

System Operation—Introduction

The Fully Integrated All-CMOS AM Receiver 20 converts amplitude modulated (AM) signals at its input (Antenna In of RF Preamplifier 1) into the equivalent (data) code used at the transmitter to construct the AM signal.

The radio frequency (RF) and intermediate frequency (IF) portion of the receiver functions similarly to a superheterodyne receiver. Specifically this includes RF Preamplifier 1, RF mixer 2, IF Amplifiers 3a, 3b, and IF filter 4.

The baseband portion of the receiver functions similarly to an AM or OOK (On-Off Key) demodulator. Specifically, this includes the Peak Detector 5, Baseband Filter 6, DC Extractor 8, and Data Slicer or Comparator 7.

The Local Oscillator (LO) 9 and LO Sweep Generator 9a provide the necessary LO for frequency translation. The LO Sweep Generator 9a has several operating modes as will be detailed subsequently.

The Reference Oscillator 10 provides a stable reference frequency for the receiver when the Reference Oscillator's input is attached either to a precise timing element or a precise timing signal (i.e., external clock input). Examples of timing elements are crystals, ceramic resonators, or a resonant inductor-capacitor (LC) circuit.

The 2 Vt Bias Supply 11 provides the minimum bias necessary to operate conventional CMOS logic circuits without "shoot-through" logic switching currents. This allows the fastest operation logic without power supply switching noise.

An Automatic Gain Control function 12 is also provided to extend the range of input power levels the receiver can handle before overload occurs.

All of the functions illustrated in FIG. 1 are simultaneously integrated onto a single Complementary Metal Oxide Semiconductor (CMOS) die to form a single integrated circuit (IC).

RF Signal Reception

RF Preamplifier 1

The elements of the receiver which process the incoming modulated signal are the RF Preamplifier 1, the RF Mixer 2, the Local Oscillator (LO) 9, and the LO Sweep Generator 9a.

The RF Preamplifier 1 provides signal gain at the carrier frequency. The signal applied to the RF Preamplifier input from the signal source (usually an antenna) is AC coupled with low frequency roll-off tailored to lie between (lower) Frequency Modulated (FM) sources and the lower end of the Federal Communications Commission (FCC) periodic band. This is done to minimize interference from lower frequency sources and mitigate the need for additional input filtering.

The RF Preamplifier 1 is biased using a current related to a current generated in the Local Oscillator 9a. In other words, the magnitude of the bias current or voltage used to set the operating conditions of the Preamplifier 1 is related to the current or voltage supplied to a control input of a voltage controlled oscillator (VCO) for generating the LO frequency. Thus, process variations that similarly affect the Local Oscillator 9a frequency and the RF Preamplifier 1 are compensated by the current or voltage into the VCO and the bias current or voltage used to set the operating conditions of the RF Preamplifier 1. This guarantees that the RF Preamplifier gain and bandwidth are temperature and process independent.

Back-to-back non-rectangular drain Field Effect Transistor (FET) structures are employed at critical high frequency nodes of the RF Preamplifier to minimize capacitance and improve bandwidth. This structure has important ramifications, since the result is a very small capacitive parasitic at the drain node of the FET and a larger capacitance at the source node of the FET. This breaking apart of the normally equal drain and source parasitic capacitances actually further improves the gain-bandwidth (GBW) of the amplifier beyond just the improvement anticipated by a lowering of the drain capacitance. Said another way, the extra source capacitance actually improves GBW.

In addition, the output of the RF Preamplifier 1 is taken from the second stage (FET gate) of the output follower that comprises the multi-stage RF Preamplifier 1. This is the node in the RF Preamplifier with the greatest bandwidth.

High gain-bandwidth performance in CMOS dictates the use of small channel-length FET's, which suffer from low early voltage. A closed loop bias control circuit is also provided in the RF preamplifier which compensates for low early voltage and improves yield of the invention.

Integration of the RF Preamplifier onto the integrated circuit in CMOS produces a very low capacitance circuit which maximizes any LO return loss back to the antenna, since LO feedthrough back to the (antenna) input is undesirable.

RF Mixer 2

RF Mixer 2 provides frequency translation of the RF carrier which has been amplified by RF Preamplifier 1. For an input frequency (Frf) and Local Oscillator (LO) frequency (Flo), the mixer 2 generates theoretically two new frequencies, Frf+Flo and Frf−Flo. The second term is subsequently processed by the IF signal processing circuits IF Amplifier 3a, 3b, and IF Filter 4. The mixer's high frequency response is tailored in order to effectively filter out the first mixer term.

A CMOS mixer is used since (1) such a structure provides a more linear mixing characteristic, and (2) the physical construct is very compact, minimizing capacitances and maximizing LO feedthrough loss back to the antenna. To further improve the linearity of the system and extend its ability to operate at high input signal levels, the mixer is designed to include automatic gain control (AGC). Thus for input levels higher than the present state of the art, the receiver remains linear and continues to function as an AM Receiver and Demodulator.

The RF Mixer 2 is biased using a current which is tuned to the Local Oscillator 9a. This guarantees that the RF Mixer gain and bandwidth are temperature and process independent. It is known to provide a vertical tree structure, where the RF preamplifier, RF Mixer, and LO Oscillator are vertically aligned, so as to share a common bias current and improve power efficiency. The approach in the present regulator of FIG. 1 is to bias the RF Preamplifier 1 and RF Mixer 2 from currents mirrored off of the Local Oscillator, which is PLL based. The value of this approach is to track out temperature and semiconductor processing variables associated with the use of CMOS technology.

Special back-to-back non-rectangular drain Field Effect Transistor (FET) structures are employed at critical high frequency nodes of the RF Mixer 2 to minimize capacitance and improve bandwidth. This structure has important ramifications, since the result is a very small capacitive parasitic at the drain node of the FET and a larger capacitance at the source node of the FET. This breaking apart of the normally equal drain and source parasitic capacitances actually further improves the gain-bandwidth (GBW) of the mixer beyond just the improvement anticipated by a lowering of the drain capacitance. Said another way, the extra source capacitance actually improves GBW.

Local Oscillator (LO) 9 and LO Sweep Generator 9a

A CMOS RF Oscillator circuit 21 (FIG. 2) provides the LO frequency for the frequency translation process accomplished within RF Mixer 2. The RF Oscillator 21 is a component of the LO Sweep Generator 9a.

Figure 2:
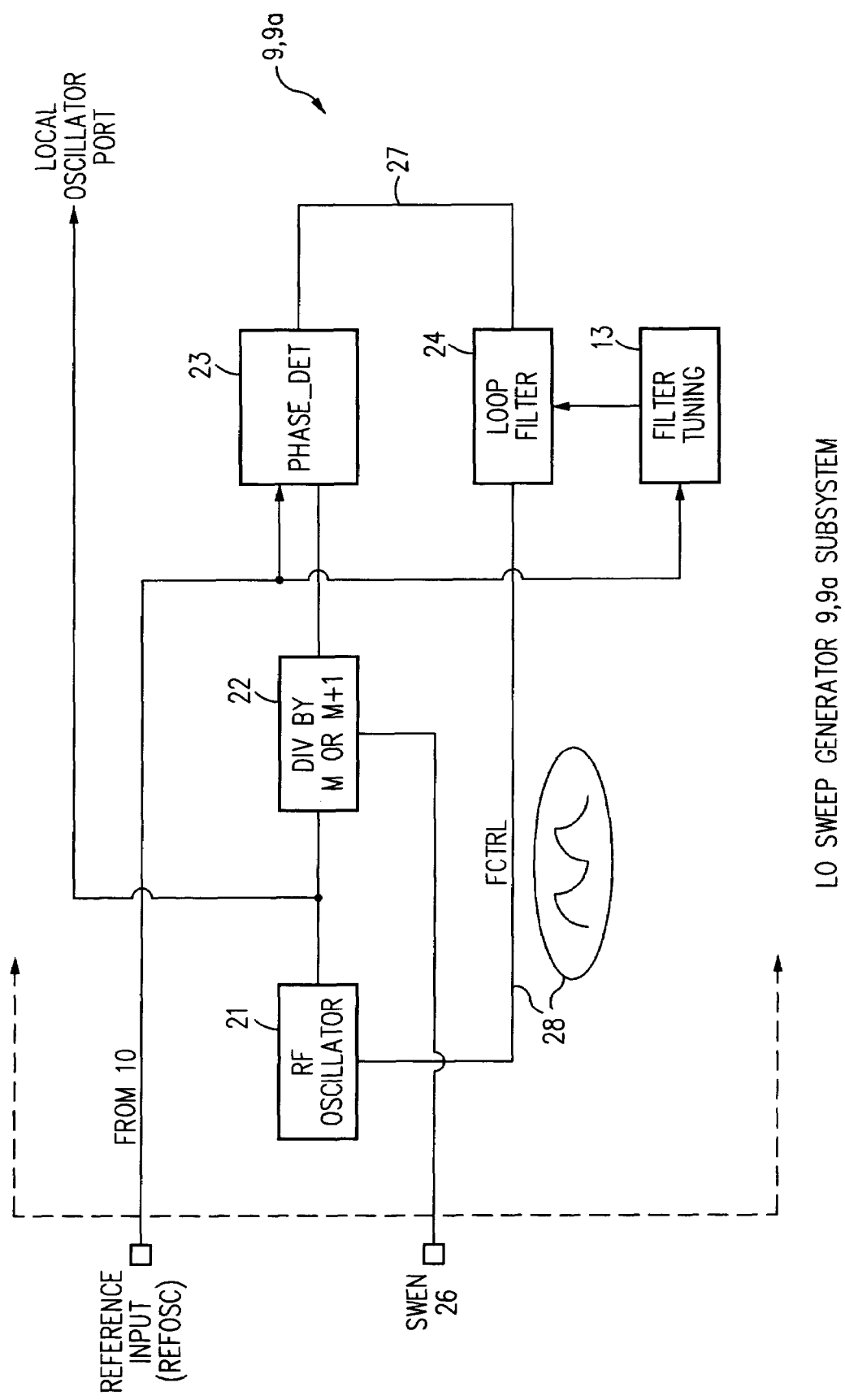
FIG. 2 provides additional detail of the LO Sweep Generator.

Reference will be made to FIG. 2, illustrating the LO Sweep Generator Subsystem, which provides an expanded illustration of the Local Oscillator 9 and LO Sweep Generator 9a from FIG. 1.

The LO Sweep Generator 9a is in actuality a phase-lock-loop (PLL). The PLL generates a signal which is an integer multiple of the Reference Oscillator 10 frequency. The PLL operates as follows. The RF Oscillator 21 output frequency is divided by M or M+1 (depending on a control input SWEN) by Divider 22. This new lower frequency is compared against the Reference Oscillator 10 frequency by Phase Detector 23. Phase Detector 23 outputs on line 27 both a dc voltage and an ac voltage. Only the dc term is of interest as its value signifies the difference in frequency between the two input frequencies of Phase Detector 23. The ac voltage is filtered via Loop Filter 24, extracting the dc value identified as Fctrl 28. The natural tendency of the PLL is to force the dc value of Fctrl to whatever value is required such that the two frequencies into the Phase Detector 23 are identical.

Signal SWEN 26 dynamically alters the division factor within Divider 22. SWEN is typically a two state signal (Logic 0 or Logic 1). If SWEN is held fixed at one logic state, the division factor is M, and the LO frequency is the Reference Oscillator 10 frequency multiplied by M. If SWEN is held fixed at the other logic state, the division factor is M+1, and the LO frequency is the Reference Oscillator 10 frequency multiplied by M+1. If SWEN transitions dynamically between its two logic states, the LO will transition smoothly and continuously from fl to fu, where fl is the lower frequency, and fu is the upper frequency of the LO excursion.

Within the receiver, the Local Oscillator 9 may be operated in either of two modes (1) fixed LO, or (2) swept LO. In fixed mode, the LO frequency is held fixed and the receiver functions as a conventional superheterodyne AM receiver. In such a case, the transmitted RF carrier frequency must fall within the passband of the IF Filter, dictating some constraints on transmitter frequency alignment and age/temperature stability.

Alternatively, in Swept LO mode, the receiver sweeps the LO from frequencies fl to fu, as explained just previously. This effectively sweeps the entire RF band in the vicinity of the range fl to fu into the IF filter passband. This swept IF is then processed by the receiver in a fashion to recover the AM envelope just as would occur in the conventional fixed LO superheterodyne receiver. The consequences of such operation is that the constraints on transmitter frequency alignment and stability are significantly relaxed.

In one embodiment, the sweep mode results in downconversion of all signals in a band 2-3% around the transmit frequency.

An alternative means of sweeping the LO to that described above is to drive the Reference Oscillator 10 input with a swept frequency precision timing signal. Such an approach would mitigate the need for dual-modules division within the LO Sweep Generator PLL.

Reference will again be made to FIG. 1.

IF Signal Processing

IF Amplifier 3a,3b

In the receiver, an IF Amplifier 3a connects the RF mixer 2 and the IF Filter 4. The IF Amplifier 3a amplifies the (frequency translated) signal from the RF mixer 2. An IF Filter 4 selectively extracts the IF signal of interest, which is again amplified by an identical IF Amplifier 3b. Each IF Amplifier 3a/3b is a fully balanced, differential design, required to provide power supply rejection and minimize coupling between the RF and IF sections of the receiver across the common power supply connection.

The IF Amplifier 3a/3b design provides a bandpass frequency characteristic with no DC gain. This allows the IF Amplifier to be directly coupled to other elements of the receiver, like directly to the IF Filter 4 without the need for DC offset correction or coupling capacitors. Further the IF Amplifier bias currents are derived from the Reference Oscillator 10 frequency. The result is that the bandpass frequency response of the IF Amplifier 3a/3b is constant with temperature and semiconductor process variations. The IF amplifier gain is set by connecting the amplifier's signal p-channel FET transistors to p-channel FET transistors as active loads. The resultant gain is the ratio of the gm of the signal FET divided by the gm of the load FET, which is independent of temperature and bias current. The result is constant amplifier gain independent of temperature and semiconductor process variations.

The IF Amplifier 3a/3b also provides gain variation as a function of a signal applied externally to the IF Amplifier. This is commonly referred to as Automatic Gain Control or AGC. AGC is necessary in the IF Amplifiers to allow the system to remain linear and operable when very large input signal levels are applied to the receiver's antenna input. The AGC CTRL function 12 detects the condition of excessive input signal and generates a counter compensating voltage which reduces the gain of other stages in the RF and IF paths, namely the RF Mixer 2, IF Amplifiers 3a/3b, and IF Filter 4. The IF Amplifier 3a/3b is constructed in CMOS, rather than bipolar technology, which also increases the range of linear operation of amplification.

Finally, the IF Amplifier 3a/3b design employs pFET transistors rather than nFET transistors in the signal path of the IF Amplifier, as pFET devices provide more linear operation than nFET devices.

IF Filter 4

An IF Filter 4 is integrated onto the receiver chip. The function of the IF Filter 4 is theoretically to reject all signals except the frequency Frf-Flo output from the RF Mixer 2. The frequency response of the preferred embodiment is a bandpass characteristic, with the highest quality factor (Q) that can be constructed in integrated form. Because quality factor is inversely related to filter bandwidth, as the quality factor rises, the bandwidth shrinks, where the ideal case would be a quality factor of infinity. This would result in a system that was (in theory) perfectly selective.

Problems one encounters with integrated filters is the variation in frequency response characteristics with temperature and semiconductor process variations. In the receiver, we use a gm-c filter structure, which is preferred since the frequency response characteristics of this structure can be readily tuned by using a PLL whose reference input is our stable Reference Oscillator 10 frequency. The function labeled Filter Tuning 13 is the PLL which builds the bias current that stabilizes the IF Filter 4 frequency response characteristic. The adjustment of bias currents based on currents generated in a PLL has been discussed previously. Thus the IF Filter 4 bandpass response characteristic is stabilized against temperature and semiconductor processing variations. Additionally, the tuning current used to bias the IF Filter 4 is related to the tuning current used to bias the IF Amplifiers 3a/3b. This guarantees that the frequency response characteristics of the IF Filter and IF Amplifiers track with process and semiconductor variations.

The IF Filter 4 bandpass response characteristic is also tuned so that no integer multiple or integer divisor frequency of the external timing reference occurs in the IF passband. In one embodiment, the timing reference is 3 MHz and the IF filter 4 is tuned to a center frequency of 2.25 MHz. This band does not include any integer multiple or integer divisor of 3 MHz.

Location of the IF Filter 4 within the receiver is important; the IF Filter 4 is placed between the IF Amplifiers 3a and 3b. This provides isolation between the IF Amplifiers, important to construct large amounts of stable IF gain.

The IF Filter 4 structure is completely balanced and differential, which maximizes power supply rejection and noise coupling into the power supplies. Full integration of the IF Filter also reduces parasitic capacitances, which reduces filter signal feedthrough. This is equivalent to stating that the ultimate out-of-band rejection of the IF Filter is greater than that found in discrete implementations.

IF Filter Quality Factor vs. Swept LO

Although high Q in the IF Filter 4 is desirable to improve receiver selectivity, higher values of Q will force the transmitter frequency to be correspondingly more accurate and stable with age and temperature. For our receiver, where the receiver provides a swept LO mode as well as a fixed LO mode, there is a further consideration. As discussed earlier in regards to the LO Sweep Generator 9a, in the swept LO mode, the LO frequency is varied smoothly and continuously between two frequencies fi (lower frequency) and fu (upper frequency). This effectively translates a band of frequencies around the RF carrier frequency into the IF frequency response of the system.

If an AM carrier appears on the system (antenna) input within frequencies fi and fu, it will be translated into the IF spectrum. By using a sufficiently fast sweeping LO and a peak detector for the envelope detection process with properly adjusted attack and decay time constants, this signal will be recovered with great efficiency. As the sweep rate increases toward infinity, the system response approaches that of a continuous or fixed LO, in which case the full modulation envelope is recovered. Conversely, sweeping the LO too slowly results in loss of signal due to droop associated with the peak detector decay time constant and results in a corresponding reduction in signal-to-noise ratio. However, for a given IF Filter Q, if the LO sweep is too fast, the response time of the IF filter becomes the determining factor in recovered modulation envelope. Or, said another way, there is some optimum sweep speed that provides the best system performance for a given Q.

The sweep speed can be normalized into the (average) number of times that the LO sweeps from fi to fu over a data bit time of the data that is being recovered. Analysis identifies that this optimum range is between 4 and 10 sweeps (or hits) per bit time for the particular Q used in the IF Filter 4. The system performance outside this range is significantly inferior to the performance within this range. The receiver uses 7 hits per data bit as the preferred value.

The optimum and preferred LO sweep waveform is a ramp waveform, so that each frequency translated into the IF spectrum has equal time within the passband of the IF Filter. Since the LO is generated within a PLL, there are difficulties with generating such a waveform that results in precision in the frequency end points (fi and fu) and in the sweep rate (Hertz/volt or Hertz/mA) of the oscillator generating the instantaneous LO frequency.

An easier alternative used in the receiver, which produces acceptable results, is to use a resistor-capacitor (RC) waveform, provided that the waveform rise and fall times do not exceed certain minimum and maximum values over process and temperature variations. Such a task is accomplished by the LO Sweep Generator 9a, which is discussed subsequently. Basically, the rise and fall times must be slow enough so that at the points of maximum rate of change of the waveform, the effective rate of change of the frequencies being swept into the IF spectrum does not exceed the IF Filter 4 response time set by Q. Likewise, the rise and fall times must be fast enough that the PLL generating the LO can get from fl to fu, to guarantee that the receiver sweeps across (or looks across) the frequency ambiguity of the transmitter. The LO Sweep Generator design of FIG. 2 provides a PLL bandwidth which is temperature compensated and process independent, centered nominally between these minimum and maximum values.

Optimum LO Sweep Range

Reference will be made to FIG. 3, relating to an optimum LO sweep range, which illustrates LO sweep range selection.

As pointed out earlier, there are relationships between IF Filter Q and center frequency, the number of "hits" or sweeps performed per bit, and the LO sweep rate. Faster sweeps allow higher data rates, with the upper limit being the response time of the IF Filter 4. Thus, the sweep range cannot be chosen arbitrarily. Greater sweep ranges reduce the "hit" rate, or force faster LO sweep rates, which lowers IF Filter in-band time. FIG. 3 illustrates the optimum placement of fl and fu, the lower and upper LO frequencies, respectively.

Consider firstly that the transmit frequency has its own range of ambiguity, from Frfl to Frfu. If the transmit frequency is at Frfu, then the LO must sweep up to within the IF frequency of Frfu, denoted Fu. Similarly, if the transmit frequency is Frfl, the LO must sweep down to within the IF frequency of Frfl, denoted Fl. Sweeping any further only pulls in extra spectrum unnecessarily and impacts the sweep rate. The optimum relationship is shown in FIG. 3. Here Fl=Frfn−Famb/4
Fu=Frfn+Famb/4 where Frfn is the nominally set transmit frequency, and Famb is the full amount of transmit frequency ambiguity, based on transmitter misalignment, aging, temperature, and so forth.

An alternative approach to sweeping the LO is to sweep the IF Filter 4. This could be accomplished by providing an electronic means to control and vary the IF Filter center frequency and should yield the same performance as sweeping the LO.

Reference will again be made to FIG. 1.

Baseband Signal Processing

Peak Detector 5

When the receiver is in the Swept LO mode of operation and an AM modulated RF carrier appears on the system (antenna) input, the signal out of IF Amplifier 3a is a sequence of frequency bursts during the time period that the transmitter transmits a mark (e.g., a digital one). Each burst represents the action of the LO sweeping the RF carrier into the IF Filter 4 passband. Similarly, when the receiver is in the fixed LO mode of operation, the IF Amplifier 3a output is a continuous tone at frequency Frf-Flo for the time period that a transmit mark persists. The receiver employs a Peak Detector 5 to recover the AM modulation, since the information is conveyed in the peak of the output of the IF Amplifier in both cases.

Important aspects of using a Peak Detector 5 for AM envelope detection is Attack Time and Decay Time. Firstly, the signal from IF Amplifier 3b is AC-coupled into the Peak Detector 5 where the Peak Detector 5 input is relative to system ground. This removes any dc term from the signal being peak-detected, since not doing this will affect the peak detector time constants.

The Peak Detector 5 employs a fast, closed-loop voltage follower driving an open-loop envelope detector. Such a construct improves the attack time of the peak detection function, an important consideration in the Swept LO mode where the IF Filter 4 may only ring-up to its maximum amplitude for 1 or 2 cycles at the IF frequency. Both the voltage follower and envelope detector circuits are loaded with matched load average load currents to remove any dc error between the voltage follower and envelope detector.

The current used to set the attack time constant is limited to reduce power supply noise, but otherwise the attack time must be as fast as possible, since this parameter and IF Filter Q set the upper limit on operational data rate of the invention. The decay time, however, is a function of data rate, and the previously mentioned hit rate, which should fall between 4 and 10 per bit time, for good system performance. As a result, a switched-capacitor (SC) filter as Baseband Filter 6 was chosen to provide the equivalent resistance-capacitance of the envelope detector. This allows the use of a much smaller capacitance than would otherwise be possible, which allows the Peak Detector 5 to be fully integrated.

In addition, the frequency for the SC filter, derived from the Reference Oscillator Timing Generator 14, allows the time constant to be set with great precision. Further, the Timing Generator 14 generates various harmonically related frequencies that are selectable via decode logic to harmonically modify the Peak Detector 5 decay time constant. This allows the receiver to support multiple data rates, simply by selecting which of a number of frequencies within the Timing Generator is connected electronically into the Peak Detector SC filter.

Baseband Filter 6

Once peak detection of the AM envelope is completed by the Peak Detector 5, the resulting signal is passed through Baseband Filter 6. The Baseband Filter 6 is a Switched-Capacitor (SC) filter with a lowpass frequency characteristic. An SC filter is used to minimize the size of the filter capacitors involved, which allows the entire Baseband Filter 6 to be integrated onto the integrated circuit. Also, as with the Peak Detector 5 decay time constant, the Filter 6 frequency response can be tailored by proper selection of its clock frequency from the Timing Generator 14. Therefore, since the frequency characteristic of the Baseband Filter 6 is scaled to the output of the Timing Generator 14 and the output of the Timing Generator is based on the external reference frequency signal, the characteristics of Filter 6 may be selected by changing the external reference frequency to meet the user's needs.

SEL0 and SEL1 can be selected to provide four different bandwidths ranging from 600 Hz to 4.8 Khz, depending on the needs of the user. Further, the Peak Detector 5 decay time constant and Baseband Filter 6 responses must track as the data rate changes. Thus the clock frequency that tailors the Baseband Filter 6 response is made identical to the frequency which tailors the Peak Detector 5 decay time constant, providing a very efficient implementation.

DC Extractor 8

The filtered signal from Baseband Filter 6 contains a dc term related to signal buffering and an ac term which rides on top of the dc term. Only the ac term contains the information of interest. This filtered signal is applied to a very long time-constant lowpass filter, the DC Extractor 8. The DC Extractor 8 is made up of an equivalent resistance (or impedance) constructed on the integrated circuit (IC) using switched capacitor techniques. The capacitance C1 for the filter is provided externally to the IC. The output of the DC Extractor 8 appears at the junction of the switched resistance and the external capacitor. This is the sum of the dc term and the average value of the ac term of the signal that appears at the output of Baseband Filter 6.

This signal is the optimum signal to compare the Baseband Filter output against to decide the presence or absence of a transmitted mark.

The impedance of the DC Extractor 8 is selected to be between1600K and 200K ohms by the signals SEL0 and SEL1

One may modify the DC Extractor 8 to be a switched-capacitor lowpass filter. This would allow the capacitor C1 to be integrated onto the IC. This lowers cost and allows the invention to fit into smaller pin-count packages.

Data Comparator 7

The output signal from the Baseband Filter 6 is compared against the output of the DC Extractor 8 by the Data Comparator 7. The resulting output, called Data Out, transitions to logic high (or 1) for a mark transmitted to the system (antenna) input within the appropriate frequency range. Otherwise the output is a logic low (or 0).

The Data Comparator 7 is a CMOS circuit with several important features. The output of the Baseband Filter 6 is a fairly slow moving signal. To assure that no false switching occurs at the output of the Comparator 7 as this signal crosses the comparator threshold, a small amount of hysteresis or positive feedback is provided across the input stage of the Comparator 7. Additionally, the output stage of the Comparator 7 is current limited to minimize switching noise on the power supply. Finally, ac current balancing is employed in the Comparator 7 output stage to mitigate any ac current term on the power supply.

Reference Oscillator 10 and Timing Generator 14

Reference Oscillator 10

The Reference Oscillator 10 develops the precision timing signal which is used ubiquitously throughout the receiver for precise frequency, amplitude, and gain control. The Reference Oscillator 10 design is of the Colpitts variety and is connected to a timing device 25 external to the integrated circuit (IC). The Reference Oscillator 10 design requires only a single IC pin for connection to the timing element or signal. Typical timing devices are ceramic resonators, crystals, or (tuned) inductor-capacitor tank circuits. Phase lag capacitors generally associated with ceramic resonators are integrated onto the IC to lower cost.

The output from the Oscillator 10 is dc-coupled into a single-ended amplifier which provides differential outputs. The amplifier provides no dc gain. This eliminates any dc offset correction requirements. The amplifier output is differentially coupled into a comparator which limits the output waveform to logic level swings. The output stage of the comparator is ac current balanced to eliminate any unnecessary power supply noise.

Finally, the Reference Oscillator 10 design supports the application of an external (precision) timing signal rather than a timing element. The signal or timing element is applied at the same point on the receiver.

Timing Generator 14

Critical timing signals used by various functions within the invention are derived within the function Timing Generator 14. The Timing Generator 14 takes as its input the output of the Reference Oscillator 10 and then divides this frequency down to synthesize all other frequencies used by the receiver.

A multiplicity of data rates are supported by the receiver with no addition, deletion, or value modification of external capacitors C1 and C2. This is accomplished by logical (electronic) selection of the appropriate frequencies at the output of the Timing Generator 14 function. These selection inputs are preferably fixed in the metal mask of the IC so that the receiver may fit into 8 pins, although these controls can be brought out to the extremities of the invention for added flexibility.

With the invention in Swept LO mode, the Timing Generator 14 develops the clock signal (approximately 50 kHz for our particular IF Filter characteristics and data rates) which controls the sweep rate of the LO Sweep Generator 9a between fi and fu. For fixed mode, this clock signal is forced statically into one logic state.

The logic circuits used may be conventional in nature.

2 Vt Bias Supply 11

The bias supply is provided by the 2 Vt Bias Supply 11, which minimizes switching noise on the power supply and provides isolation of logic and baseband circuits from sensitive RF and IF circuits.

The 2 Vt Bias Supply 11 provides the minimum bias necessary to operate conventional CMOS logic circuits without shoot-through logic switching currents. This allows the fastest operation logic without power supply switching noise.

Conceptually, a logic circuit only requires a supply voltage equal to the sum of a pFET threshold voltage (Vtp) and an NFET threshold voltage without impacting logic switching speed. This function is provided by a circuit identified as 2 Vt Bias Supply 11 integrated onto the receiver. By passing a small current through a back-to-back diode-connected pFET and NFET, the requisite 2 Vt voltage is generated. This voltage is regulated by a CMOS closed-loop voltage follower. This lowers the source impedance of the node which supplies the bias voltage to all logic circuits. Using such a supply minimizes logic shoot-through currents without impacting switching speed. This results in lower logic switching noise on the primary supply voltage of the IC and provides isolation of the logic switching circuits from the sensitive RF and IF circuits. This allows complex logic functions to be integrated on the same IC with low level analog signal processing circuitry to a greater extent than the present state of the art.

Alternatively, lower logic supply voltages may be used, although without improvement in switching noise, but only a reduction in logic switching speed.

Filter Tuning 13

Variations in semiconductor process parameters and temperature invariably result in radical variations in bias currents if some means of stabilization is not imposed. Filter Tuning 13 (identified as TUNE756K in the transistor level schematics) provides this control function. Filter Tuning 13 is a phase-locked-loop (PLL) based around a 756 kHz current-controlled-oscillator (ICO). The reference frequency for the PLL comes from an appropriate division of the Reference Oscillator 10 frequency. Note that the Reference Oscillator 10 frequency is essentially process and temperature independent. The PLL forces the ICO's current to whatever value is necessary to yield frequency lock with the Reference Oscillator 10, irrespective of temperature or process variations. This yields a bias current whose value is counter compensated for process and temperature variations.

This current is then mirrored and scaled appropriately and used as the bias currents for the LO Sweep Generator 9a, the IF Filter 4, and the IF Amplifiers 3a/3b.

The oscillator and amplifier within this function are fully differential and balanced. The amplifier is constructed with a bandpass characteristic, which exhibits no dc gain. Thus the amplifier and oscillator are dc-coupled without the need for dc offset correction or coupling capacitors. The oscillator is a gm-c type circuit, which minimizes the capacitance required to construct the oscillator. Oscillator variances are minimized as only the gm of the circuit varies widely; capacitance is much better behaved over process and temperature.

AGC 12

In order to keep the system operating linearly over a broad range of input signal amplitudes, automatic gain control (AGC) 12 is integrated into the invention. A precision, bandgap reference 15 voltage is applied to the reference input of a CMOS comparator within the AGC function. The other input of the comparator monitors the output of the Peak Detector 5. When the Peak Detector 5 voltage goes above the reference voltage, the comparator output goes to one logic state, otherwise the output is in the other logic state. The Peak Detector 5 is the optimum location in the system to monitor the signal level for AGC control from the standpoint of loop stability.

The comparator output thus engages an electronic switch. This switch either connects a pushing current source into an externally applied capacitor, or connects a pulling current source to the capacitor, depending on the comparator's output state. The capacitor acts as an integrating function, building a control voltage which is applied to the IF Amplifiers 3a/3b and the RF Mixer 2 to control their respective voltage gains. The attack time is set to be much faster than the decay time of the AC control voltage. This is accomplished by making the current of the pushing current source much larger than that of the pulling current source.

An alternative embodiment of the invention is the use of a limiting log detector rather than translating the RF carrier to an IF frequency which is filtered. The benefit of this embodiment is that it mitigates the requirement for AGC. There is a penalty however, namely that such a system has no LO. Hence one cannot build the swept frequency system described above.

Alternative Embodiments and Enhancements

Use of CMOS technology, balanced differential circuitry, full function integration, and the construction of a 2 Vt Bias Supply 11 allow enhancements to the above described receiver. Specifically, such techniques allow one to further integrate logic functions on the receiver, which result in lower overall receiver/decoder system costs. Two enhancements worthy of identification are:

(a) integration of the present receiver with a dedicated or fixed (logic) state decoder 30, and
(b) integration of the present receiver with a generic Arithmetic Logic Unit (ALU) or microprocessor type function, or other type of programmable logic function to provide additional decision and/or control functions. Such a function is also represented by the element 30.

A decoder is a circuit function that compares an incoming data stream against an expected data stream. If the incoming stream is as expected, usually at least one output is activated in a digital system to signify the matching event. Some decoder systems also transfer a data pattern at the output upon matching the expected data stream. In high security applications, the encoding and decoding operation may involve a rolling or changing code scheme. These schemes virtually eliminate one's ability to copy a transmitted data stream and then use that same data stream later to activate the decoder.

With rolling code schemes, the addition of an electrically programmable and erasable memory is generally required to update the code.

The combined integration of the receiver with any or all of the decoder schemes with and without variable or fixed memory become economically feasible since the technology is the same. As semiconductor technology continues to advance, these combinations continue to increase in value.

Other embodiments include the addition of the following functions: programmable squelch offset on the Data Comparator 7 slicing threshold, and shutdown mode for low-power duty-cycling of the receiver; and using the AGC level to provide an indication of the received signal level. This signal may be monitored for ranging and distance checking.

By implementing the receiver in CMOS, it is economical to include decoder functions on the same IC since most of the applications for this type of radio include a decoder after the radio receiver. The decode can be either fixed or variable (i.e., programmable, like a microprocessor). This receiver is primarily targeted towards the following applications:

Automotive Keyless Entry
Garage Door Openers
Home Keyless Entry
Security Systems
Remote Door Bell Ringers Obviously, their are numerous other applications that combine a simple AM type receiving radio with a digital decoding system.

This receiver's uniqueness is further exemplified by the observation that a complete RF radio system can be built with no other external RF components except an antenna. By complete integration of the entire RF signal path, the RF emissions of the device and the composite system are reduced to levels which greatly simplify, if not completely eliminate, international regulatory compliance requirements. These requirements vary from country to country, but are similar to the United States FCC Part 15 regulations for periodic band operation. The emissions are lower as a result of the small an external inductor to build the local oscillator. This external component has a larger radiating element which must generally be shielded to solve the emissions problem.

The techniques in this receiver can be extended to many frequency bands of operation by scaling the device and interconnect layout geometries to accommodate advances in semiconductor processing. For example, in the United States, the FCC has allocated a band of frequencies near 900 MHz for unlicensed radios. This band is commonly referred to as an ISM band. The receiver applied to this and other bands would allow for fully integrated data modems, not just encoder/decoder systems. Continuous signals can also be received by the system described in this receiver. An on-chip A/D converter can convert the analog received signal to a digital counterpart for processing with an on-chip digital computing element similar to a microprocessor.

Any circuitry not expressly described herein may be conventional, and circuitry need not be described for a complete understanding of the invention by those skilled in the art.

Schematic Diagrams

Figure 4A:
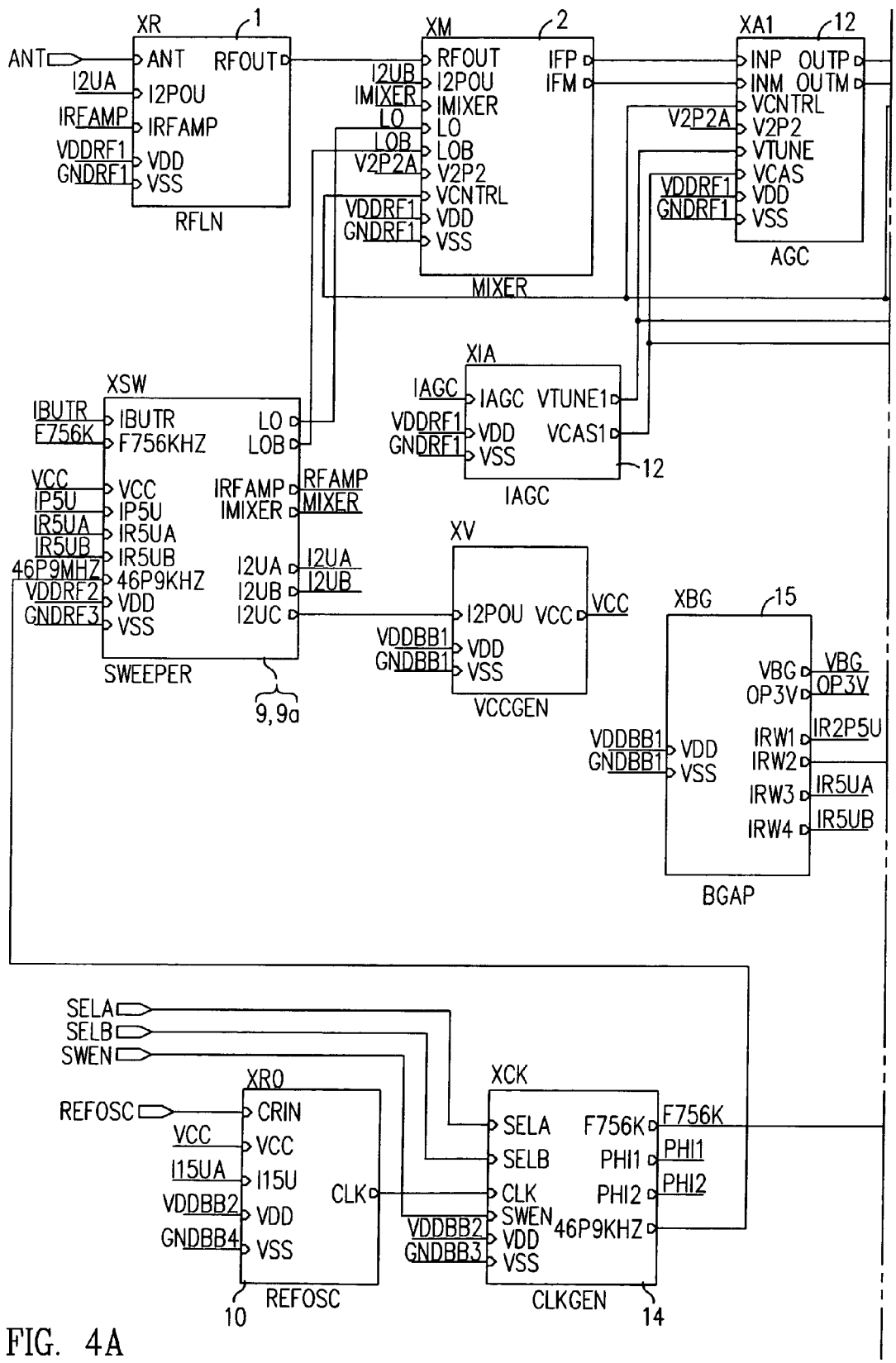
Figure 4B:
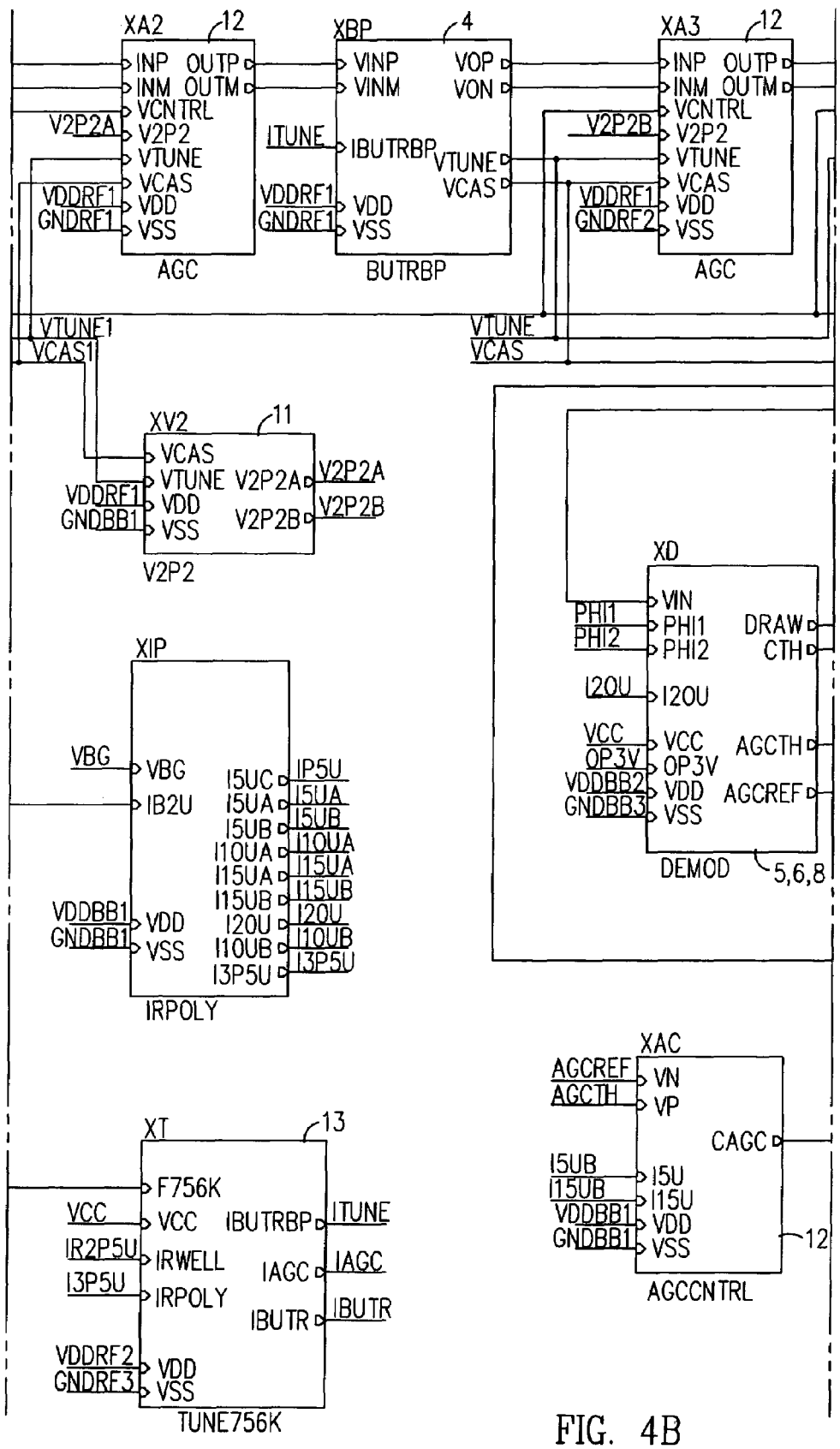
Figure 4C:
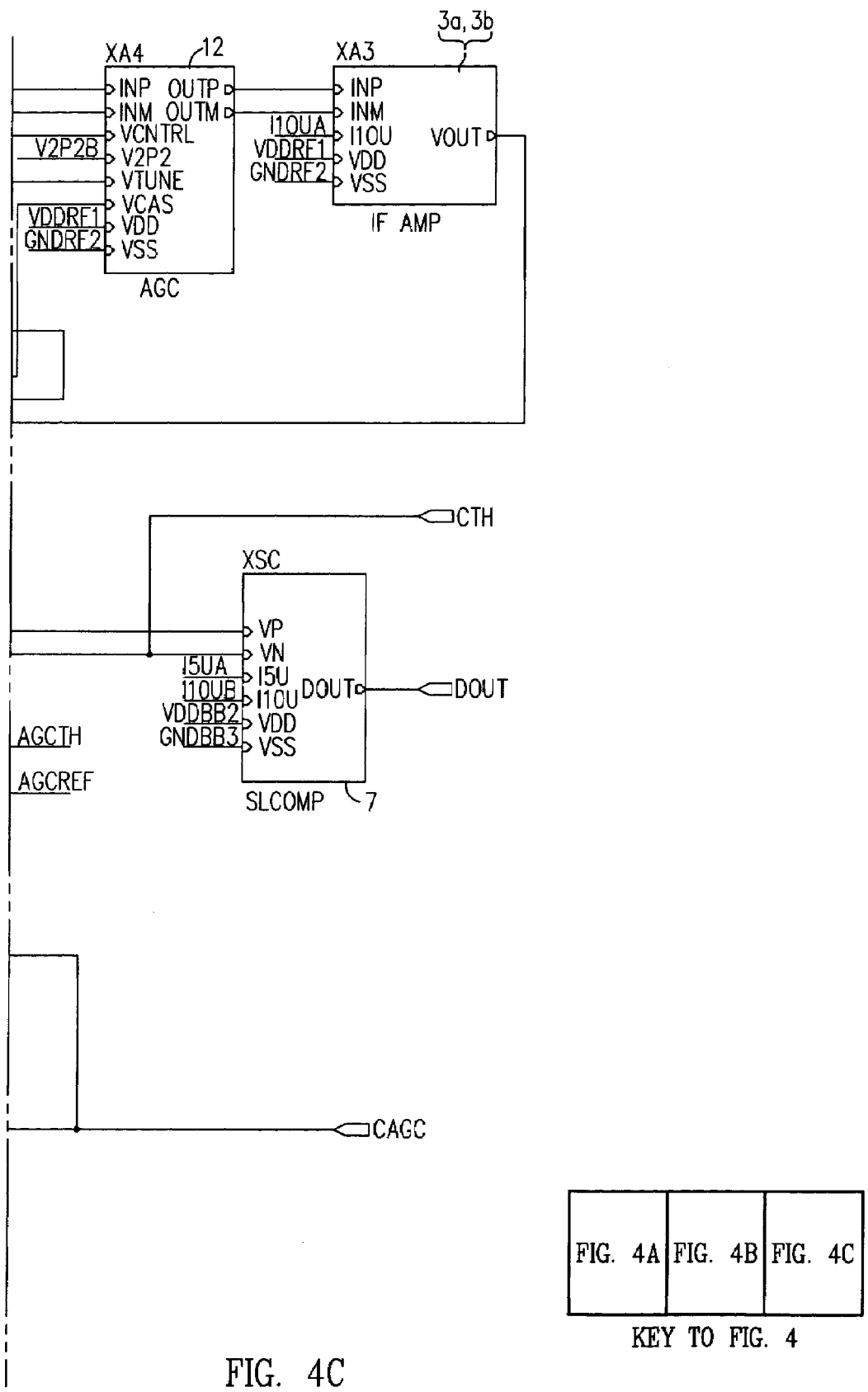
Figure 5:
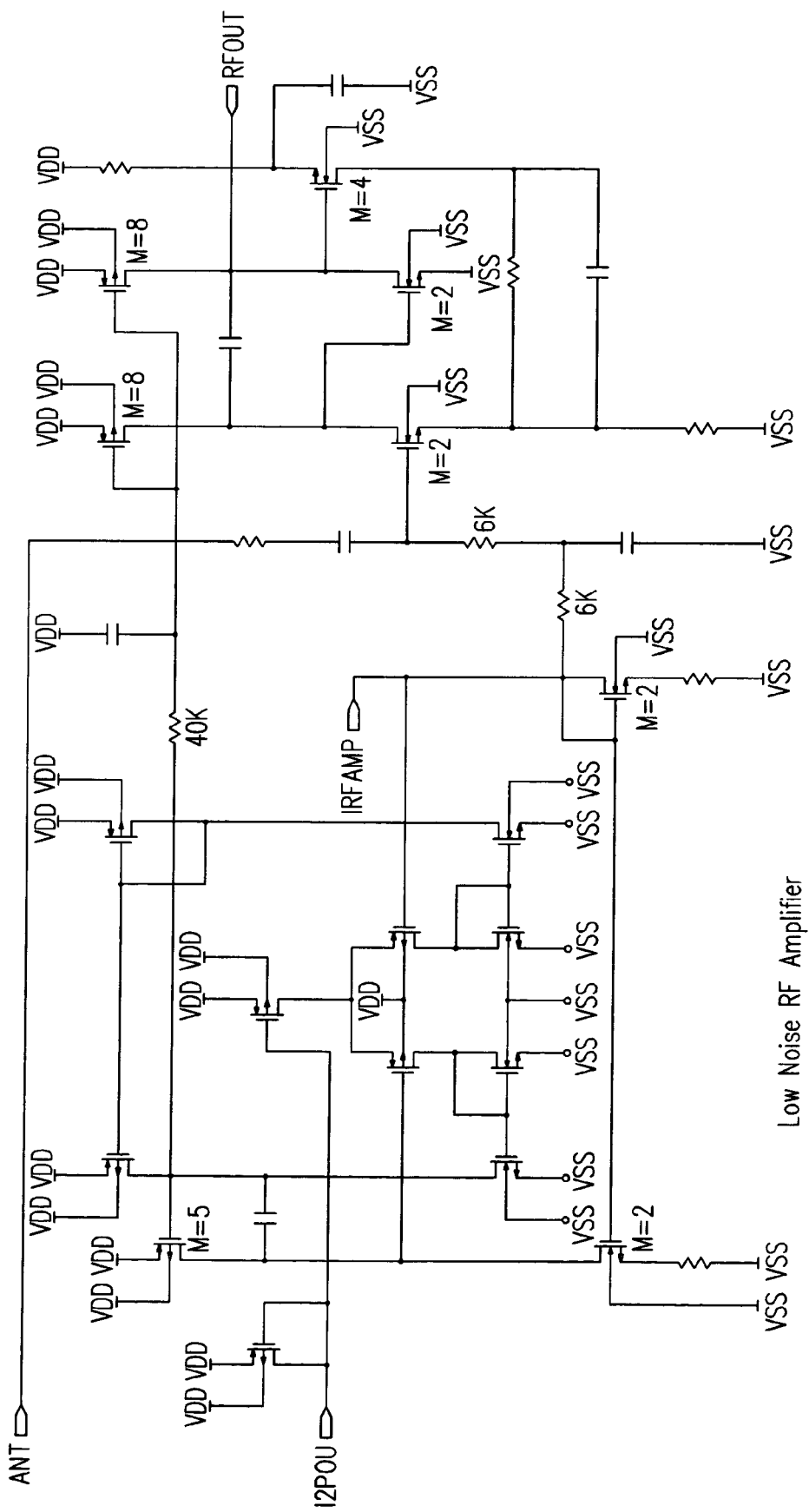
Figure 6:
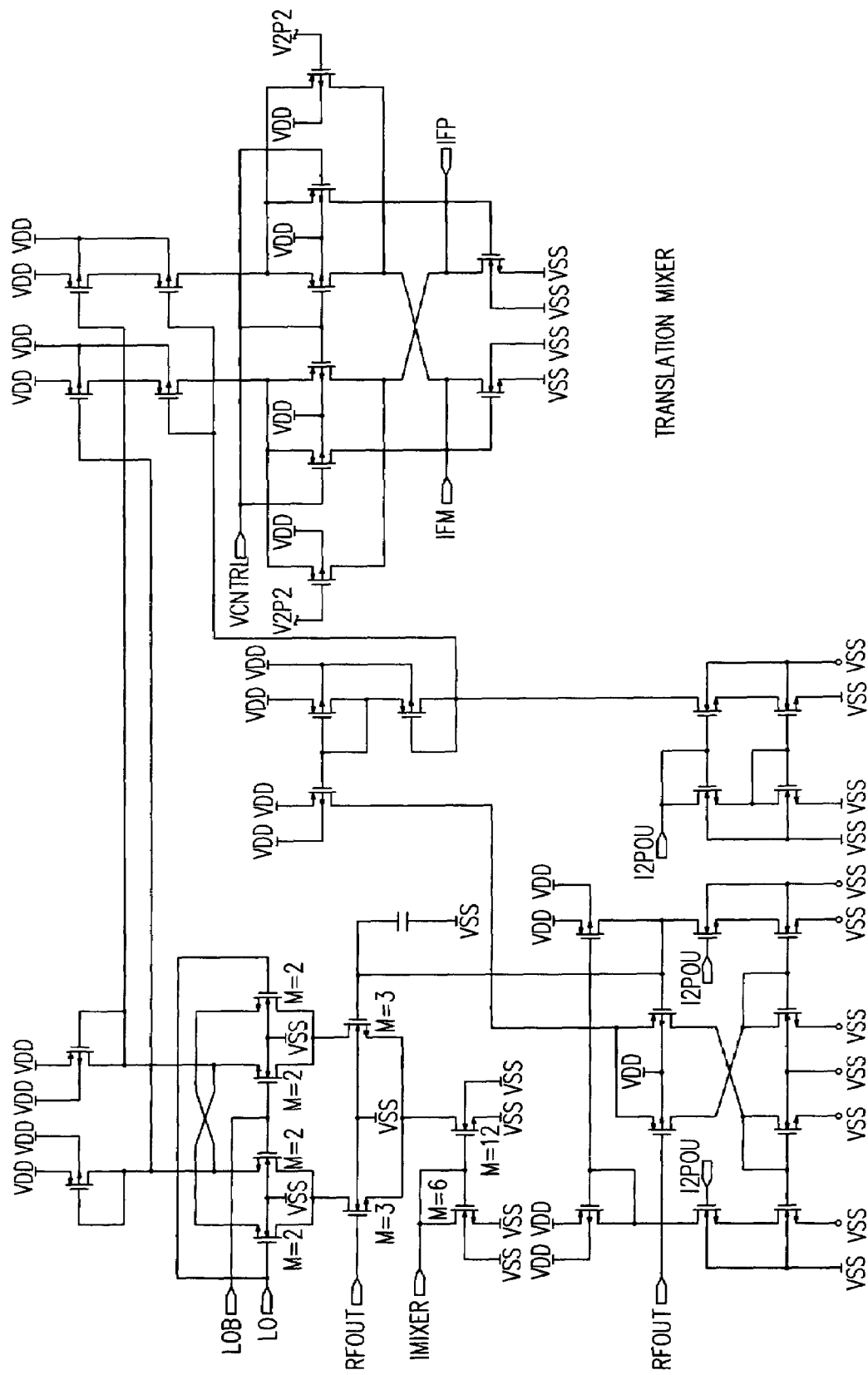
Figure 7:
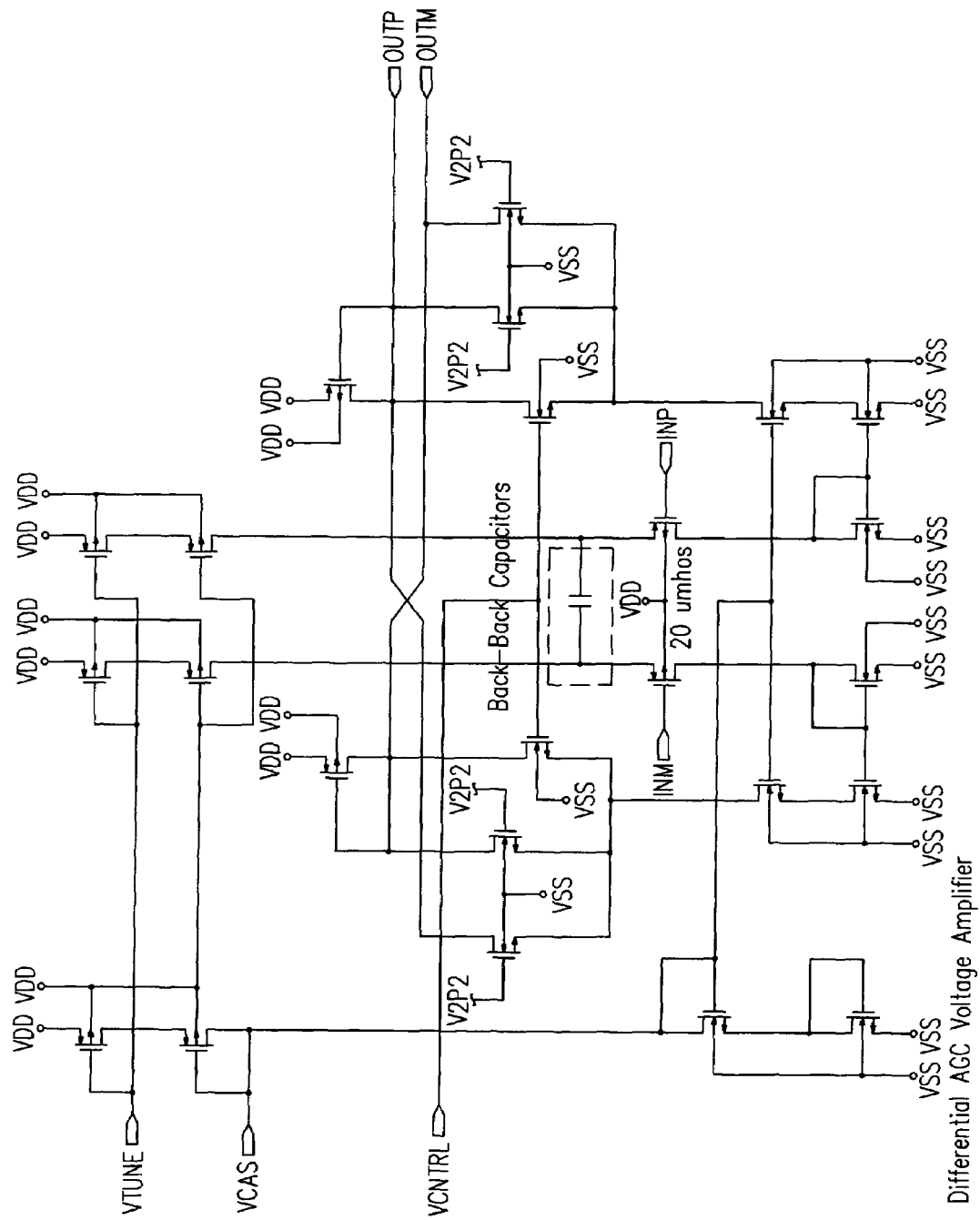
Figure 8B:
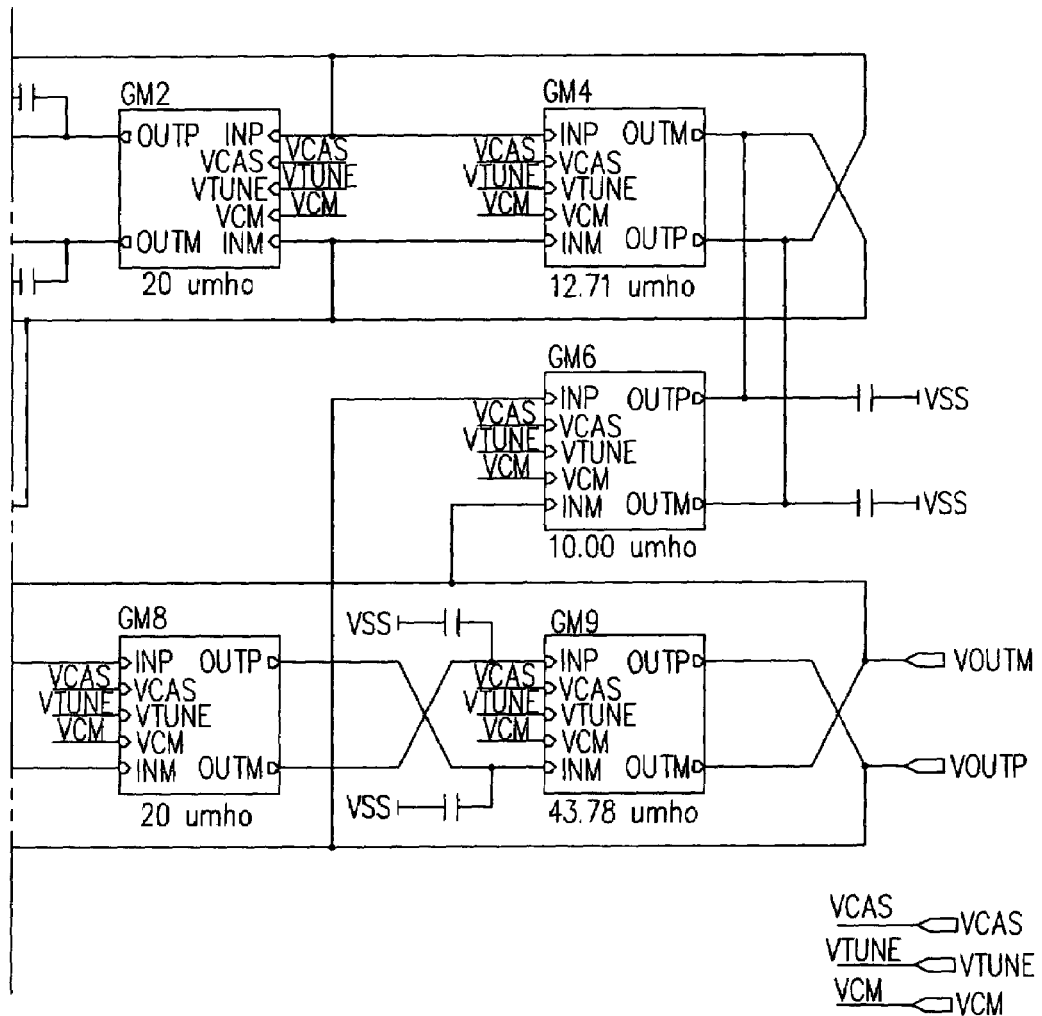
Figure 9:
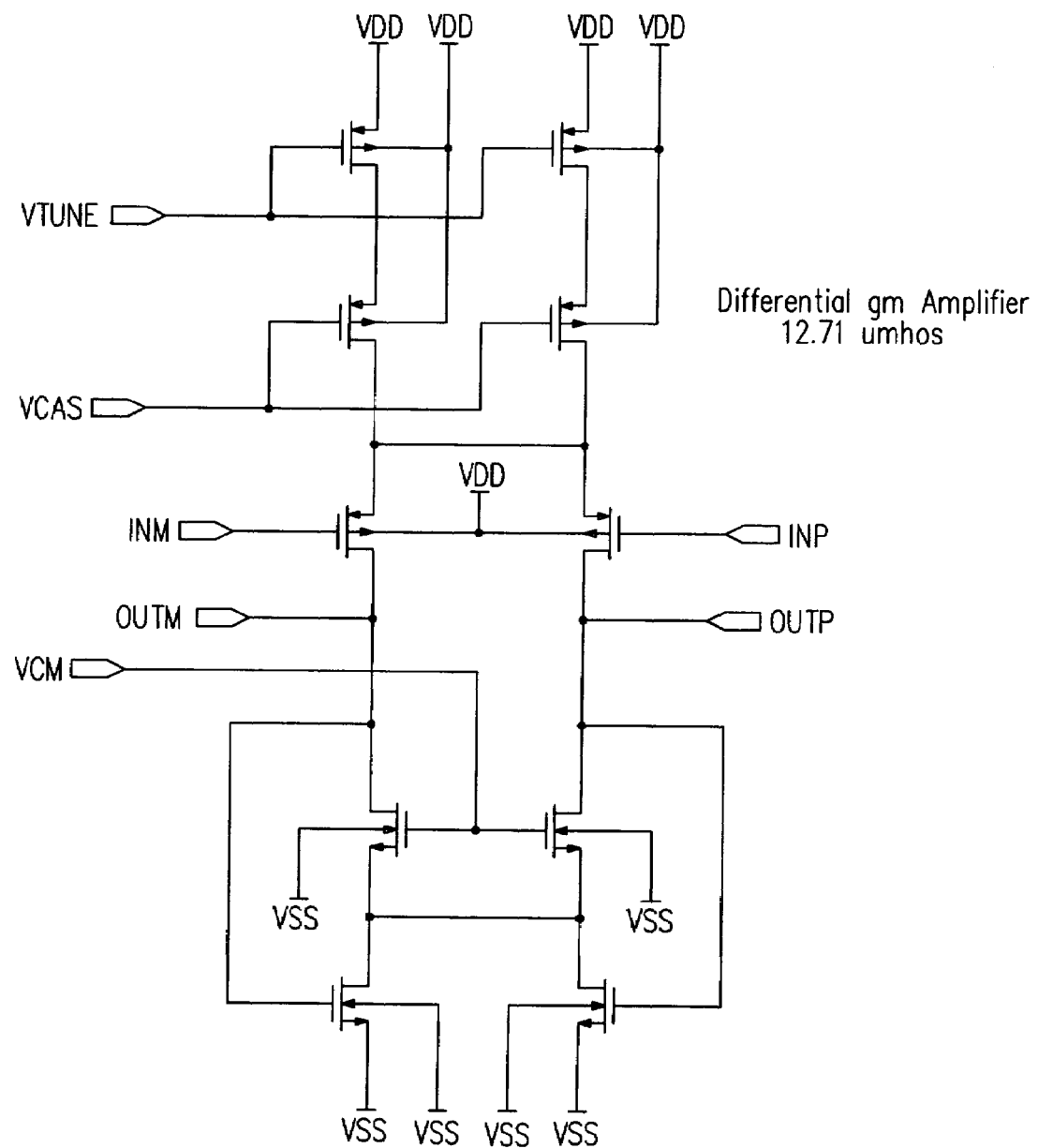
Figure 10:
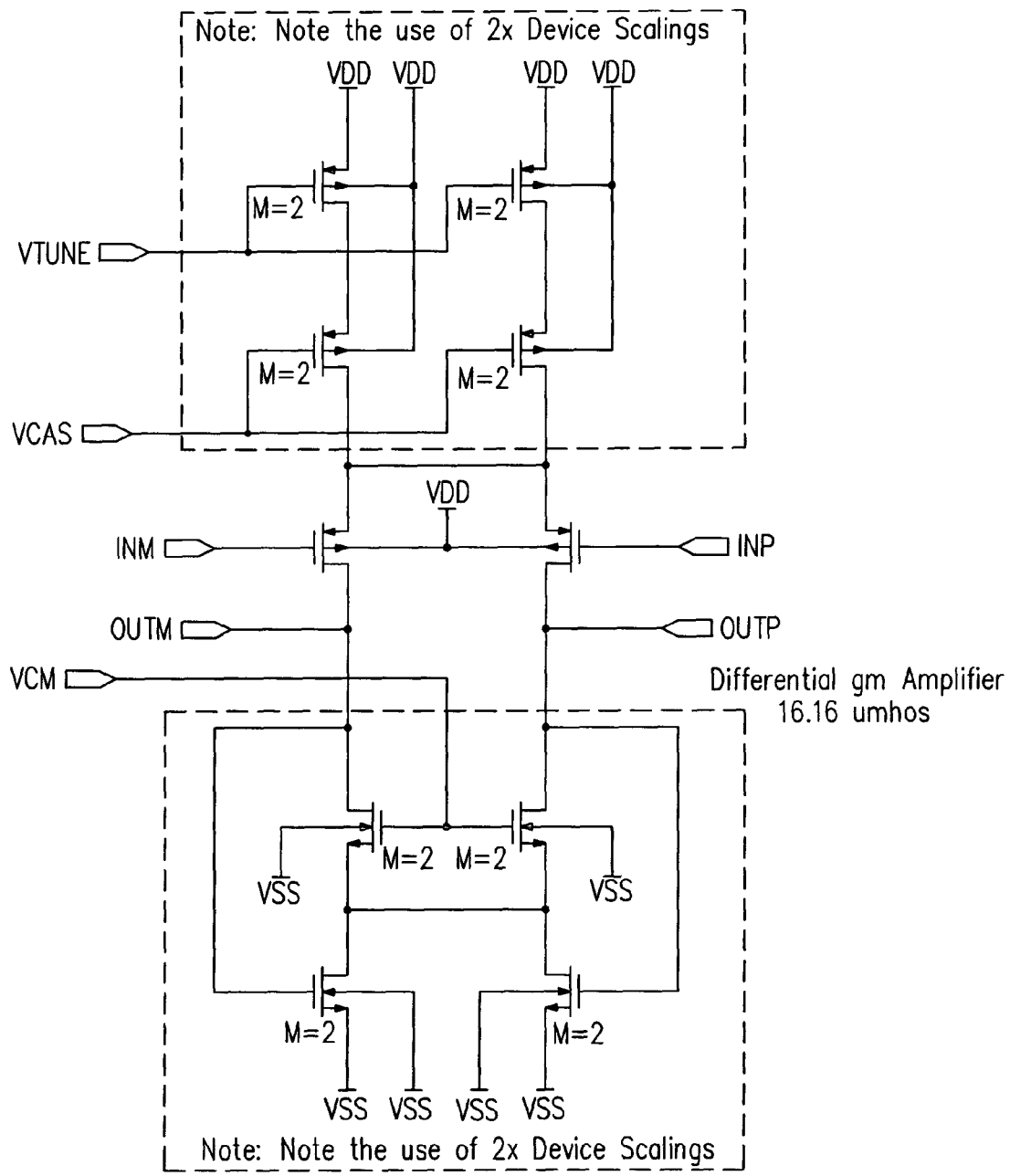
Figure 11:
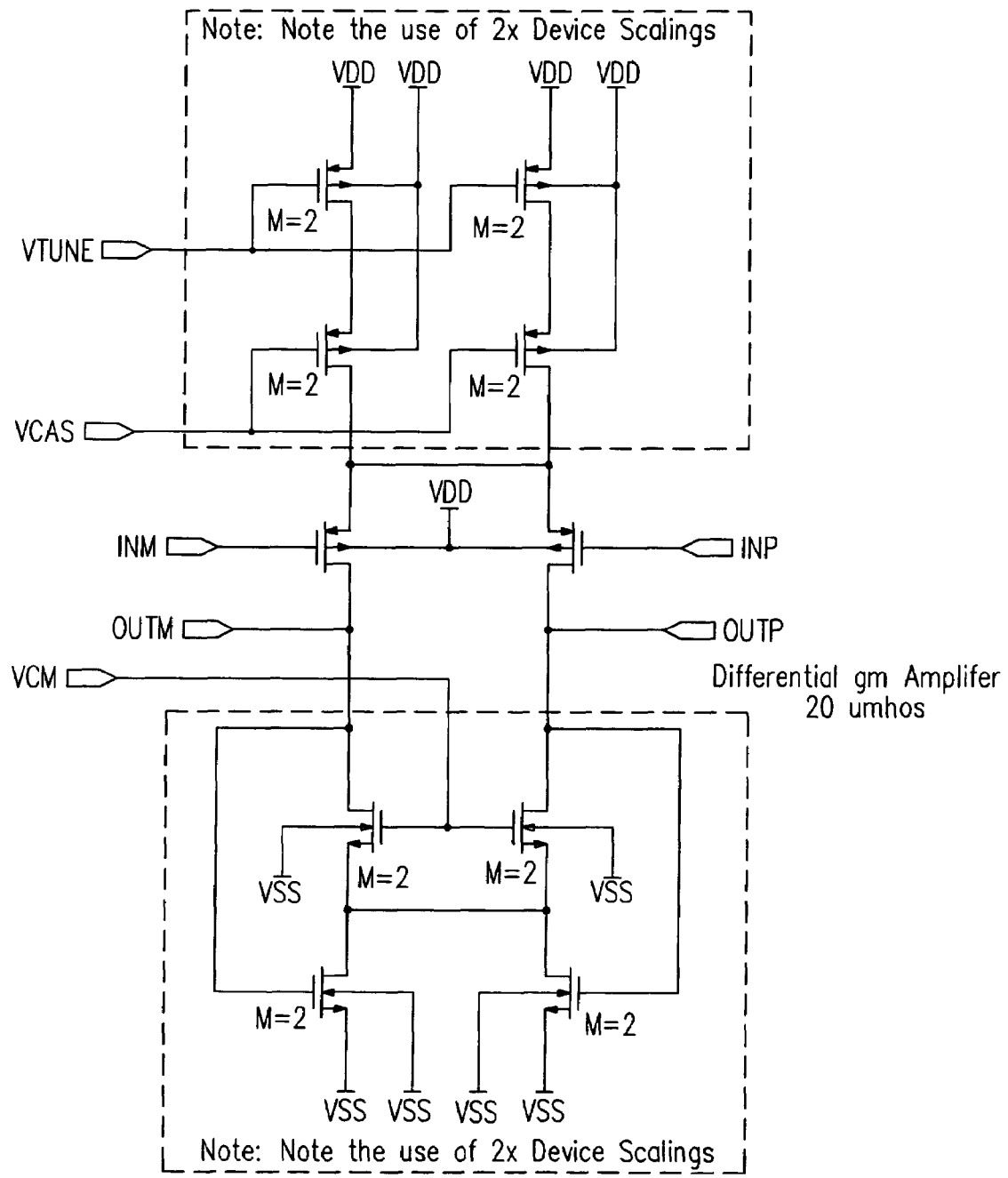
Figure 12:
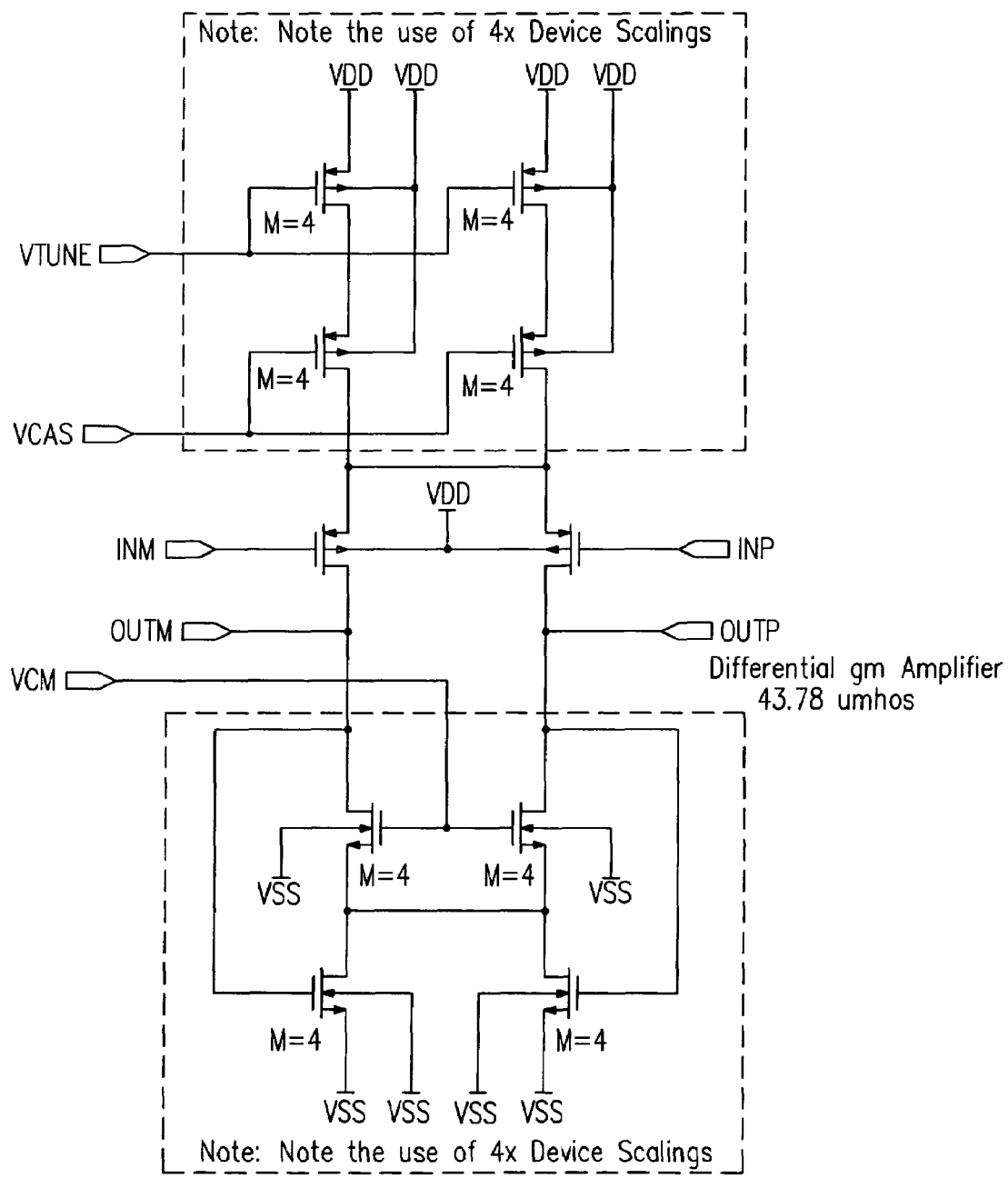
Figure 13:
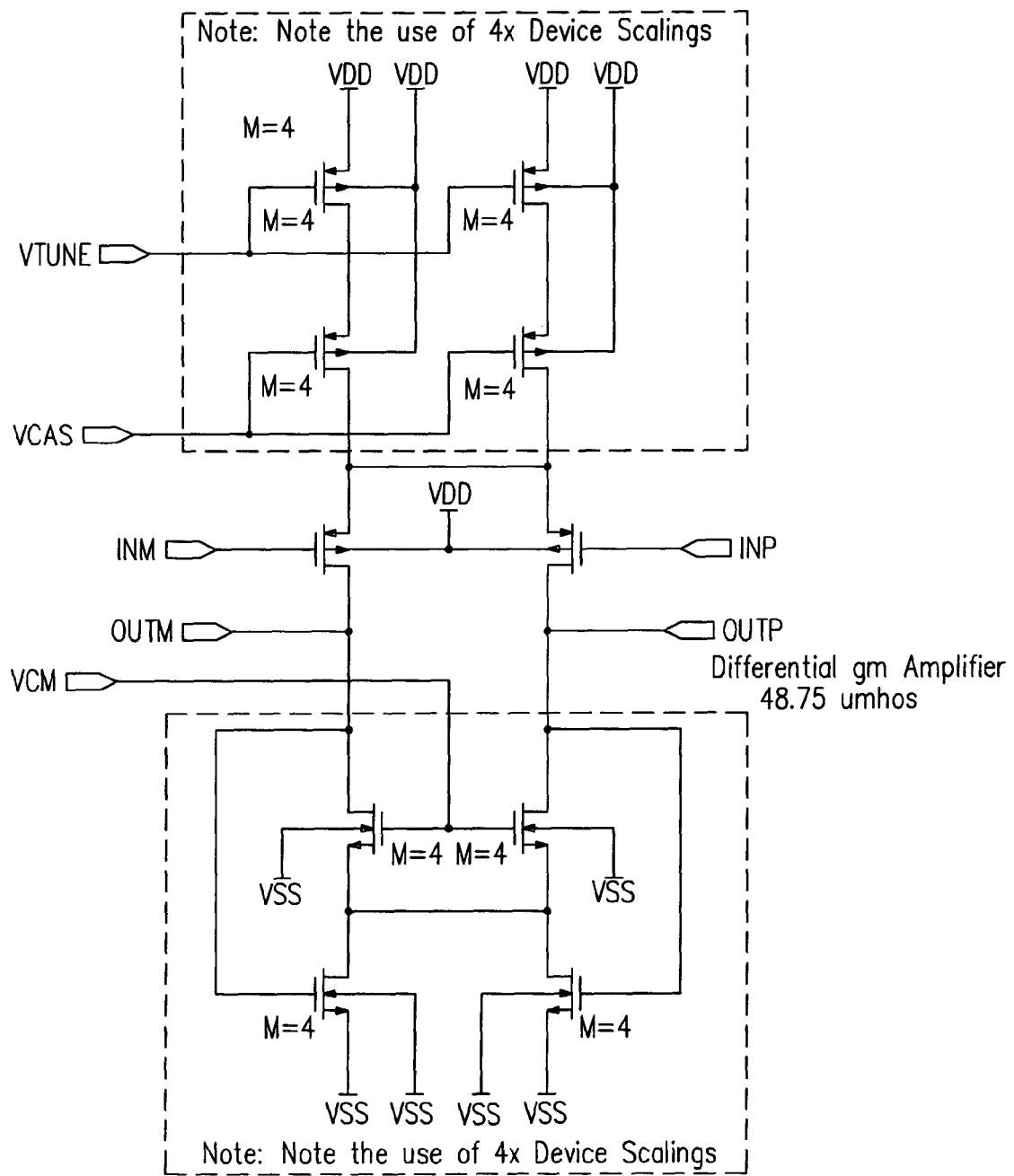
Figure 14:
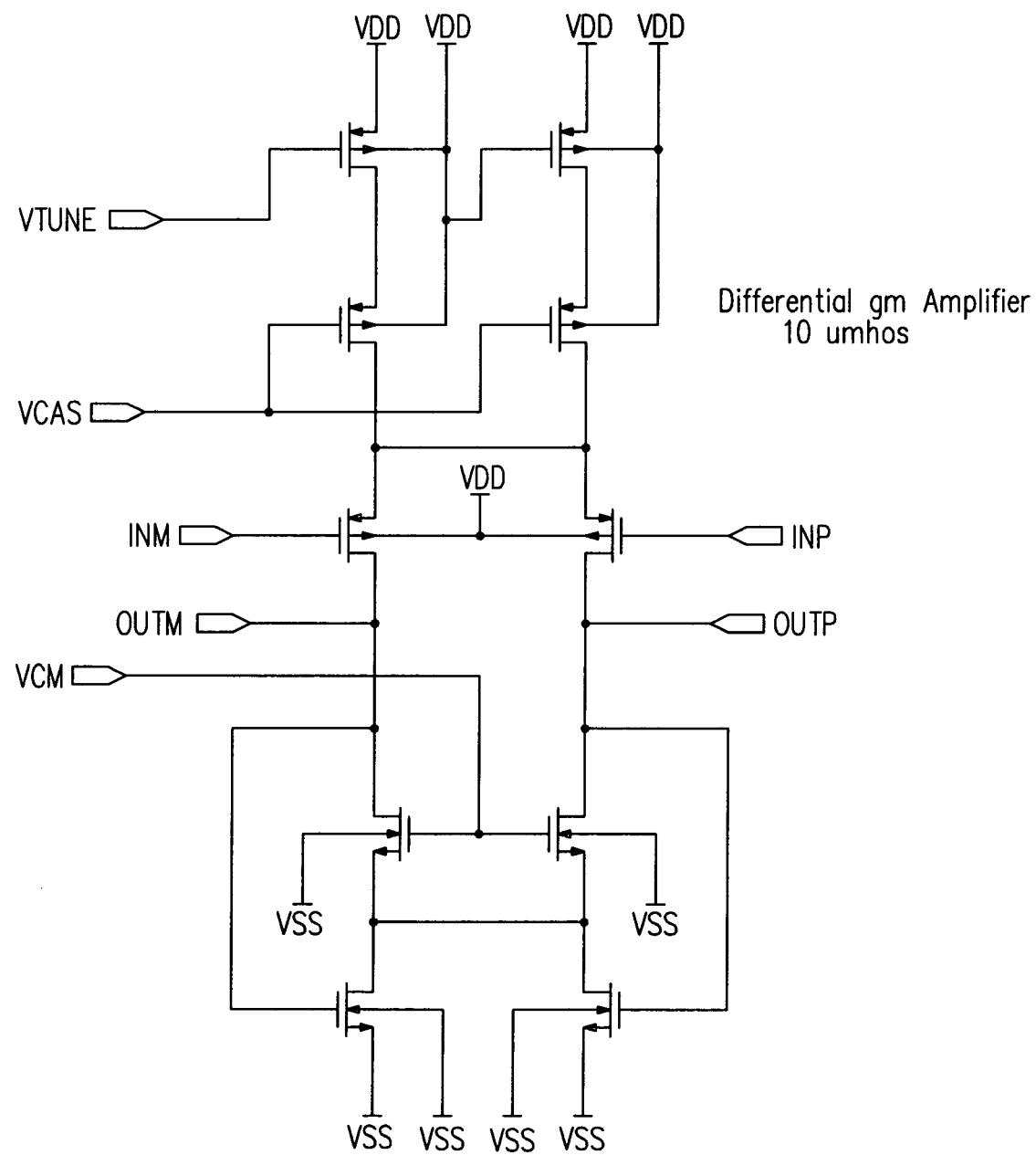
Figure 15:
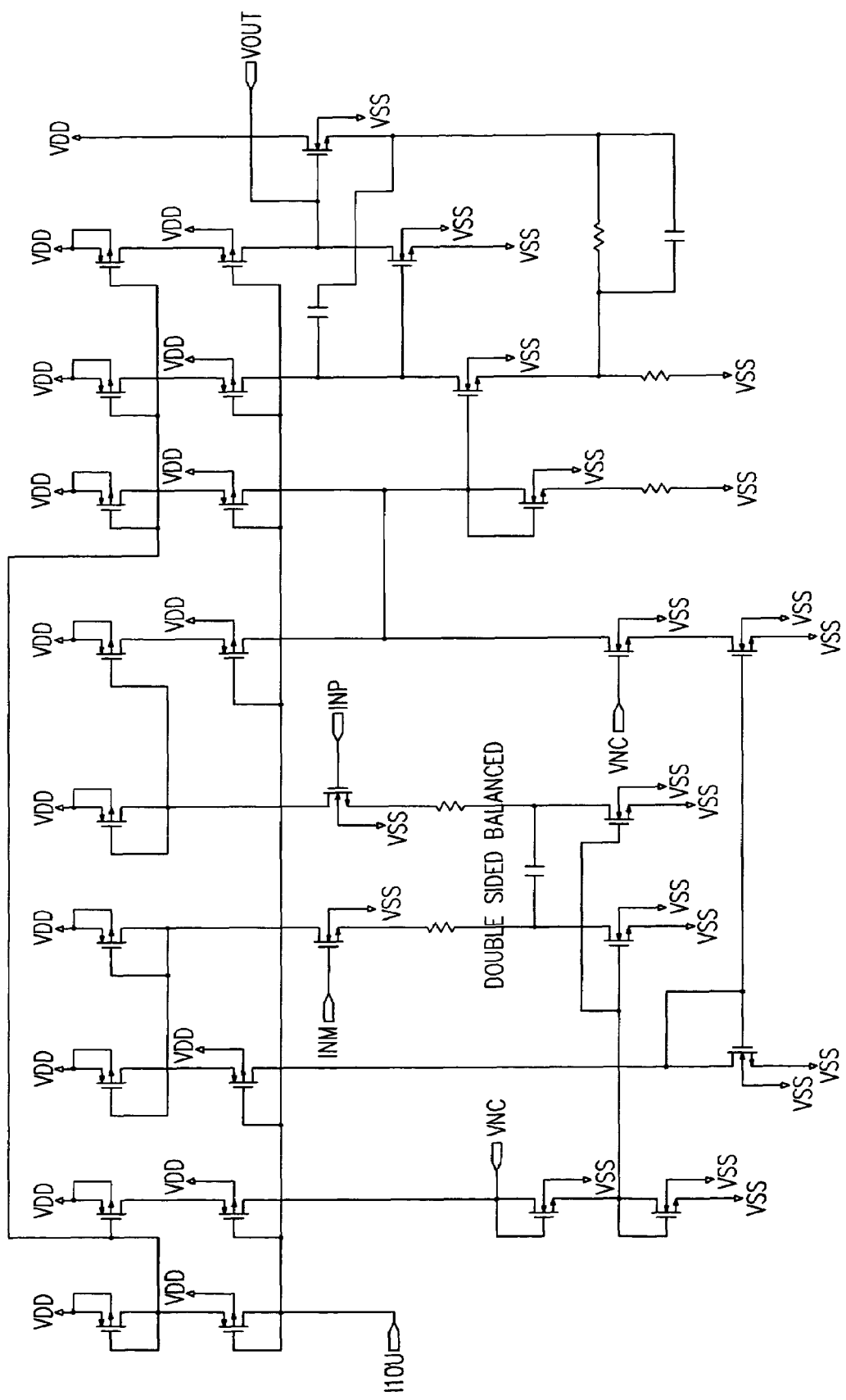
Figure 16:
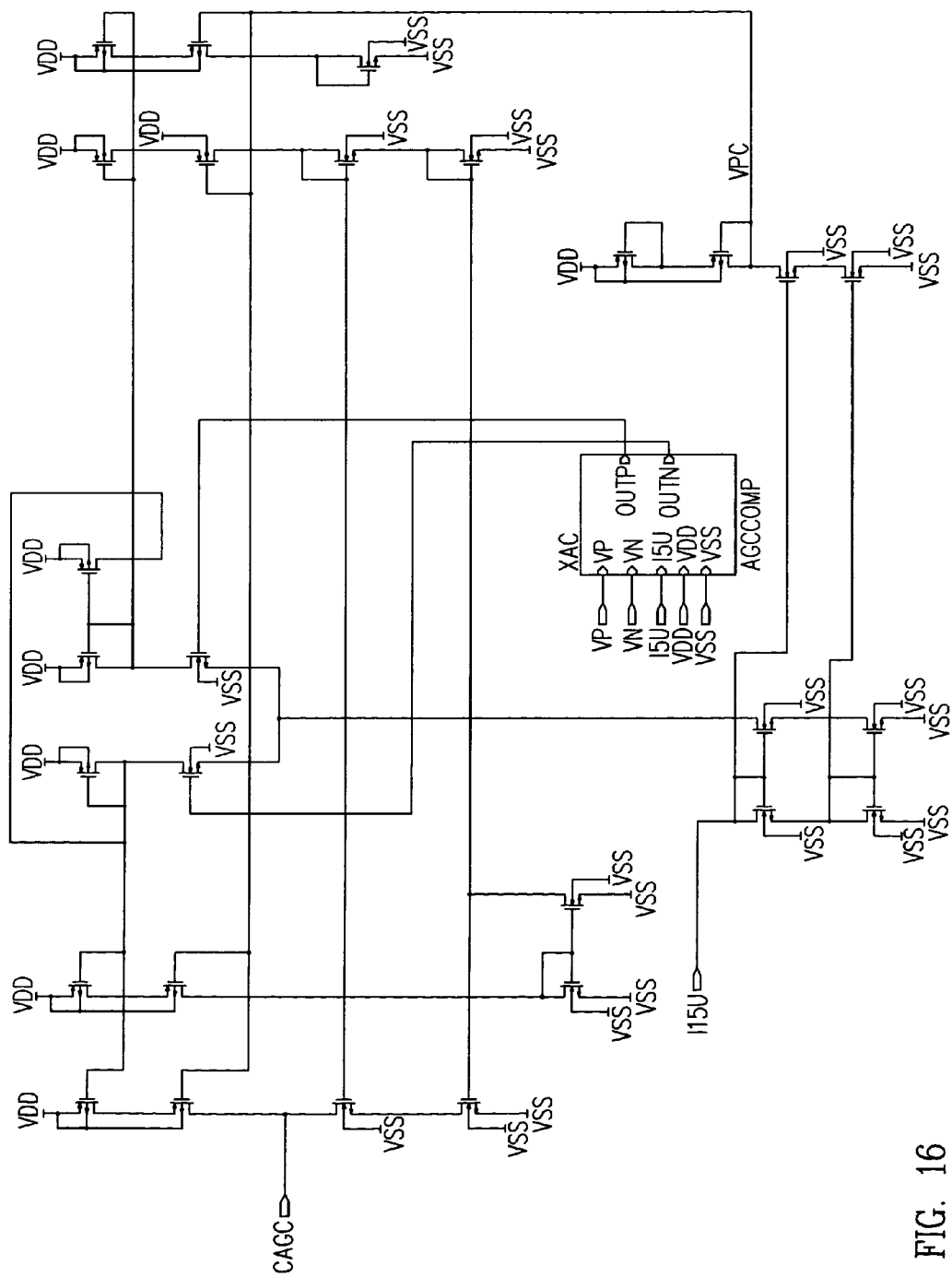
Figure 17:
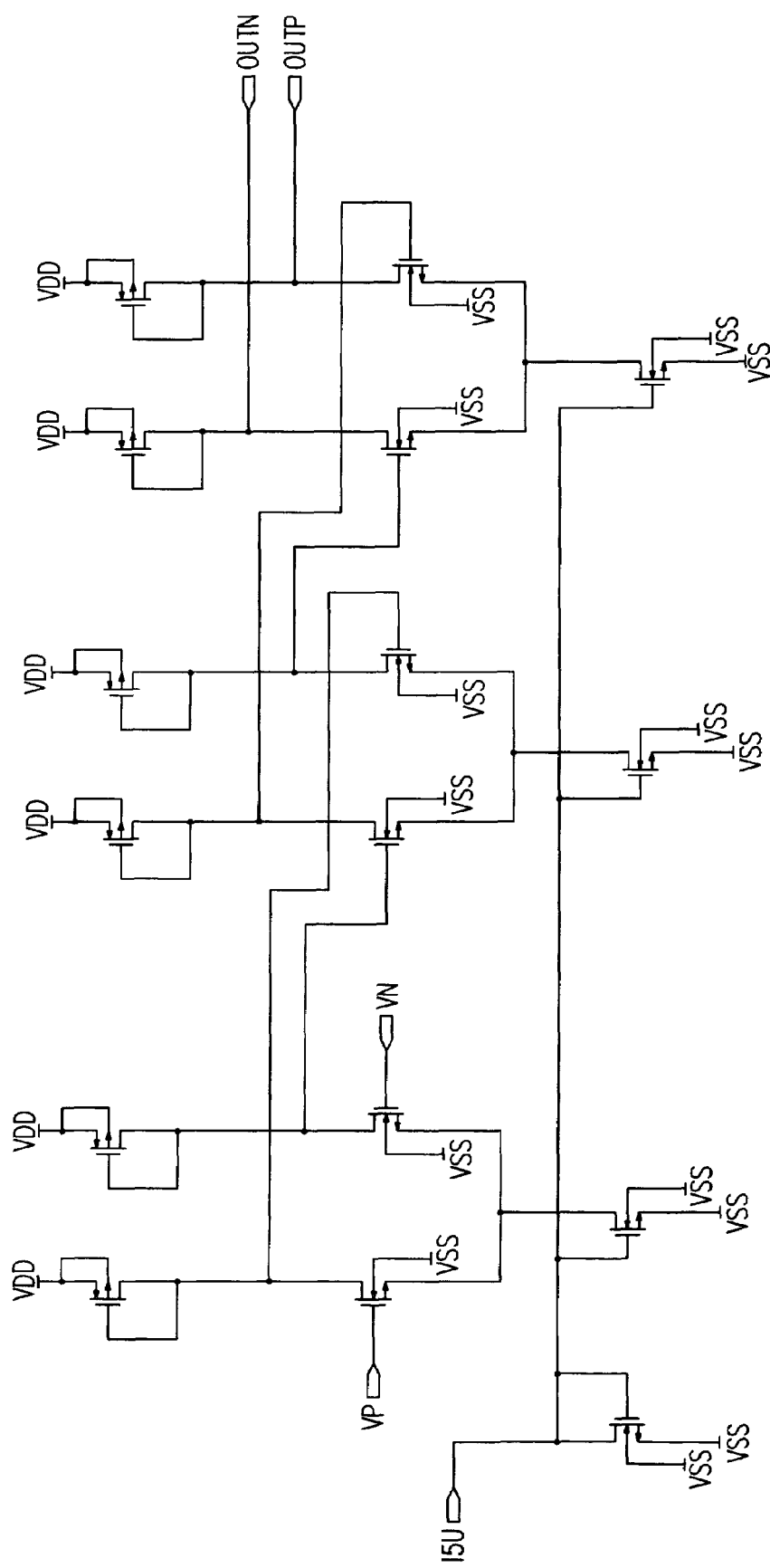
Figure 18A:
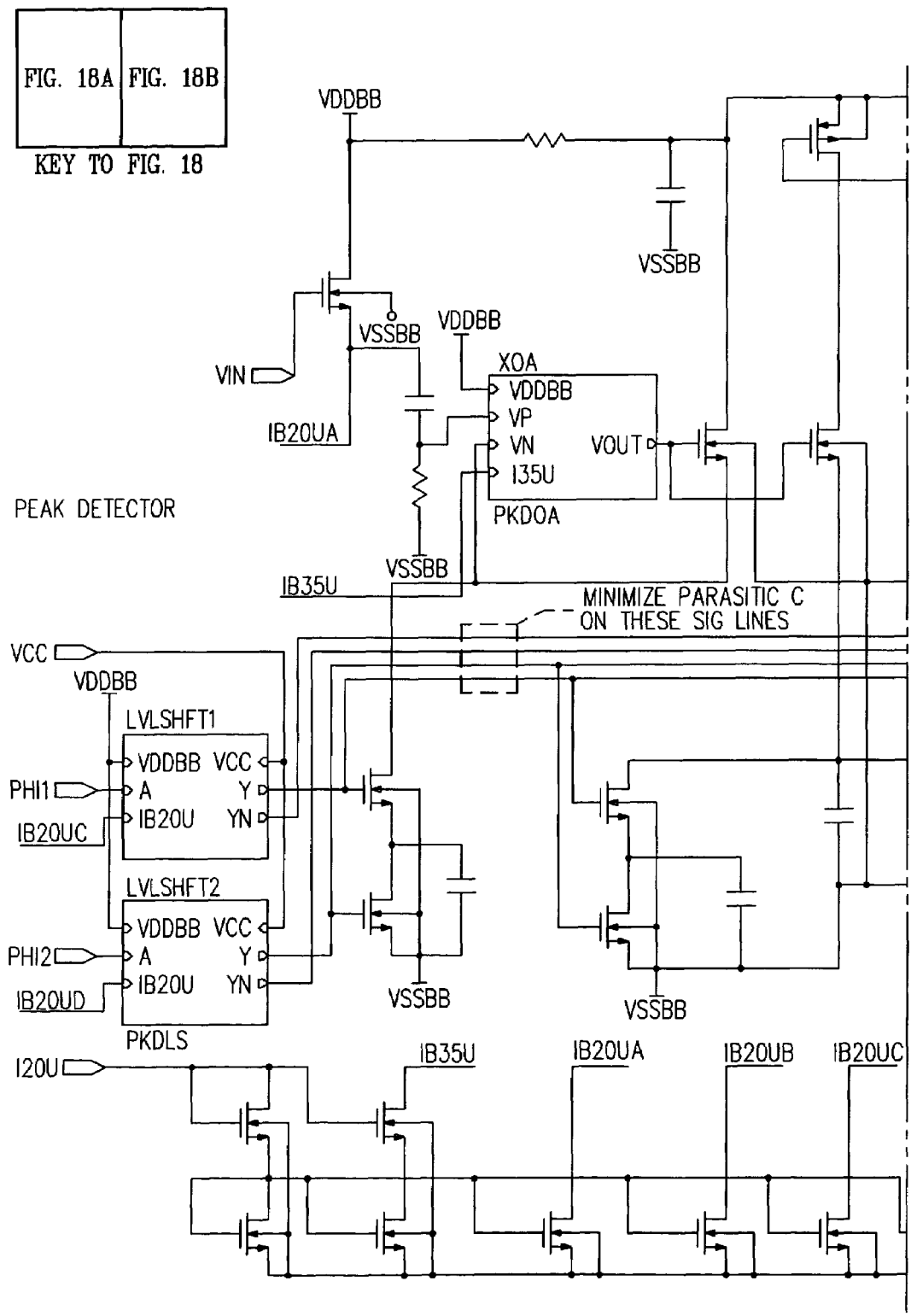
Figure 18B:
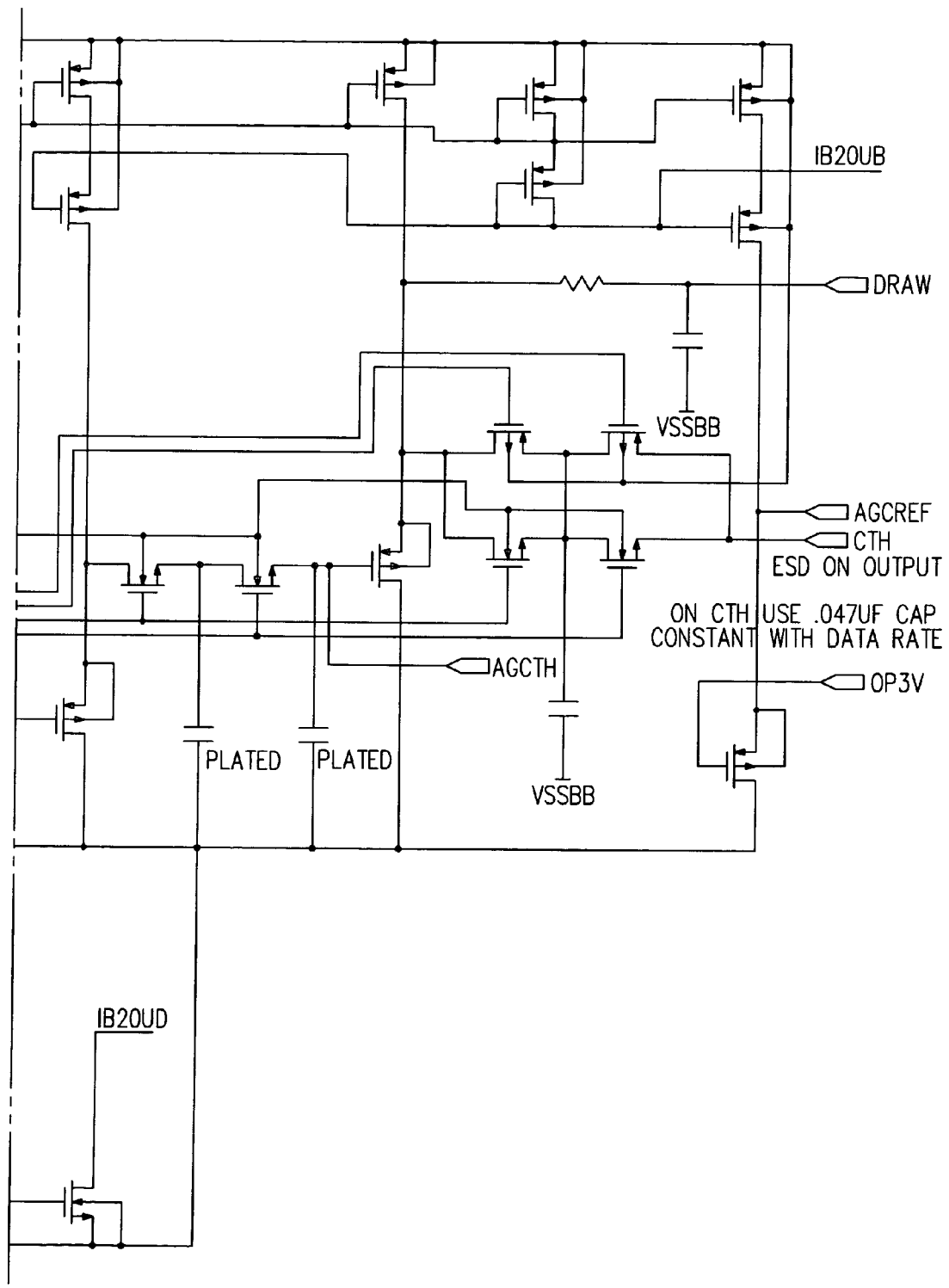
Figure 19:
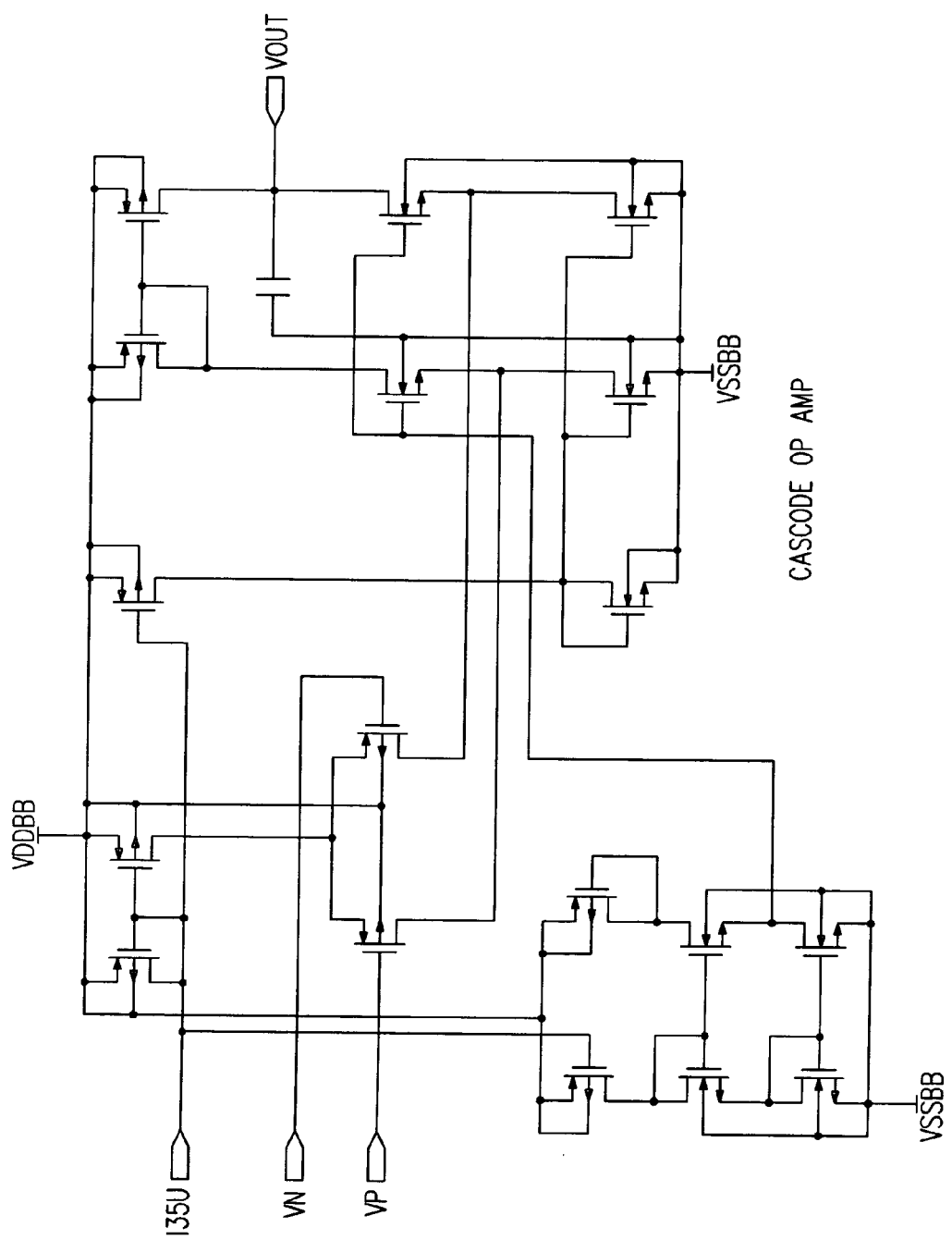
Figure 20:
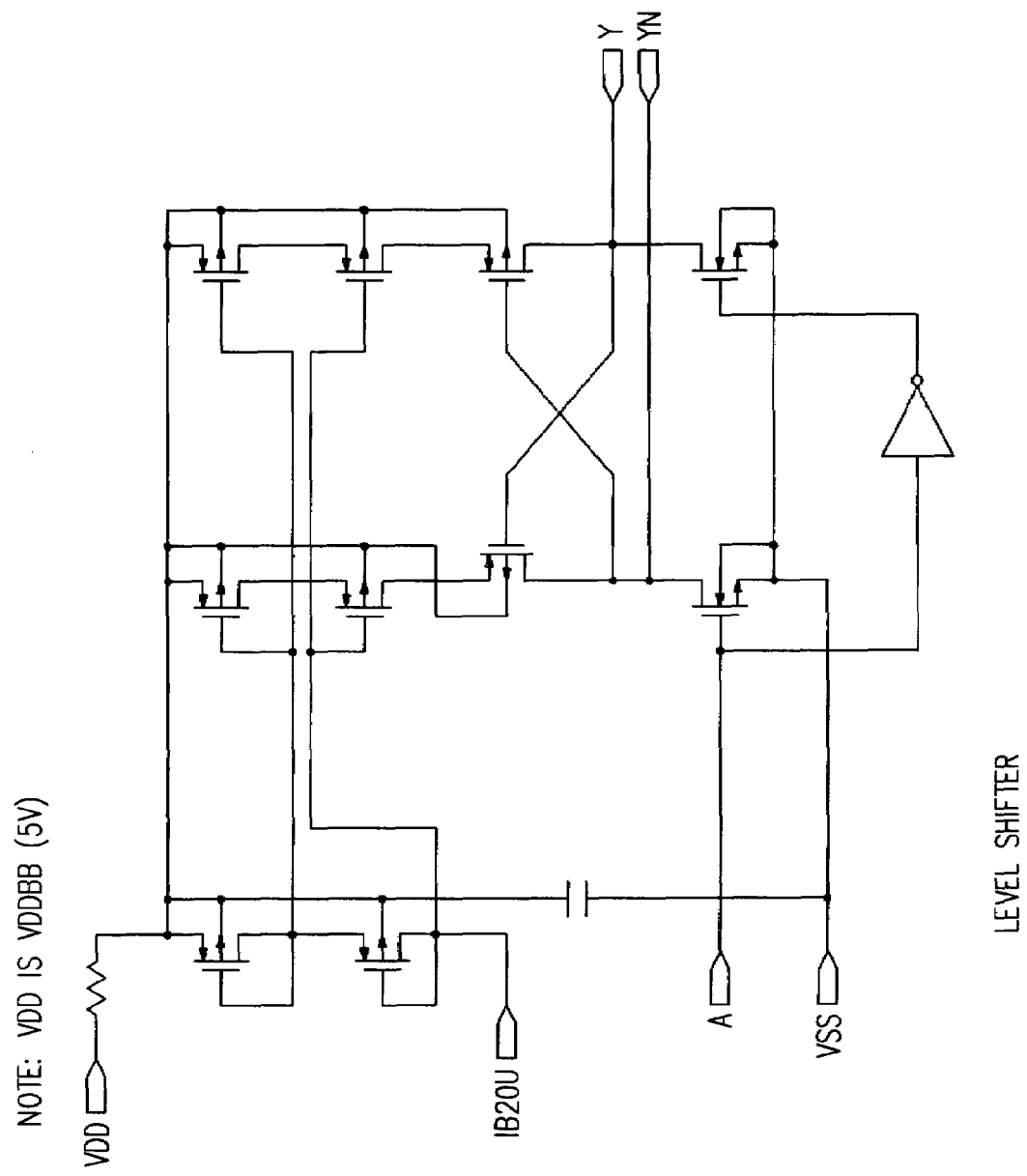
Figure 21:
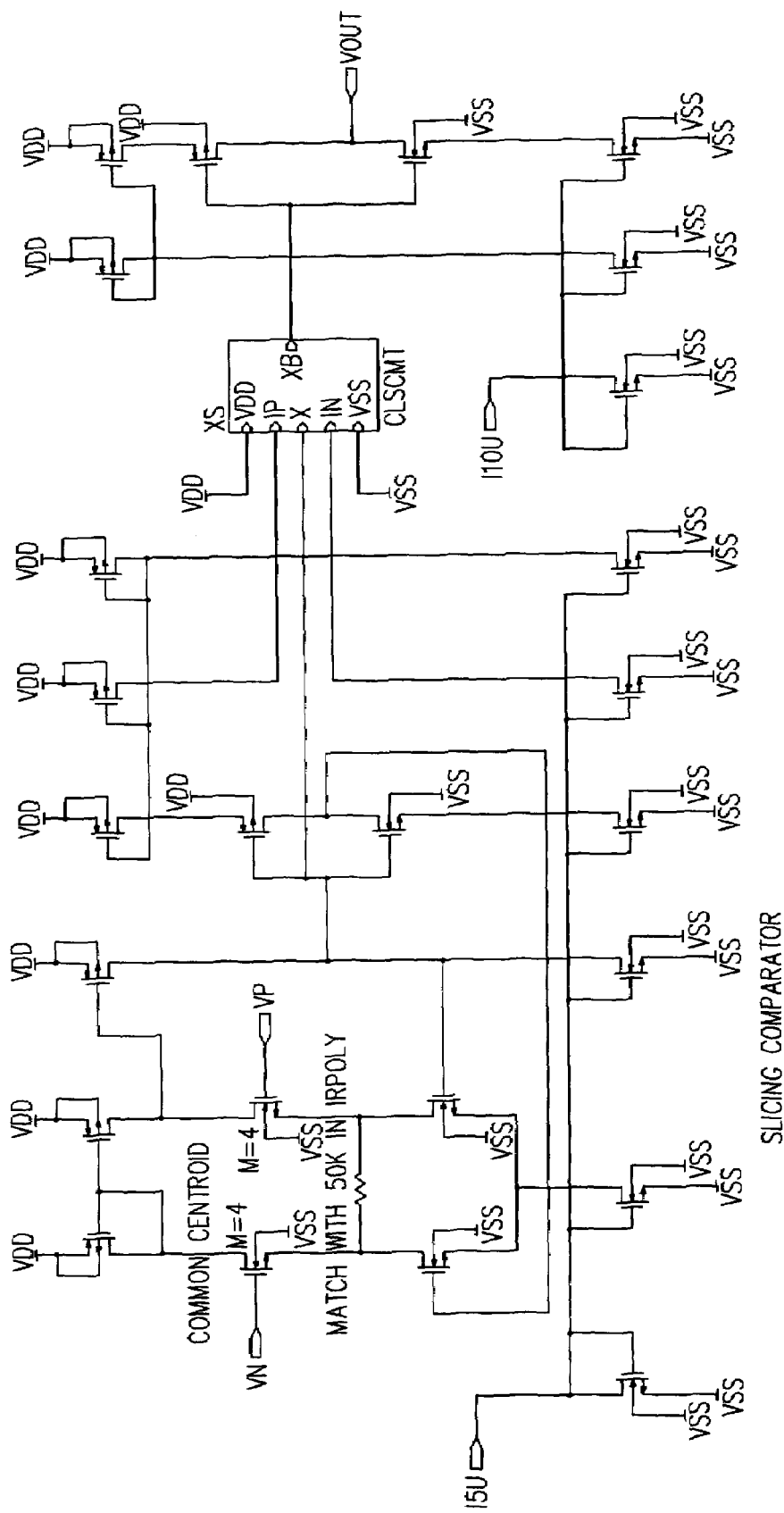
Figure 22:
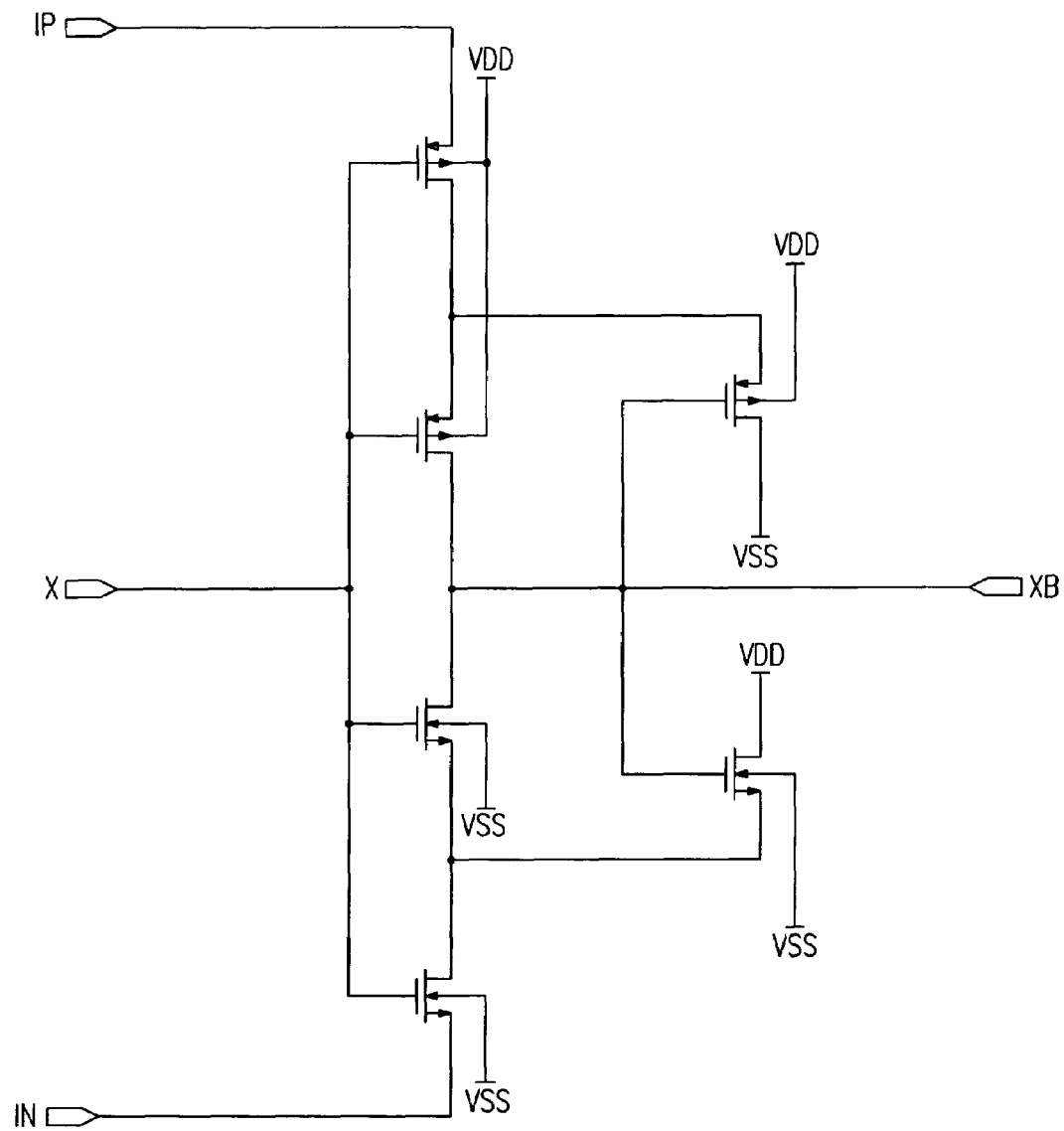
Figure 23:
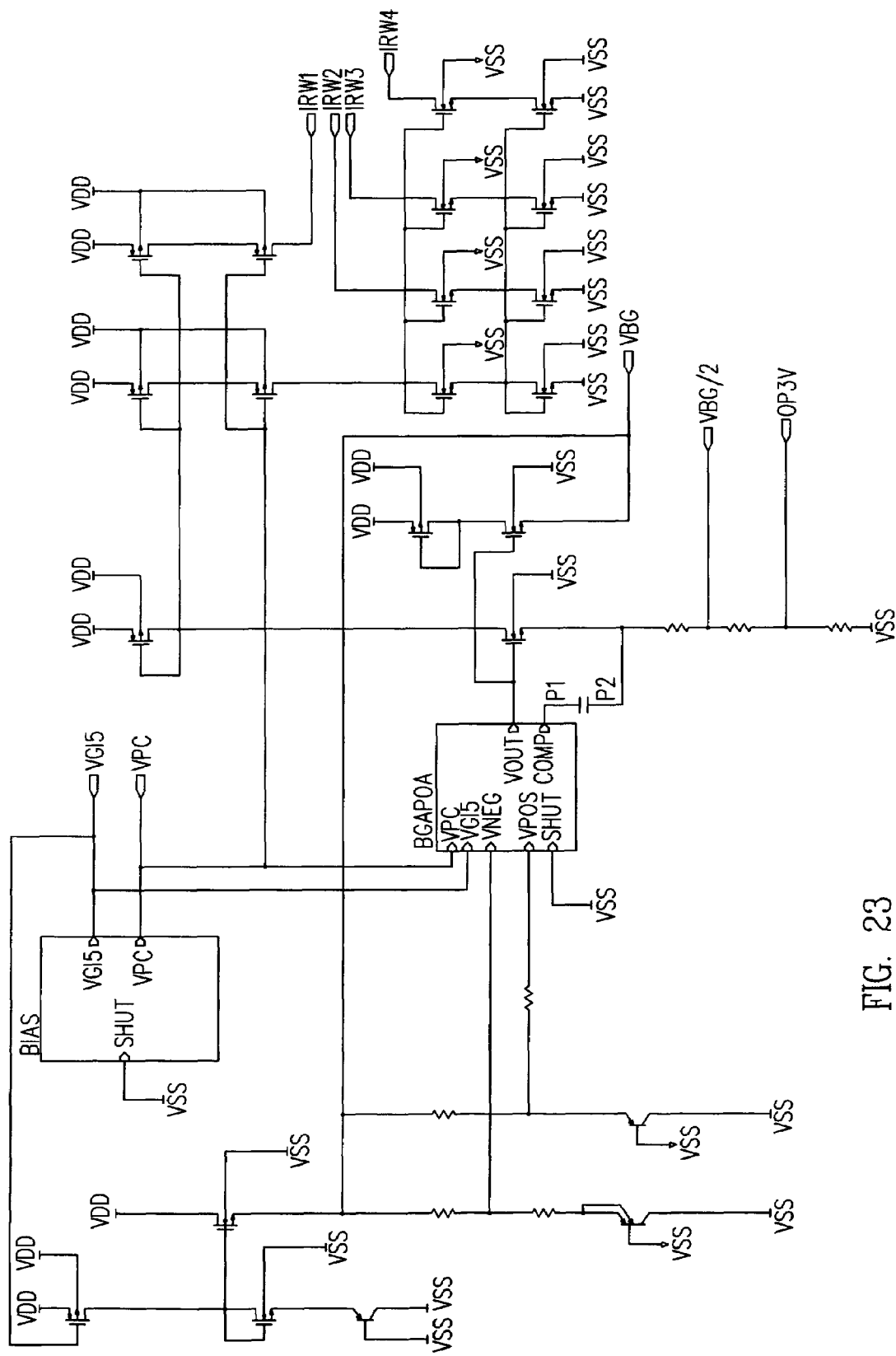
Figure 24:
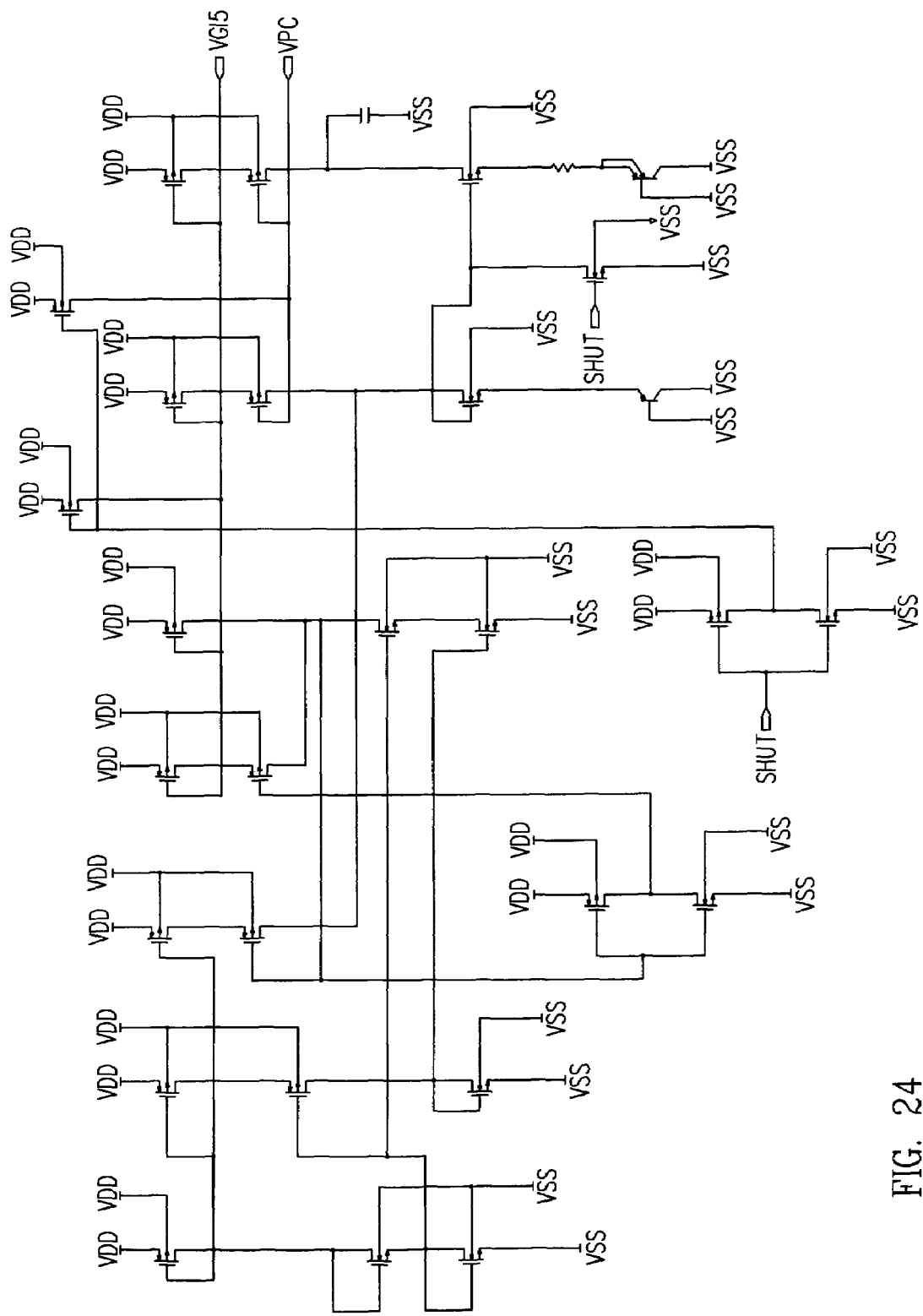
Figure 25:
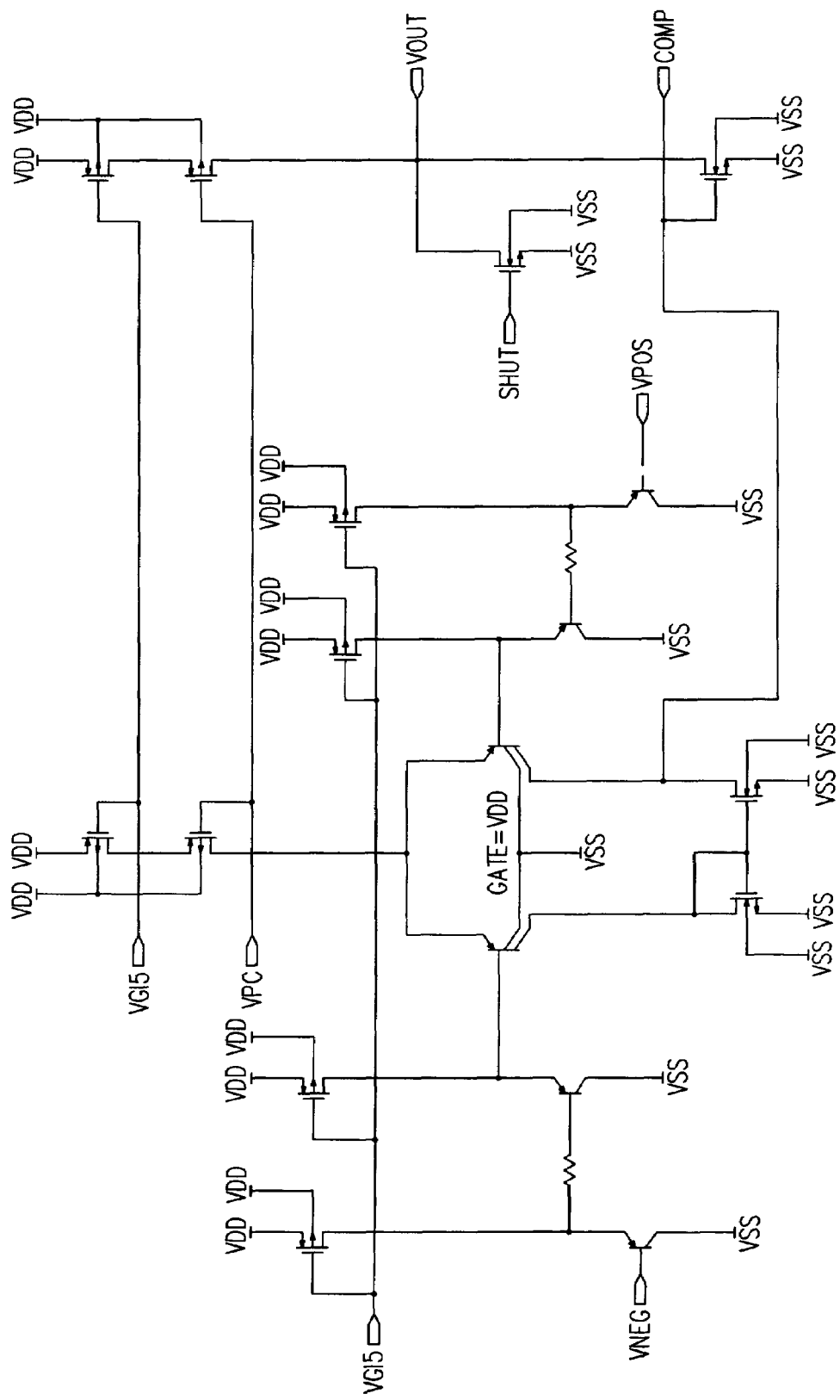
Figure 26:
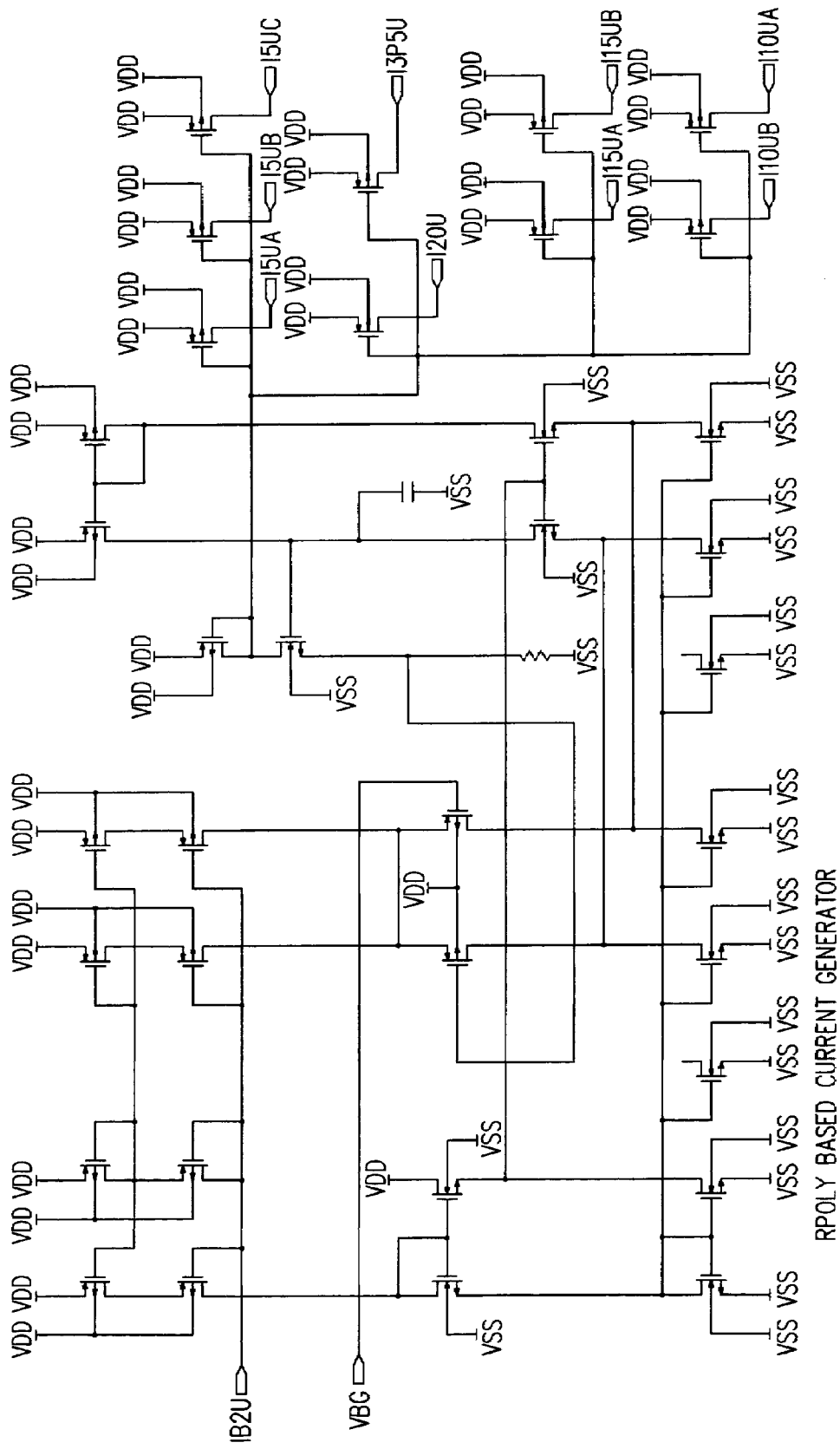
Figure 27:
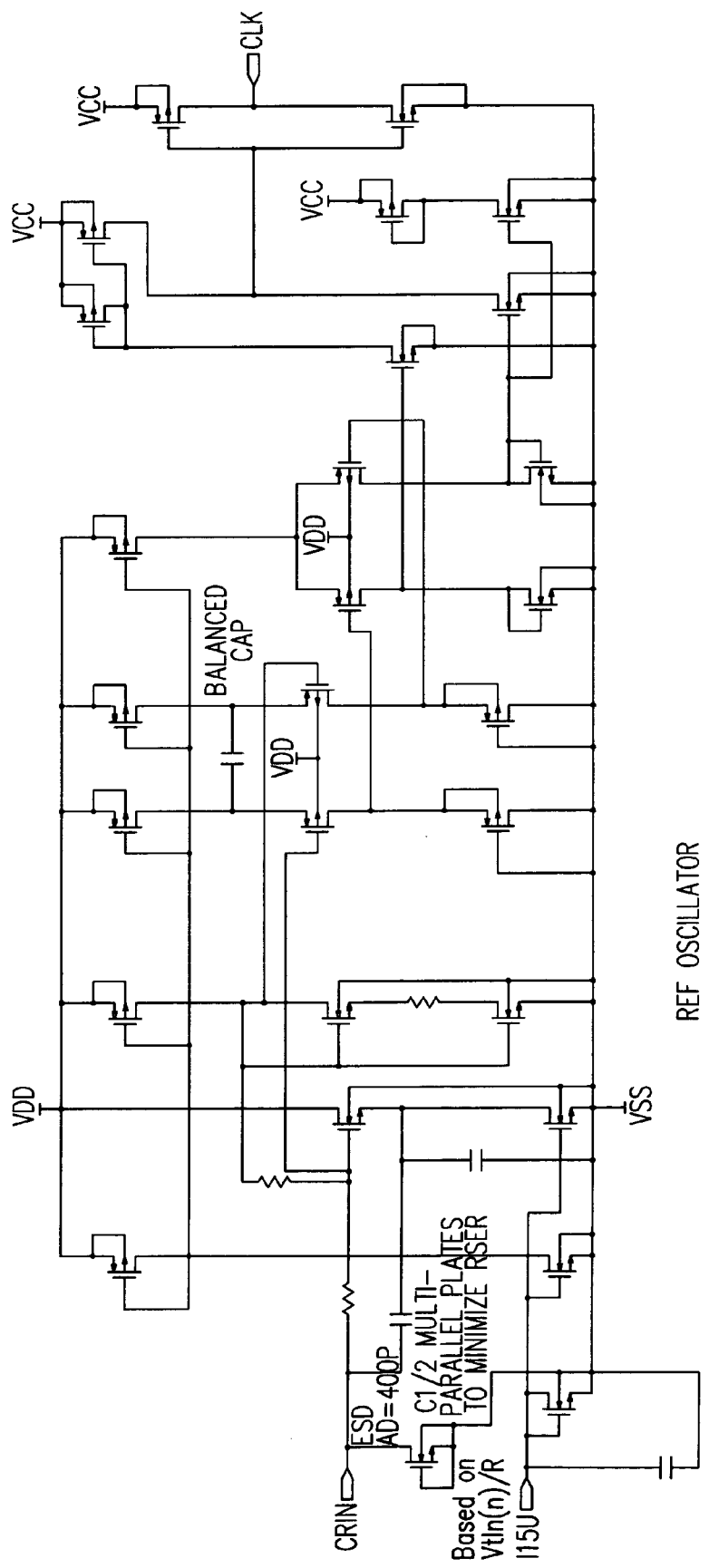
Figure 28:
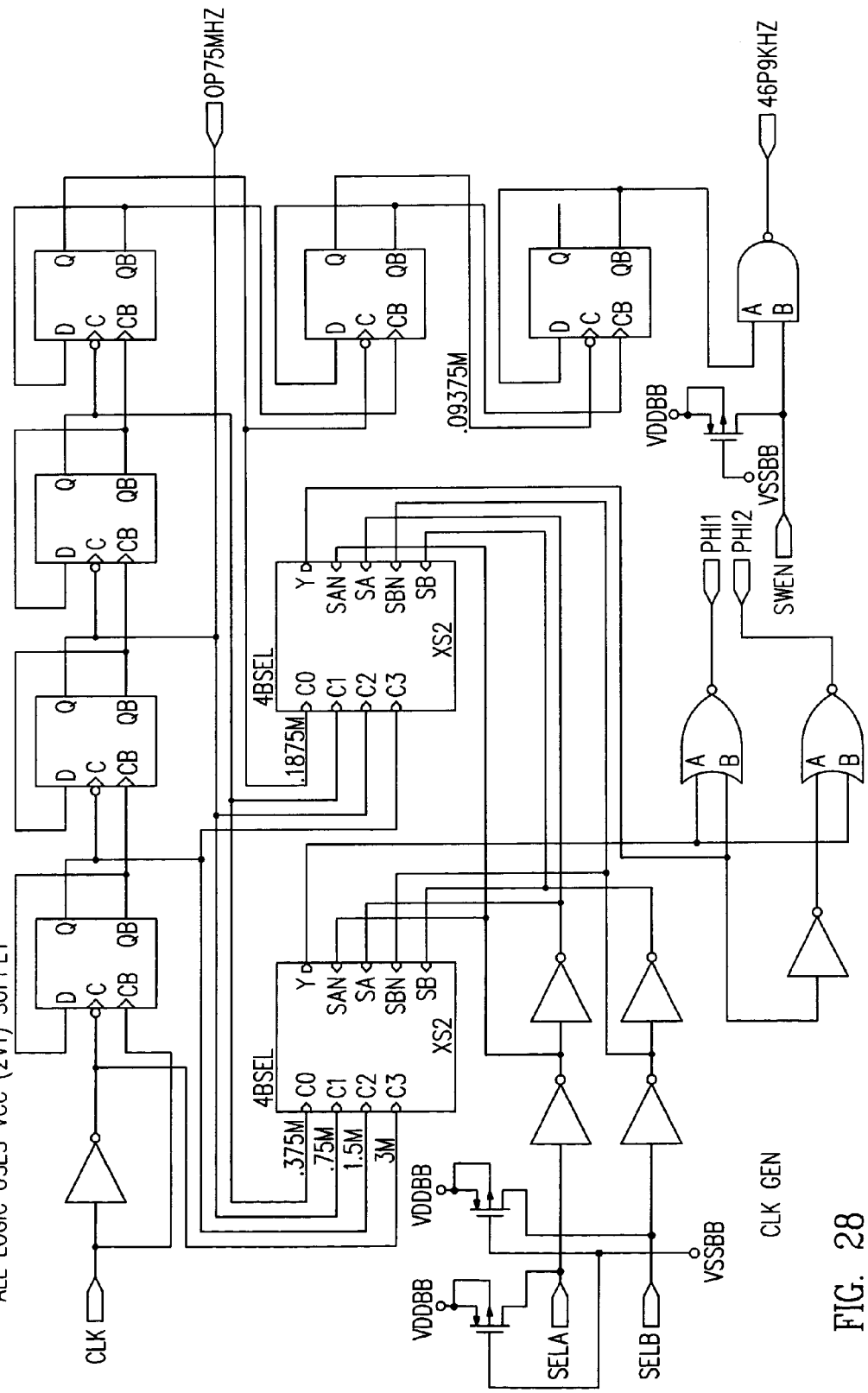
Figure 29:
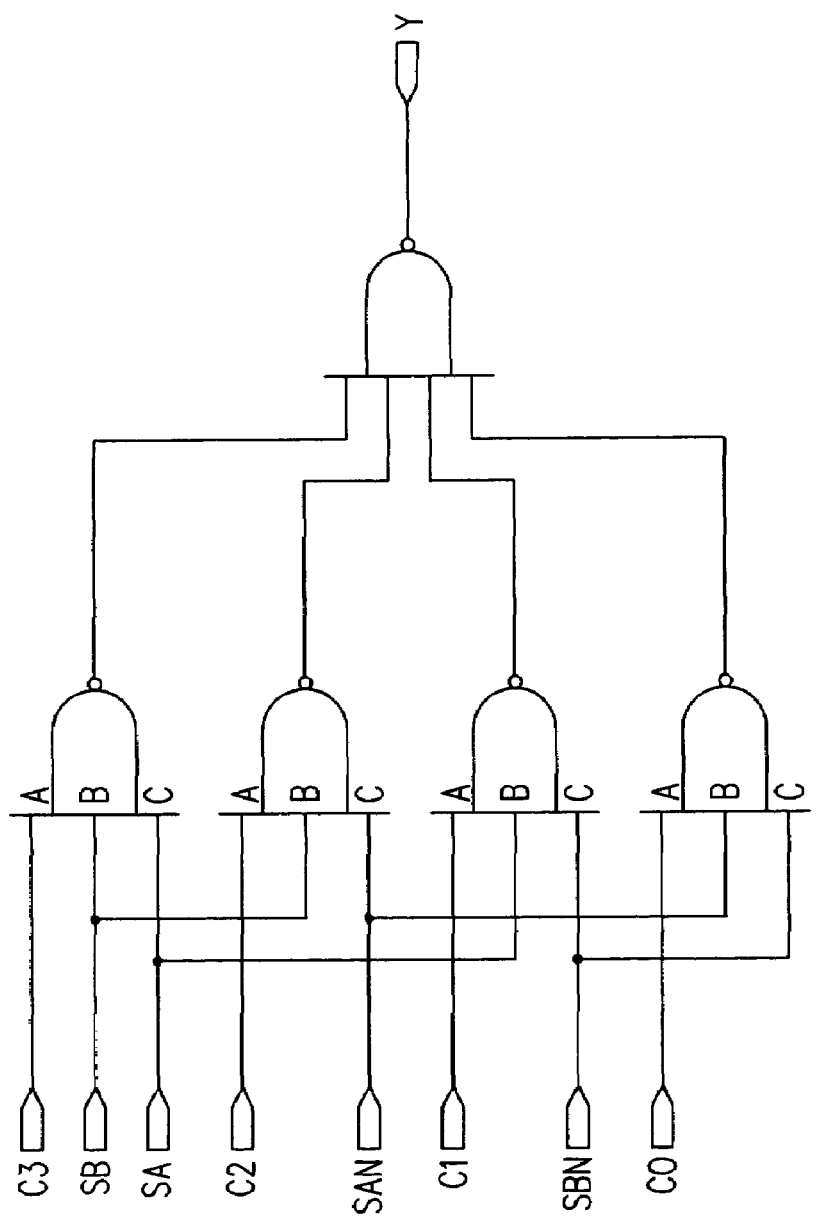
Figure 30:
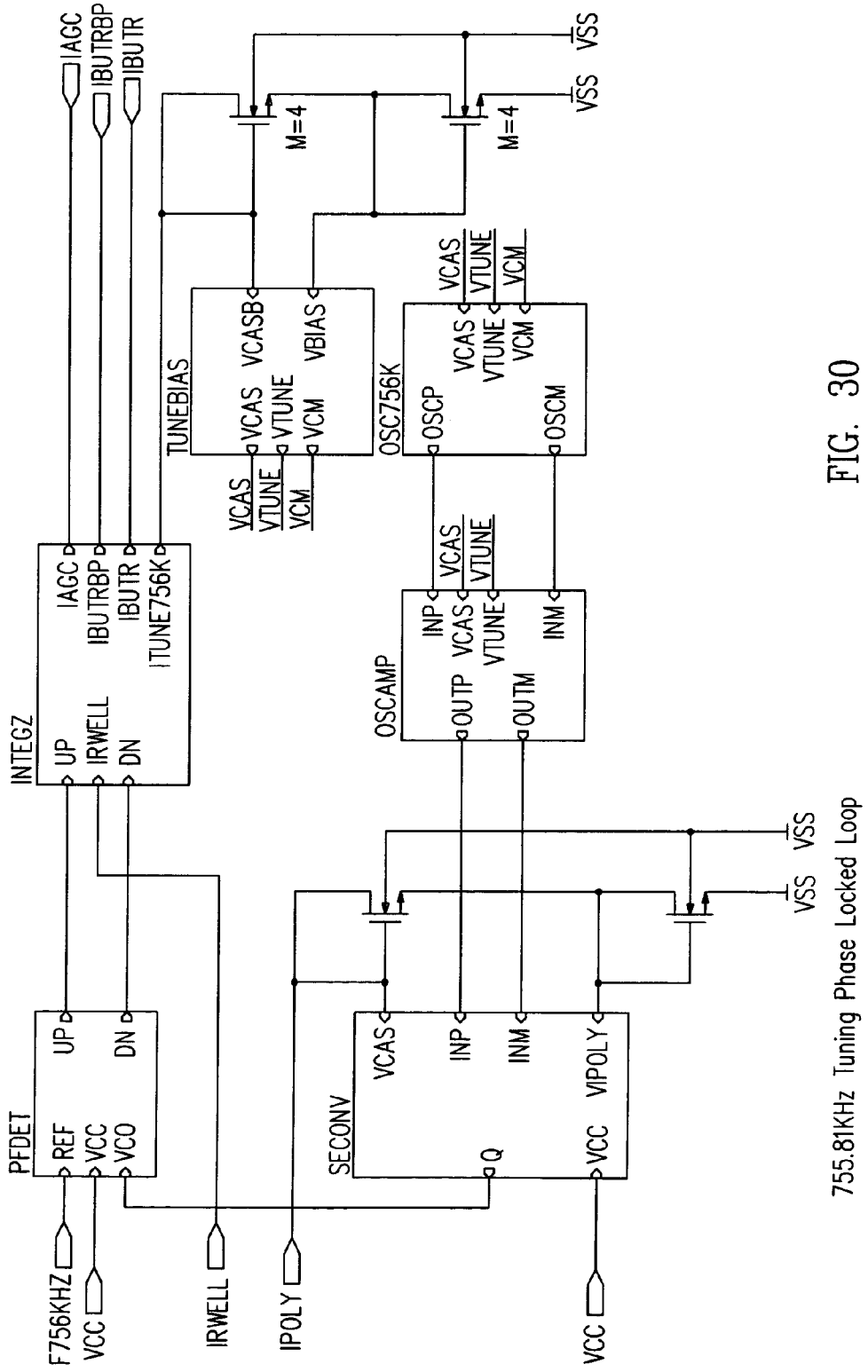
Figure 31:
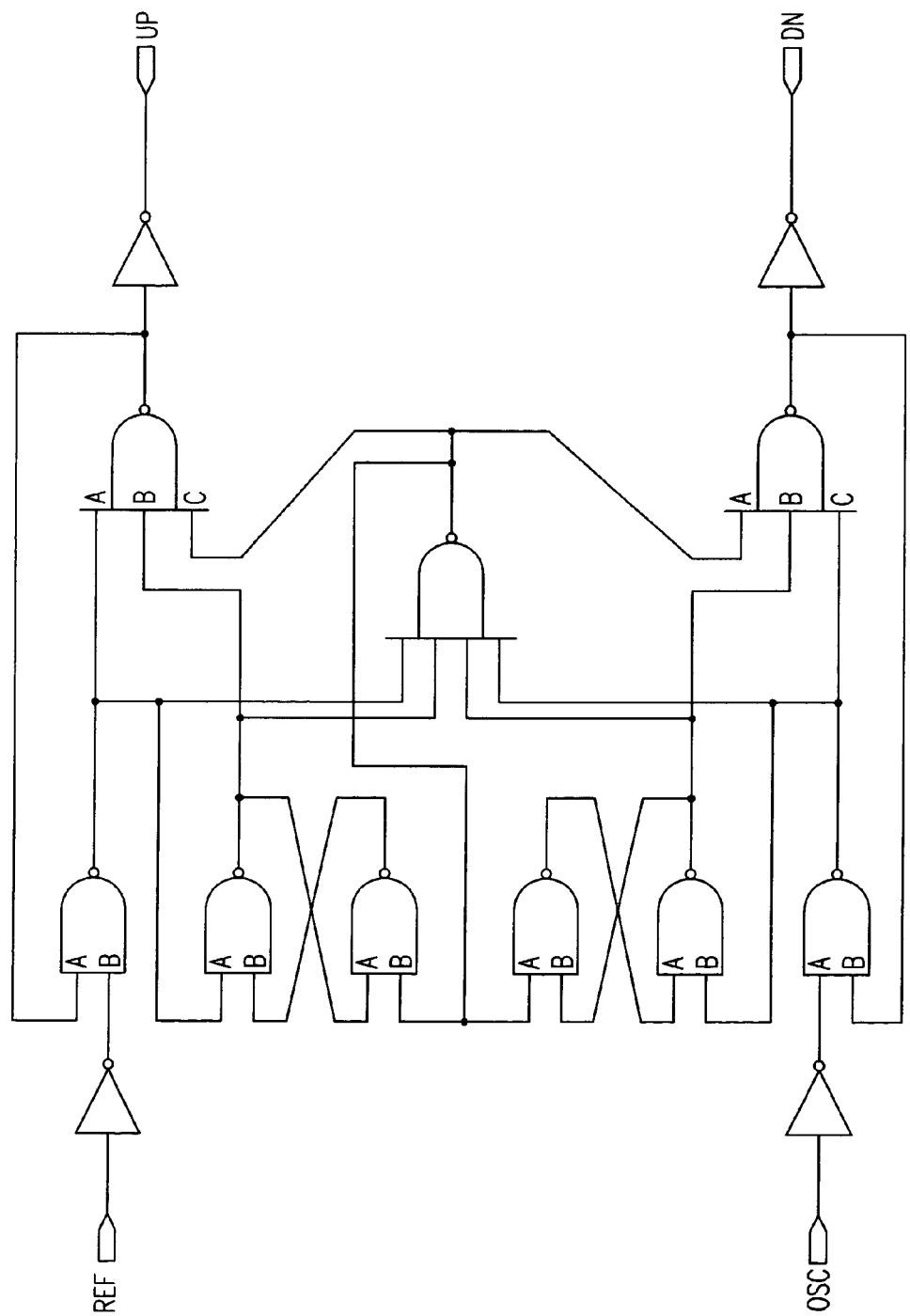
Figure 32:
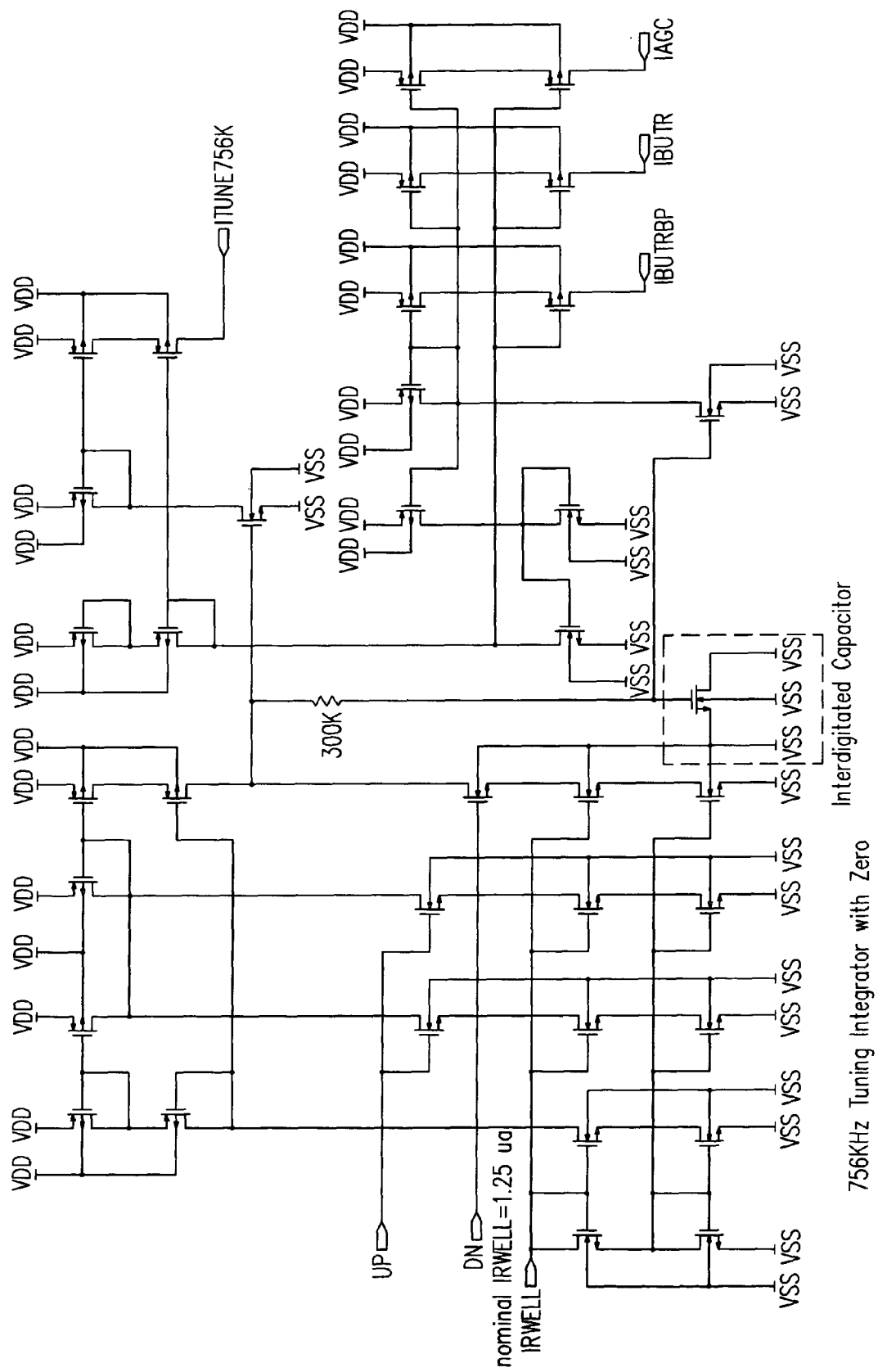
Figure 33:
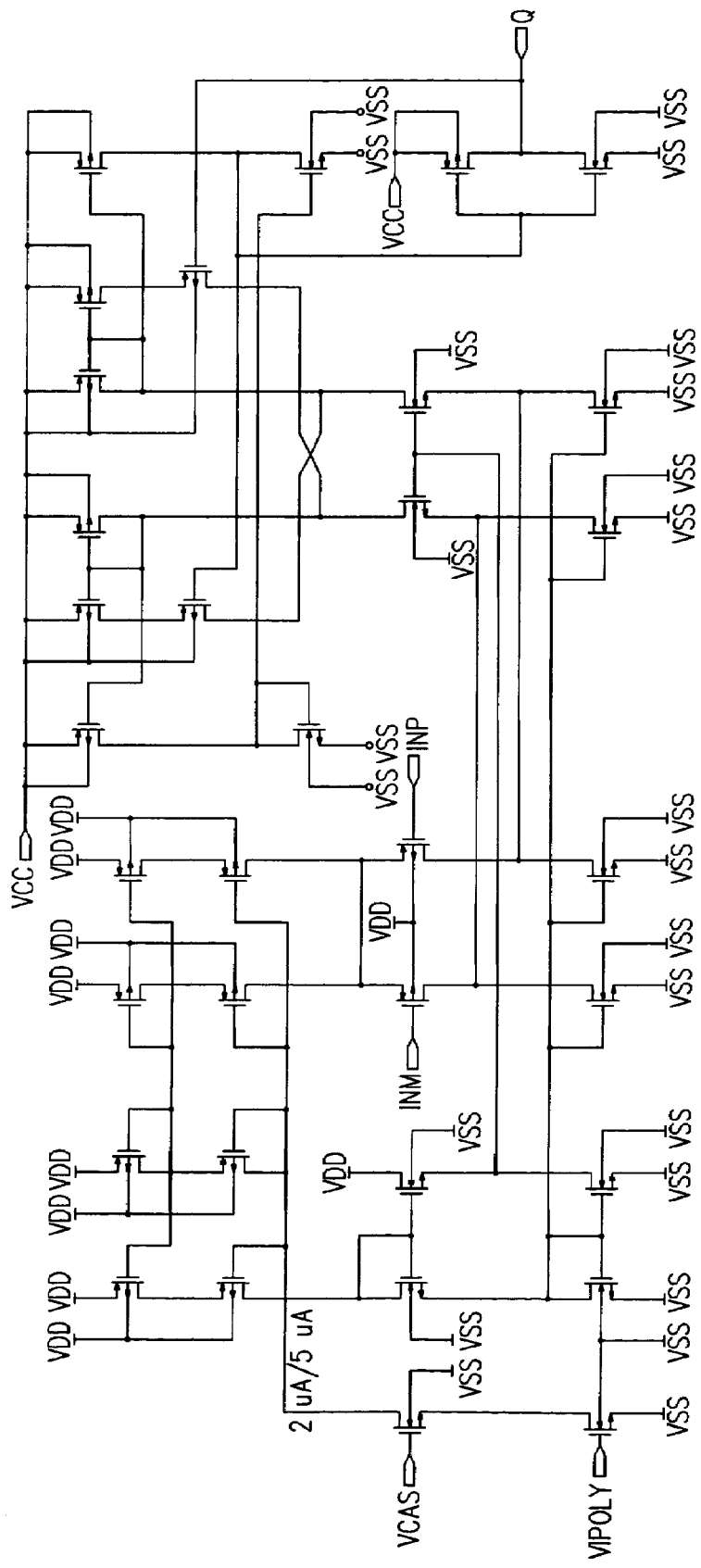
Figure 34:
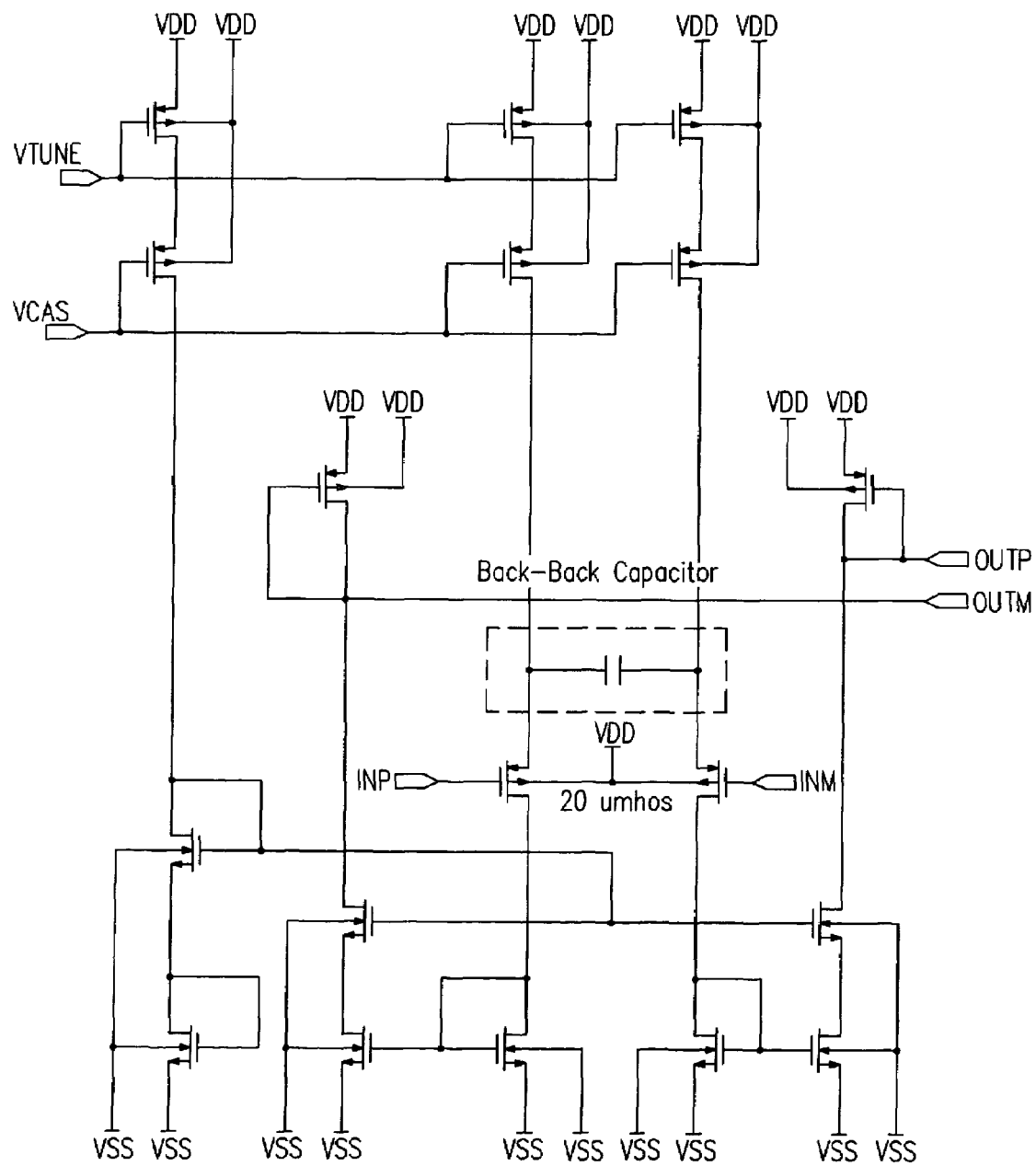
Figure 35:
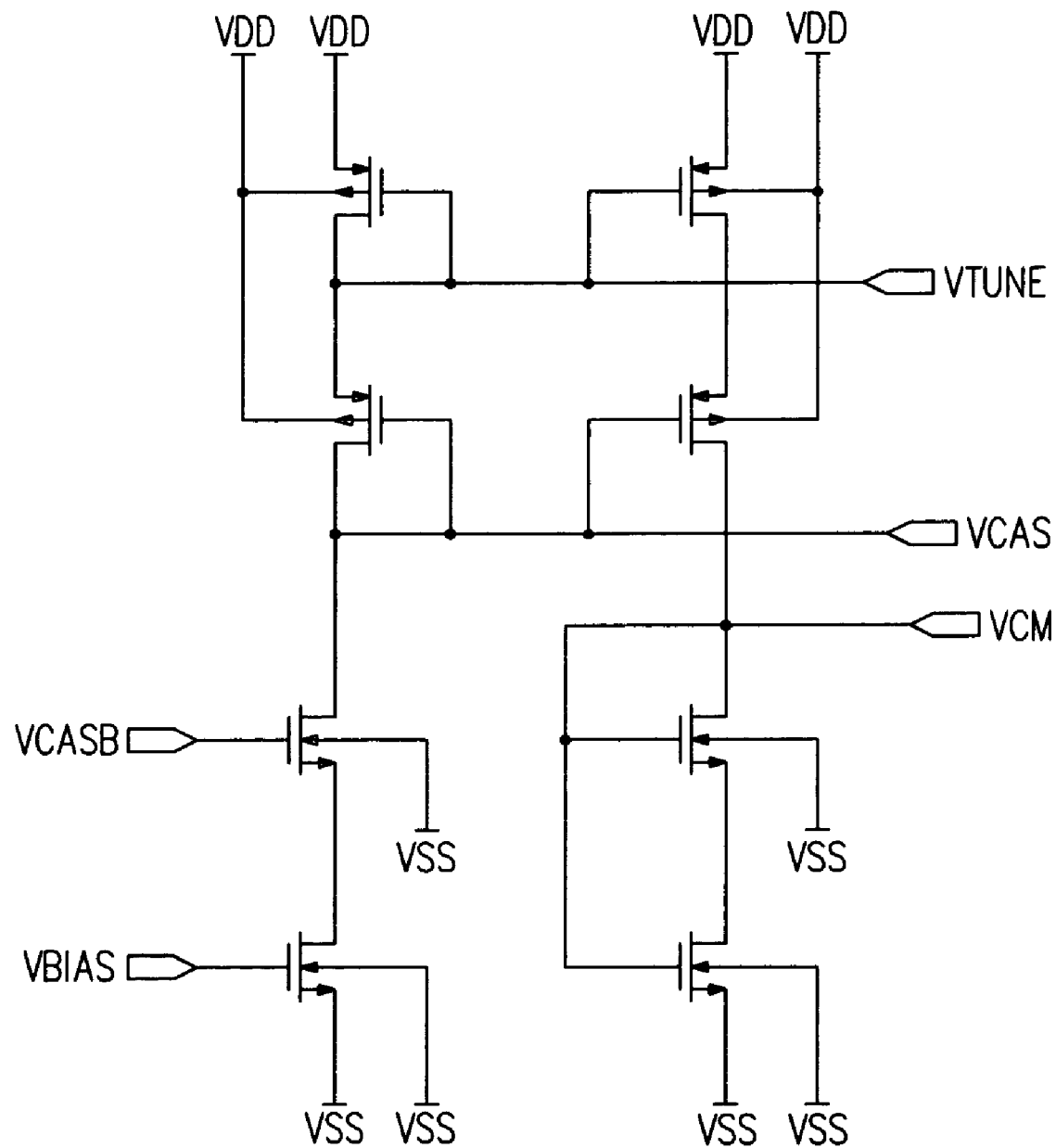
Figure 36:
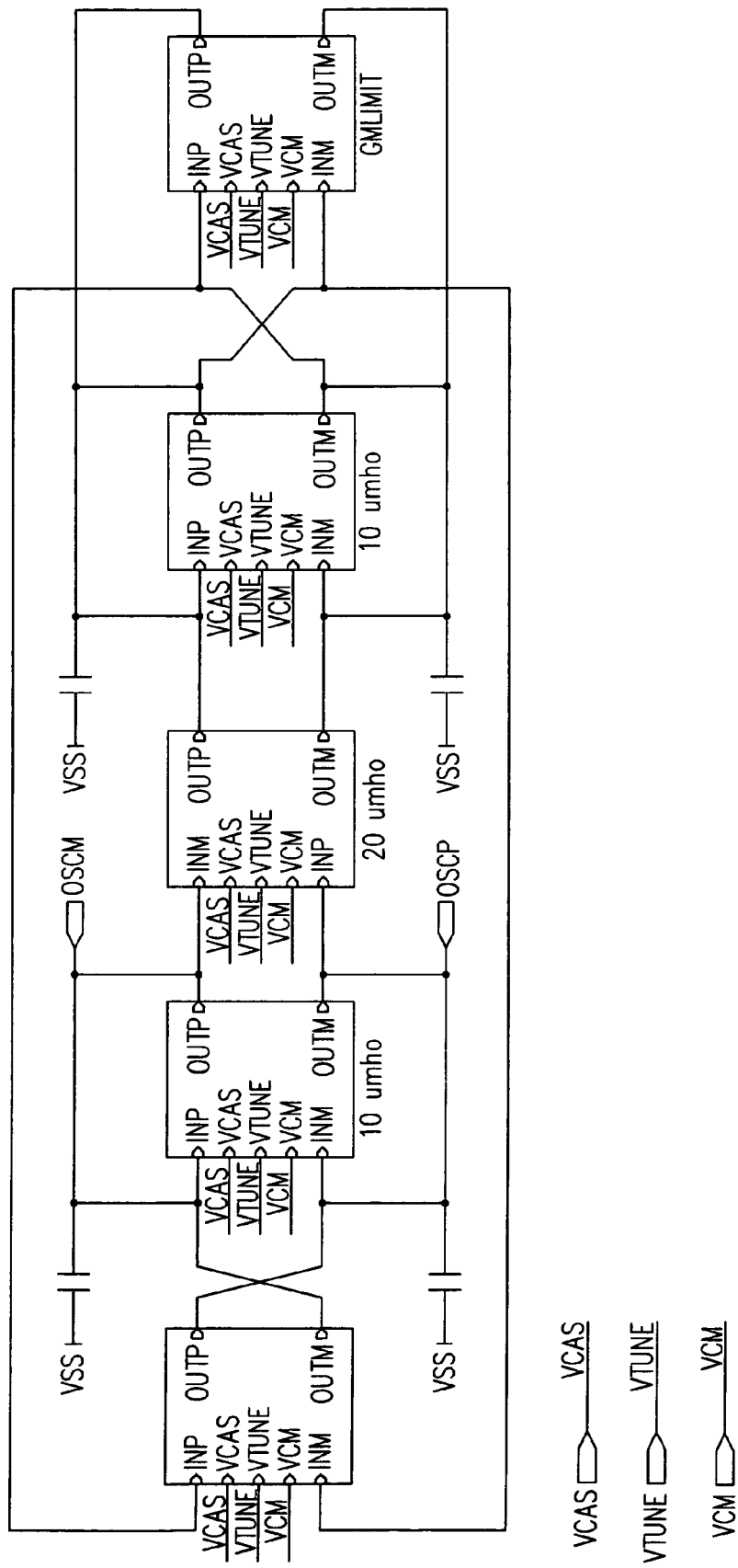
Figure 37:
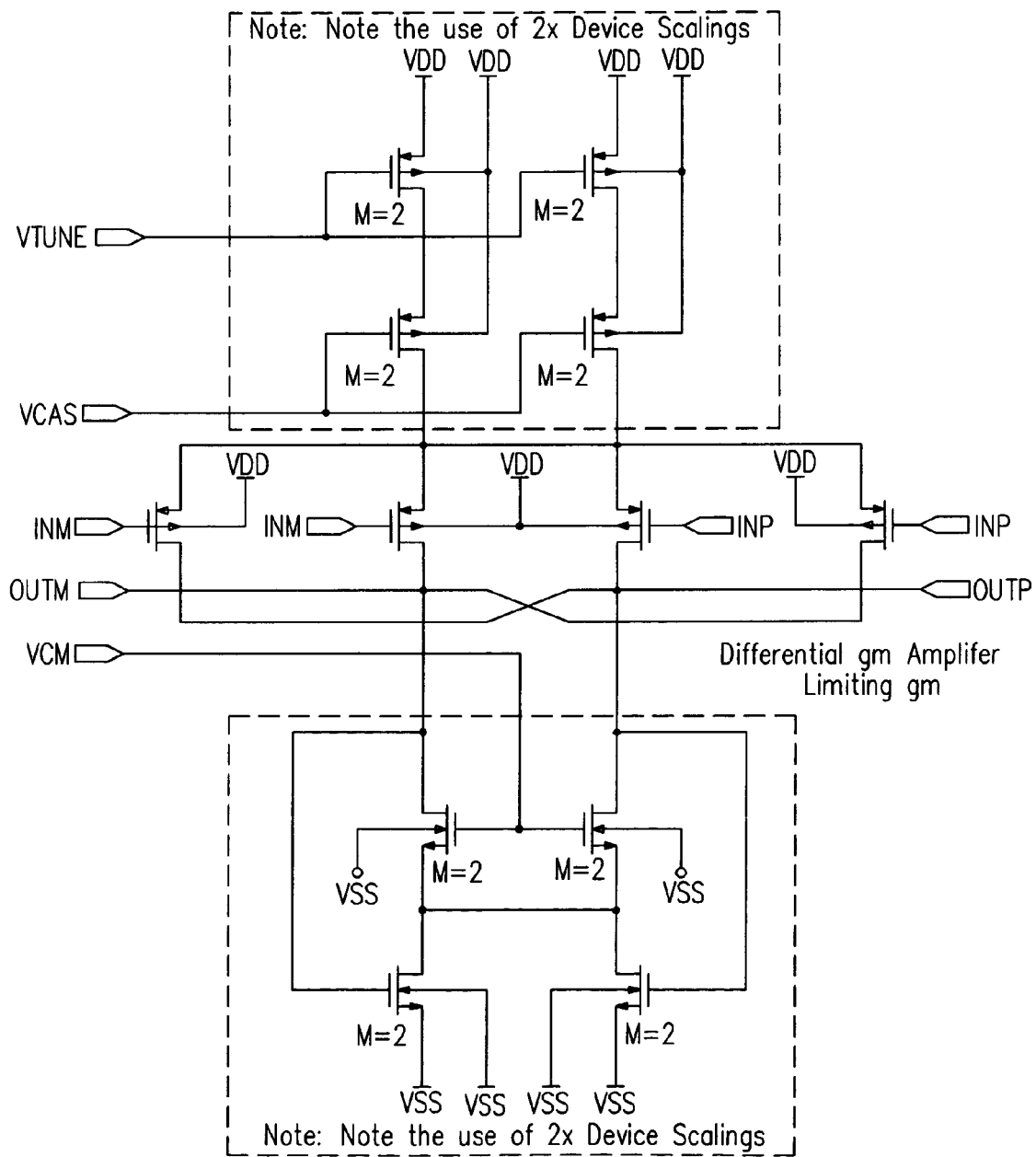
Figure 38:
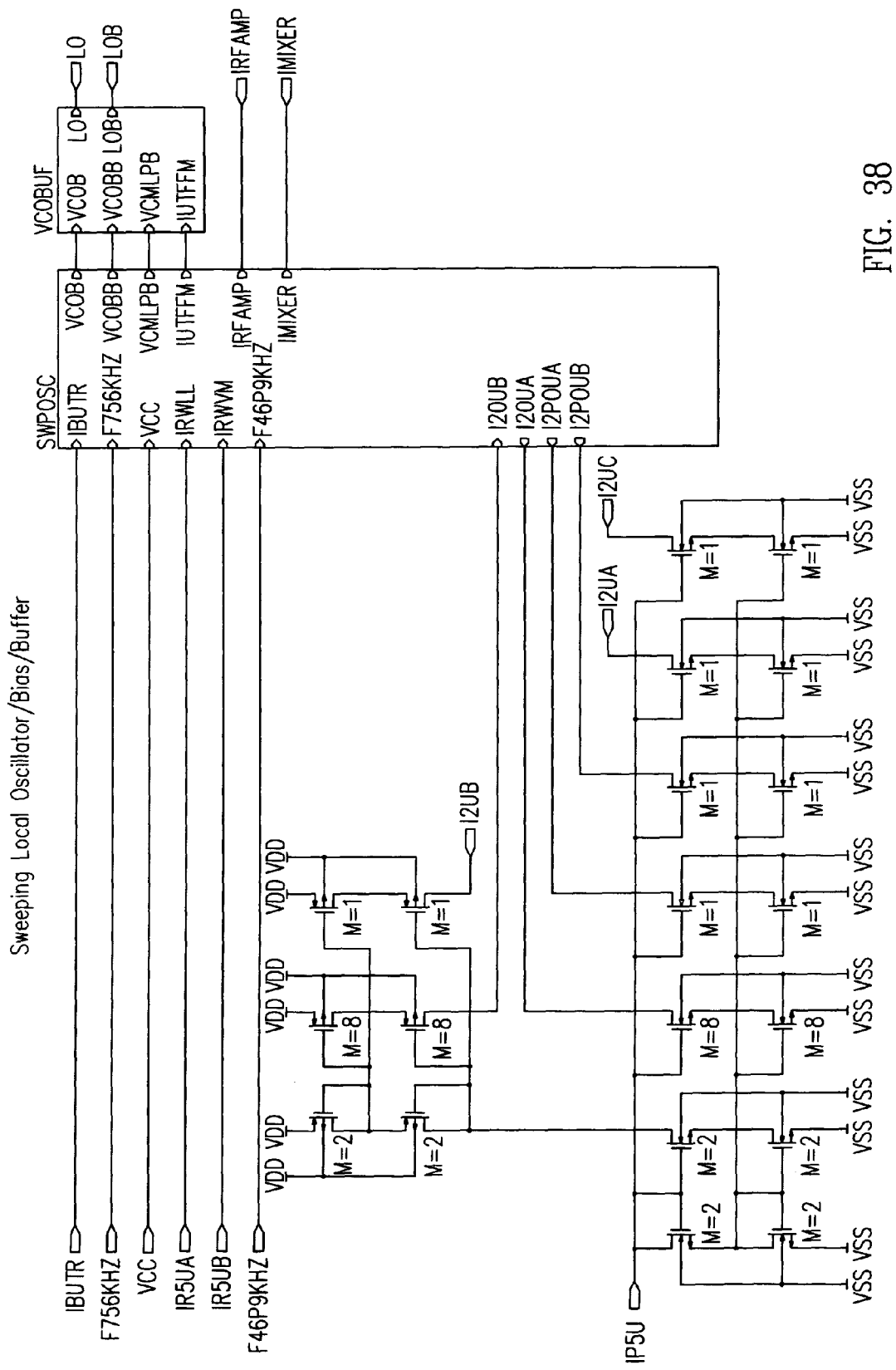
Figure 39:
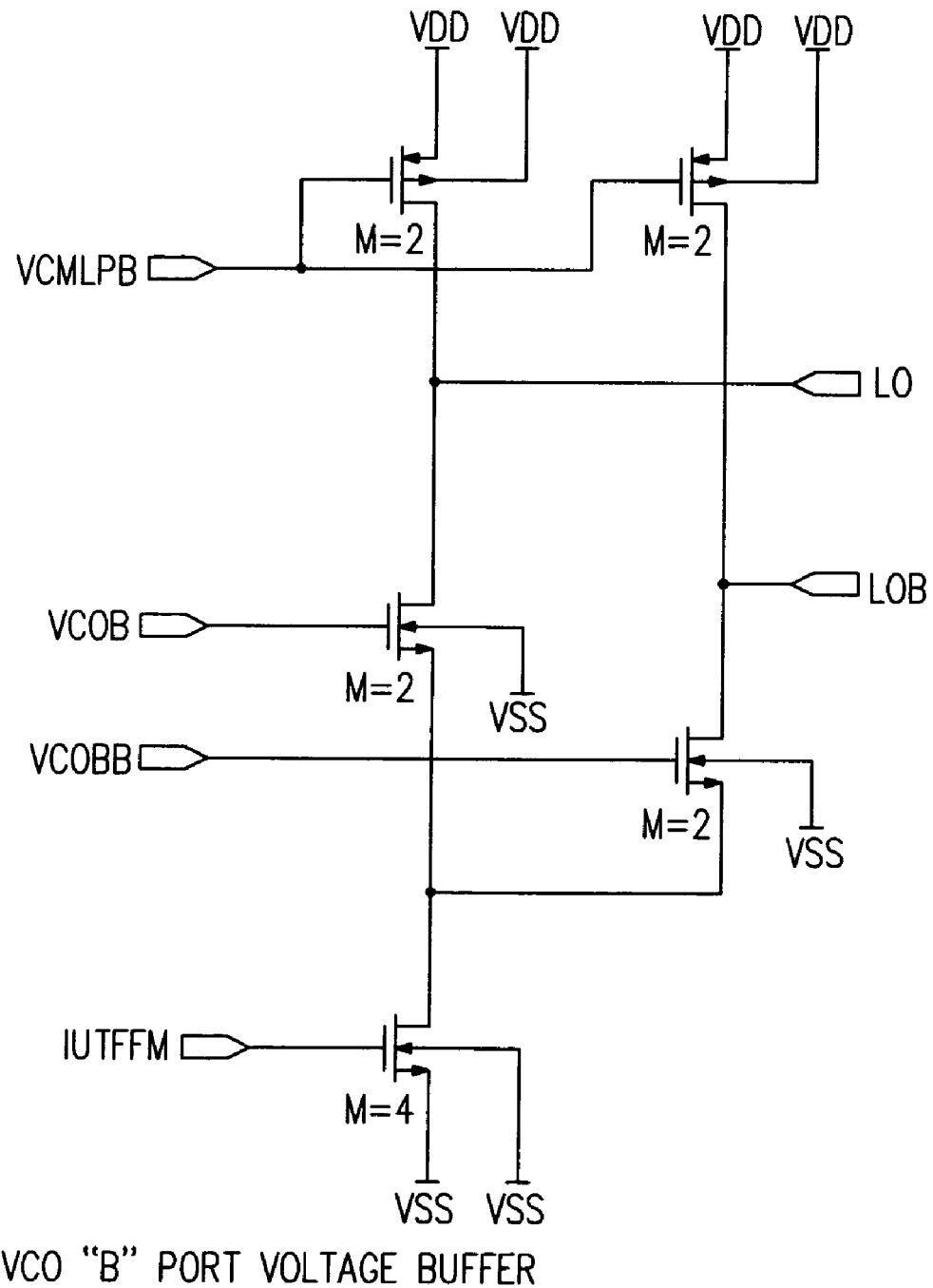
Figure 40:
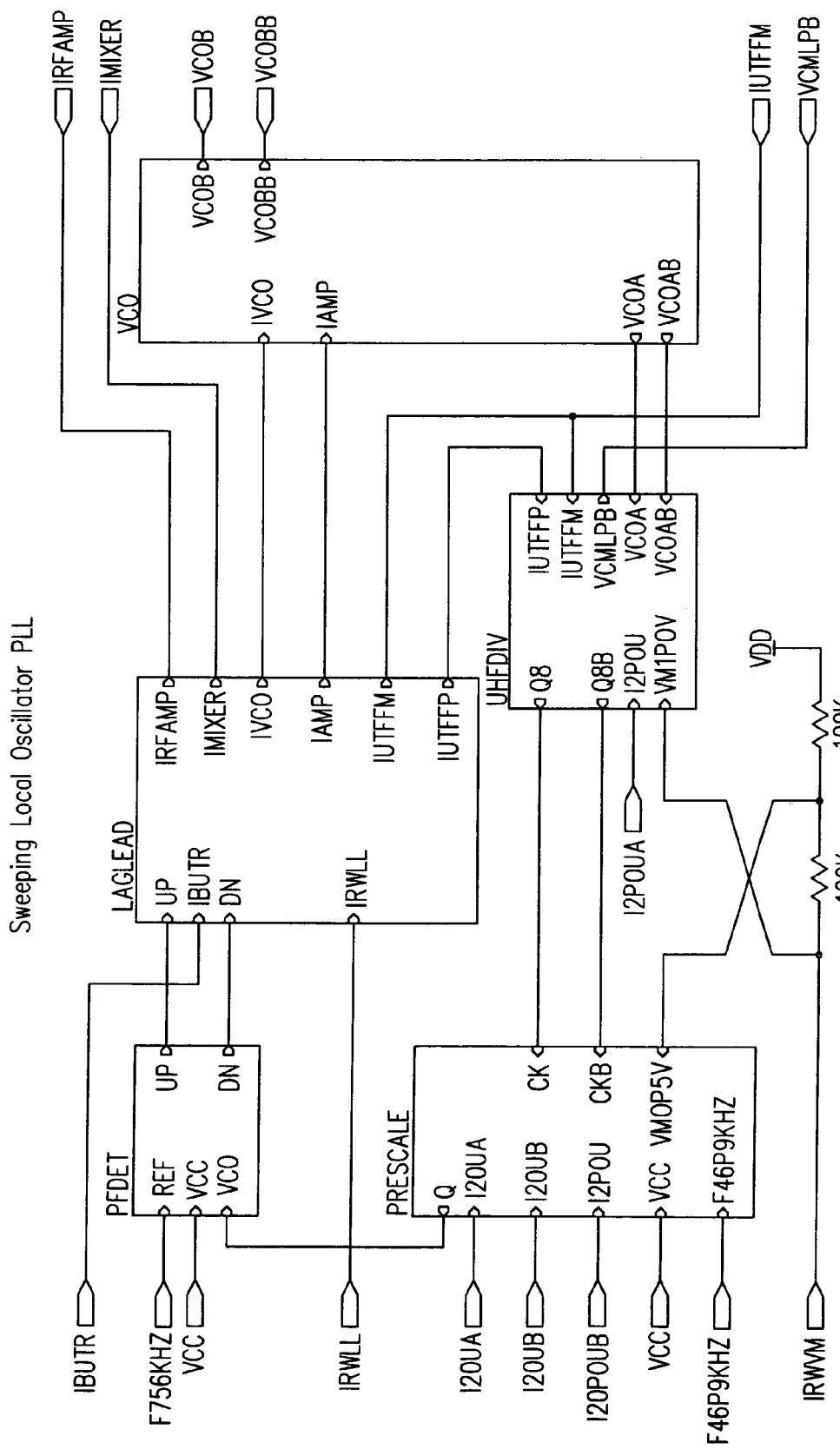
Figure 41A:
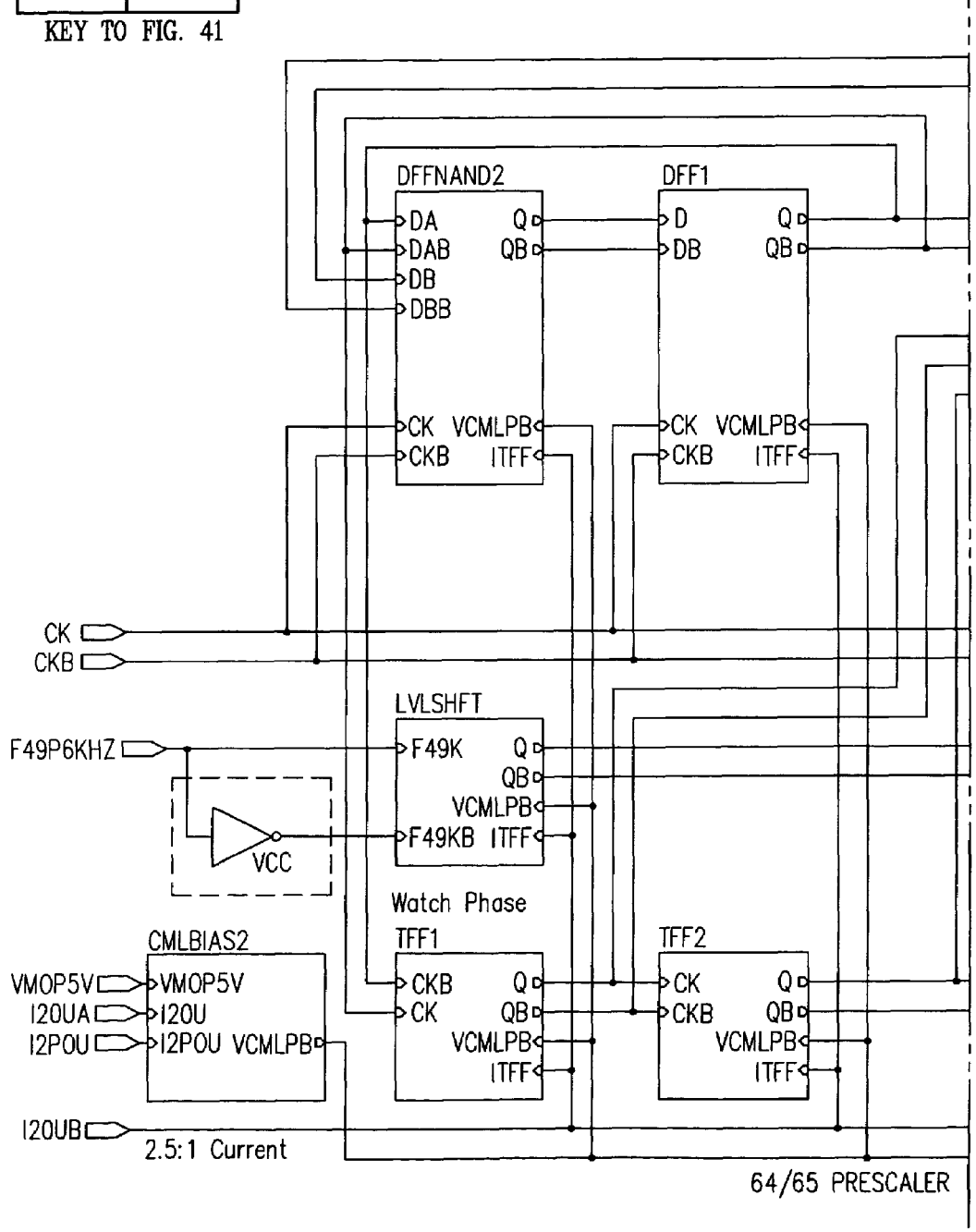
Figure 41B:
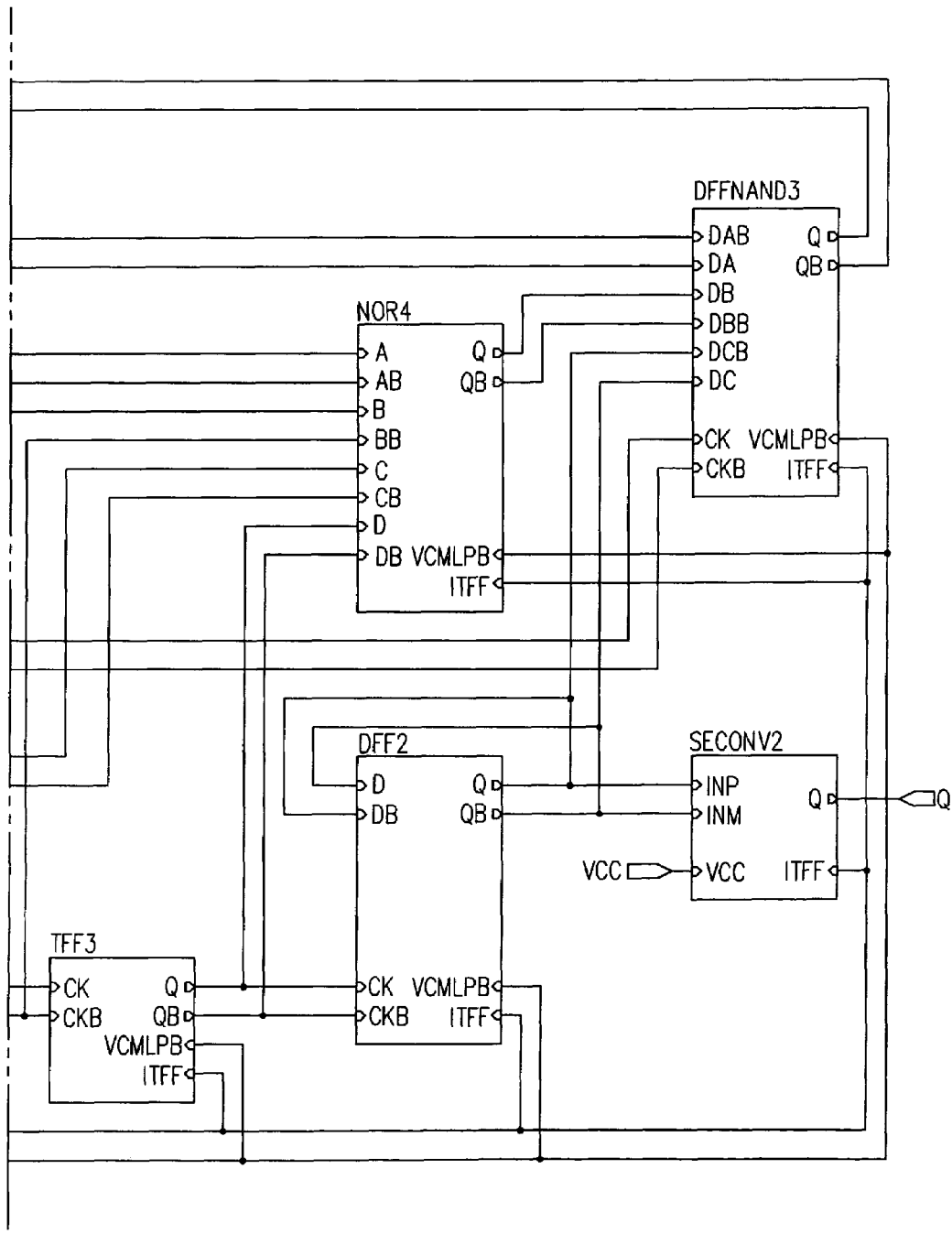
Figure 42:
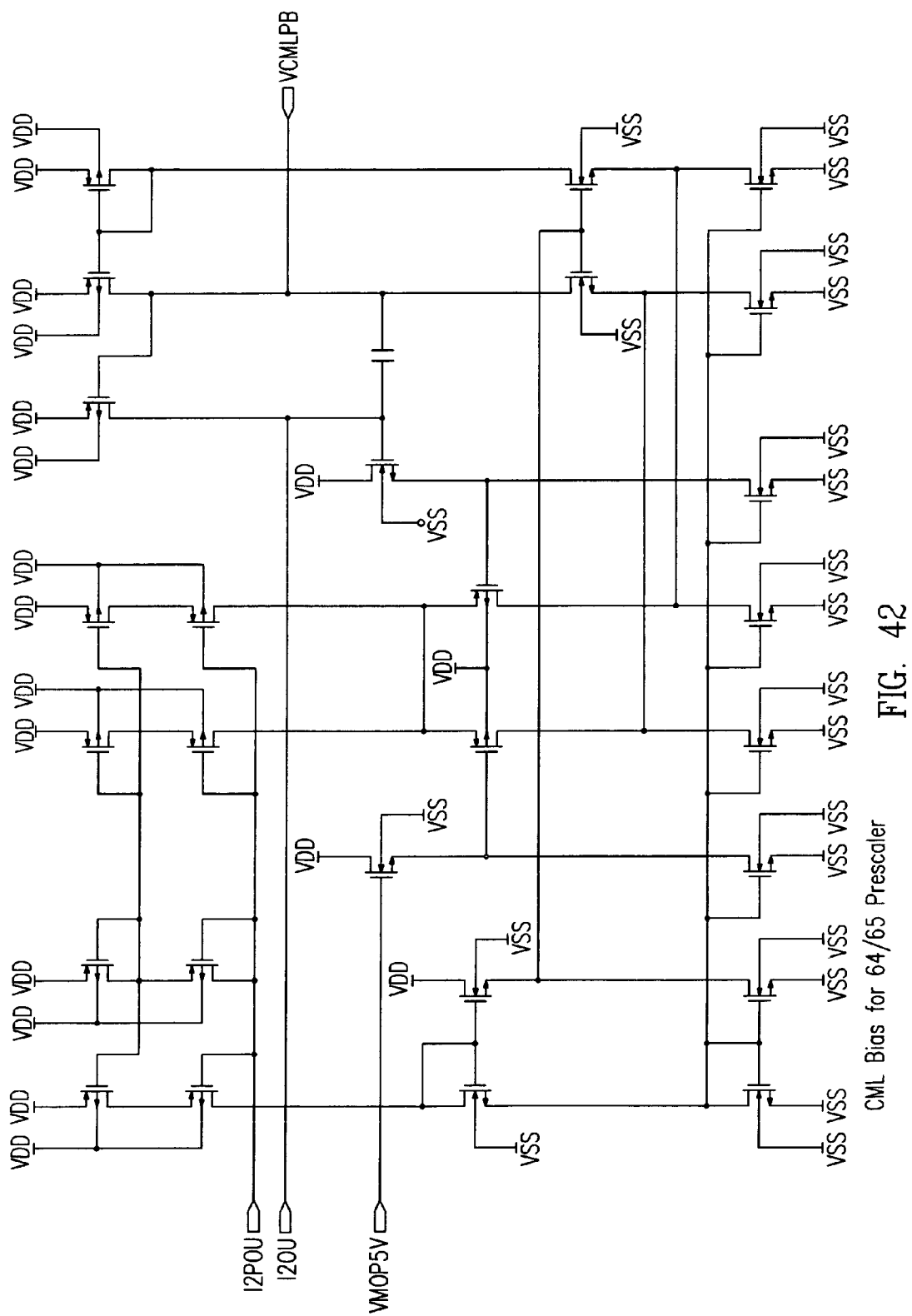
Figure 43:
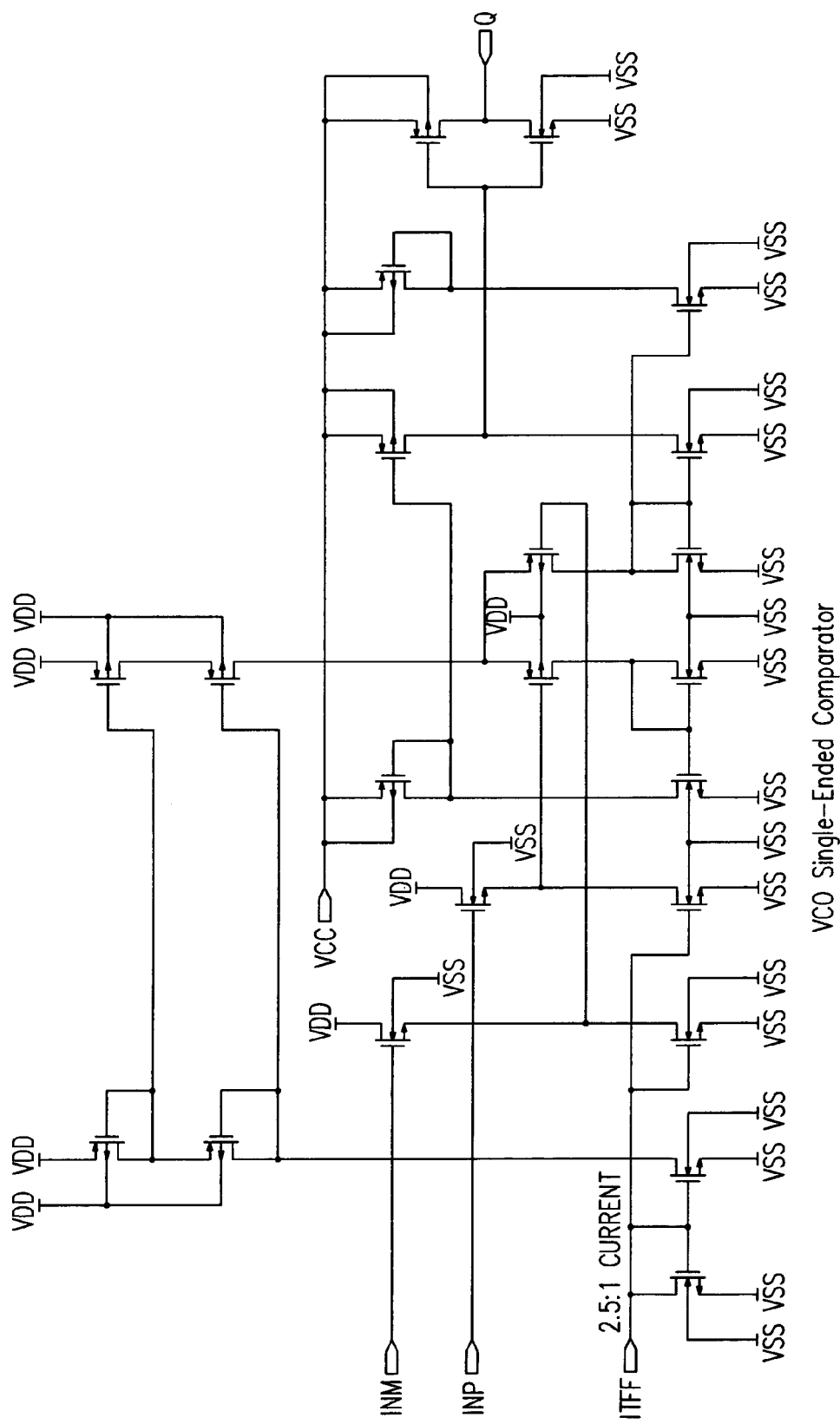
Figure 44:
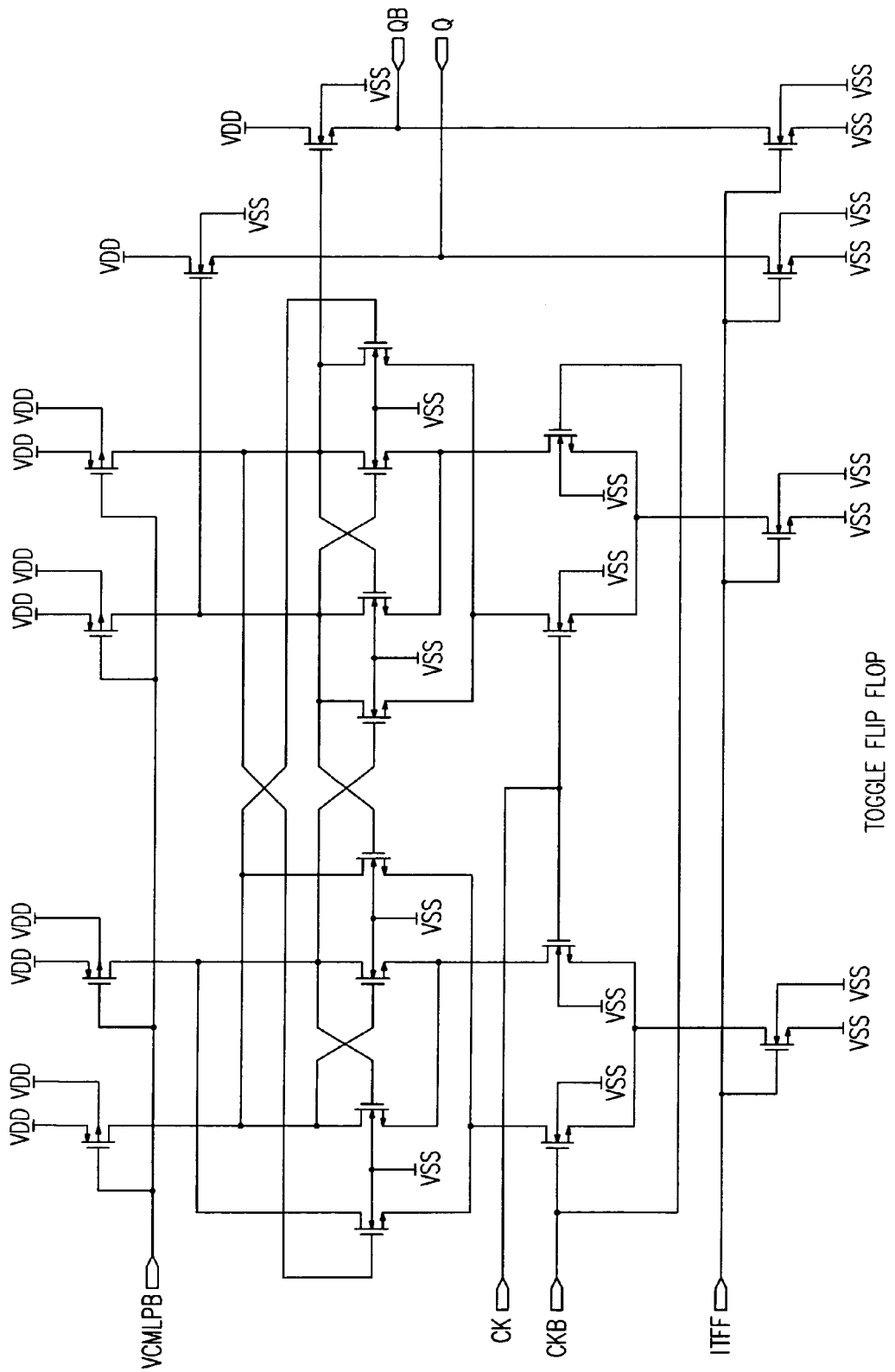
Figure 45:
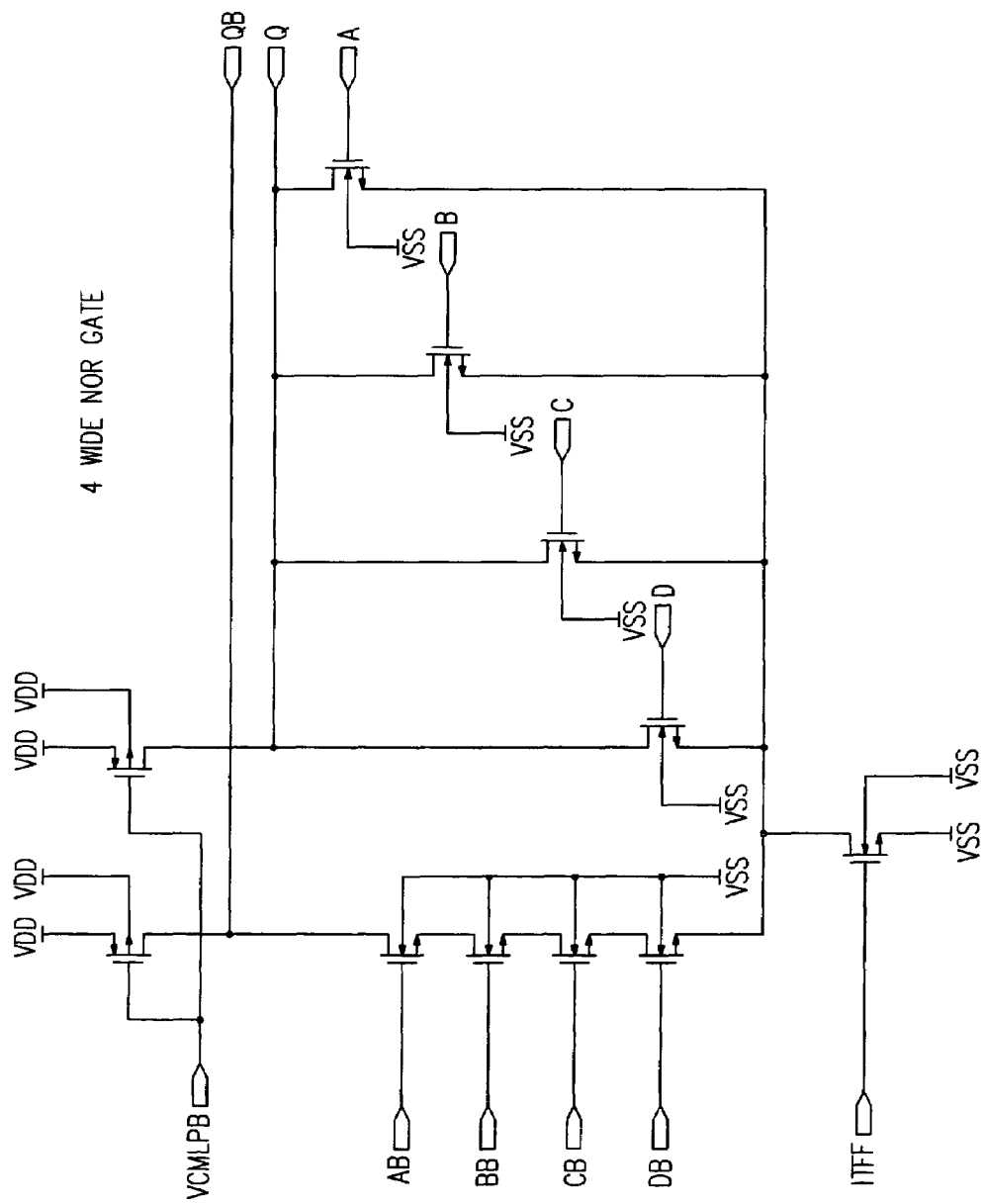
Figure 46:
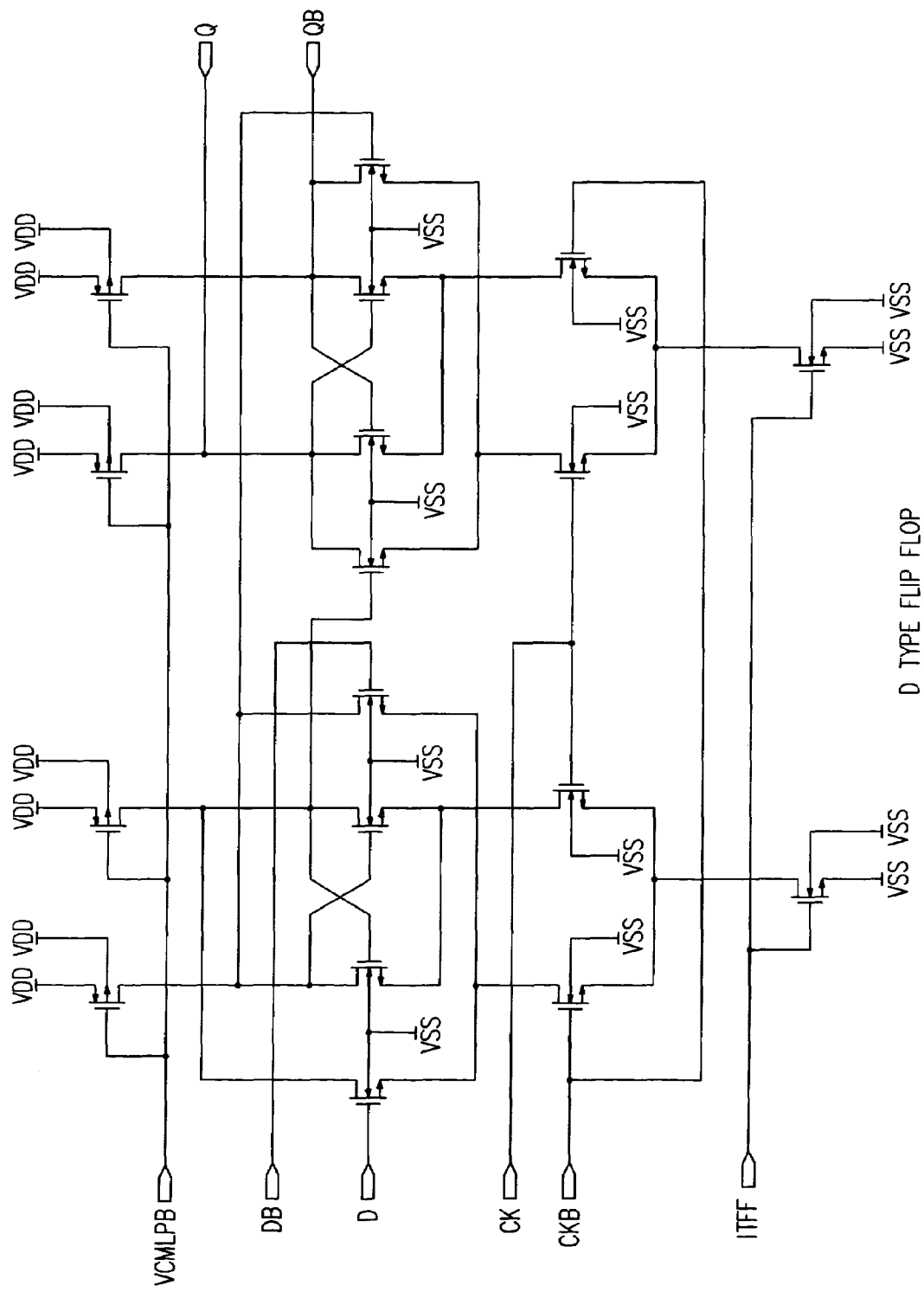
Figure 47:
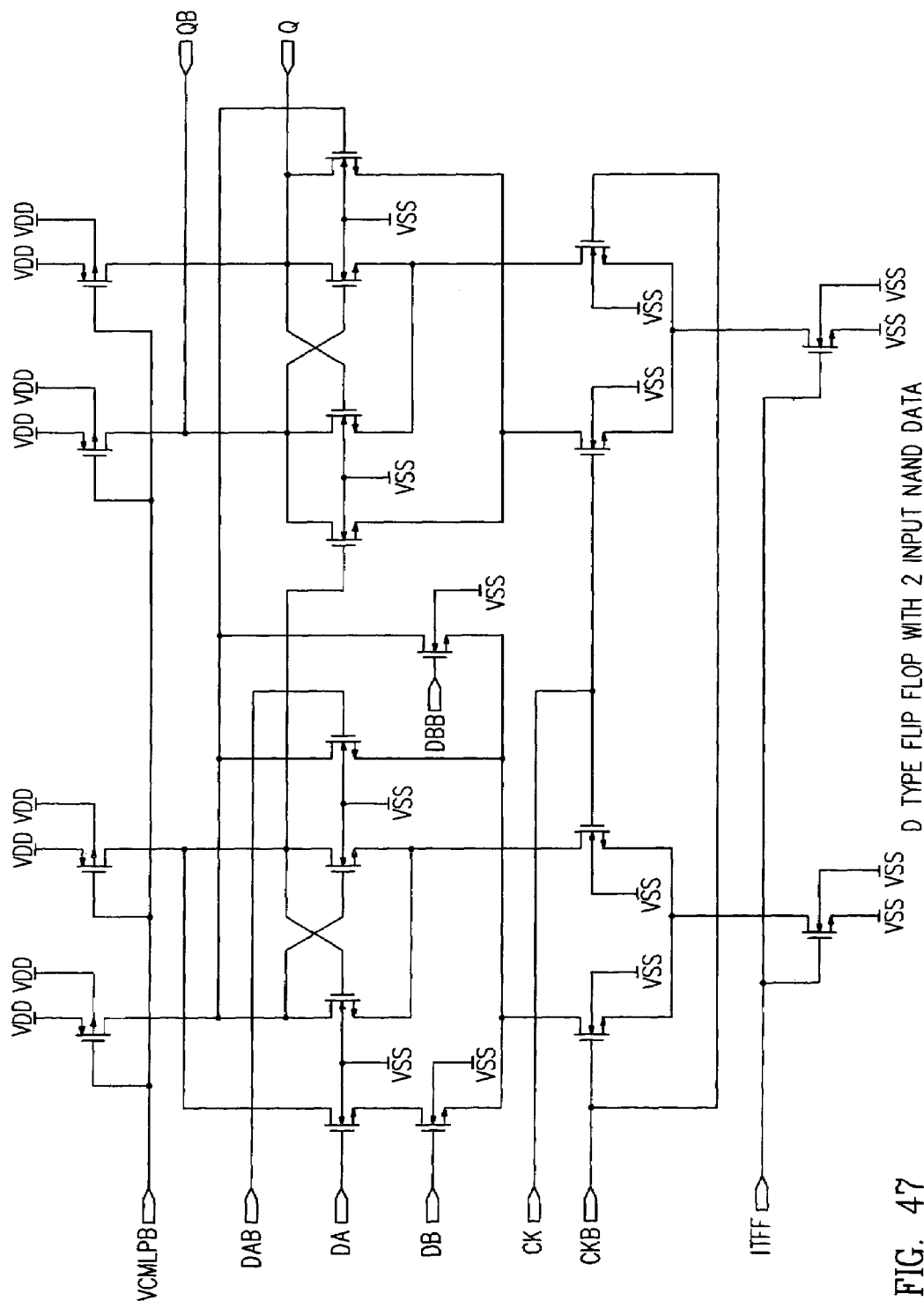
Figure 48:
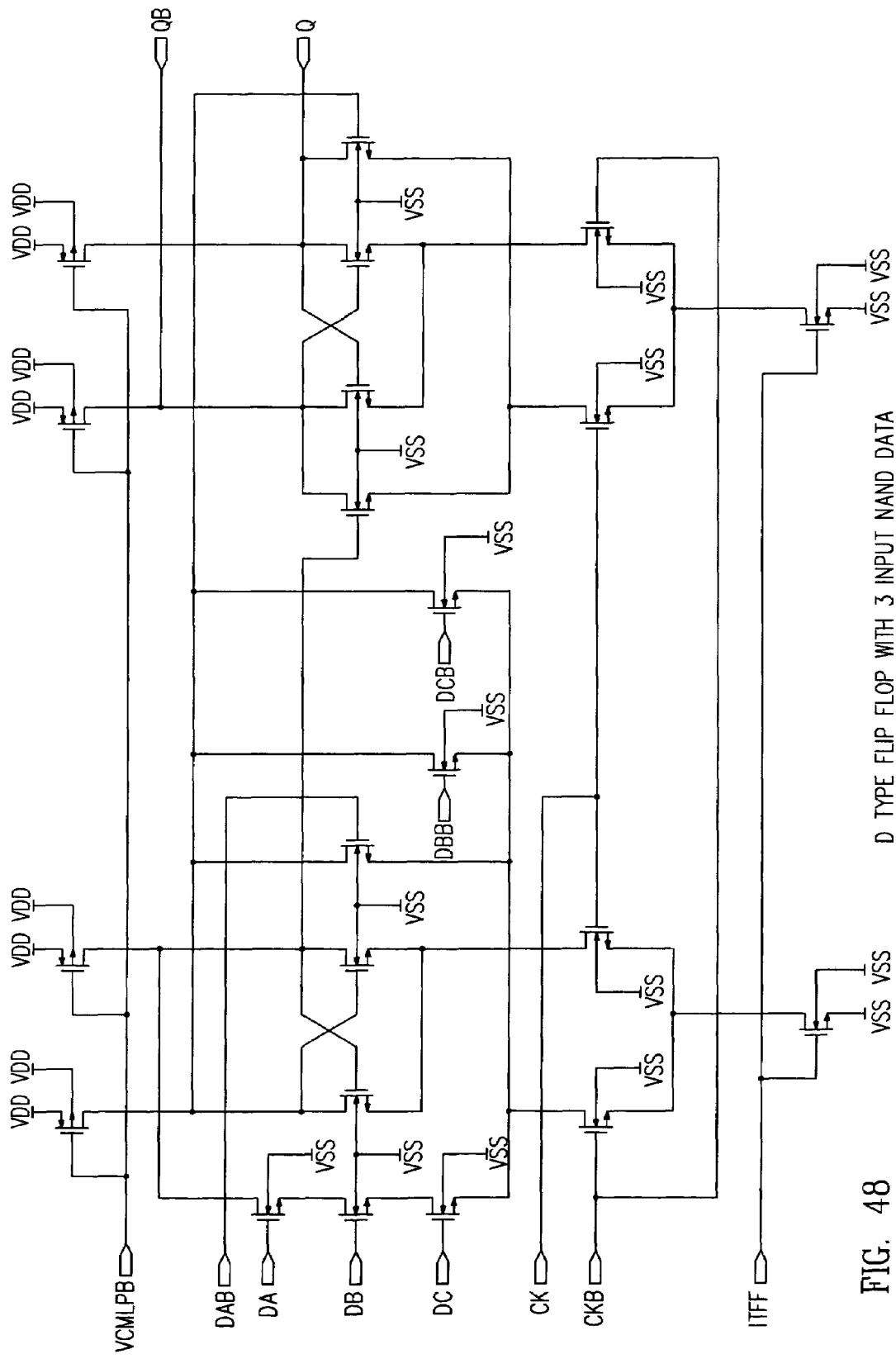
Figure 49:
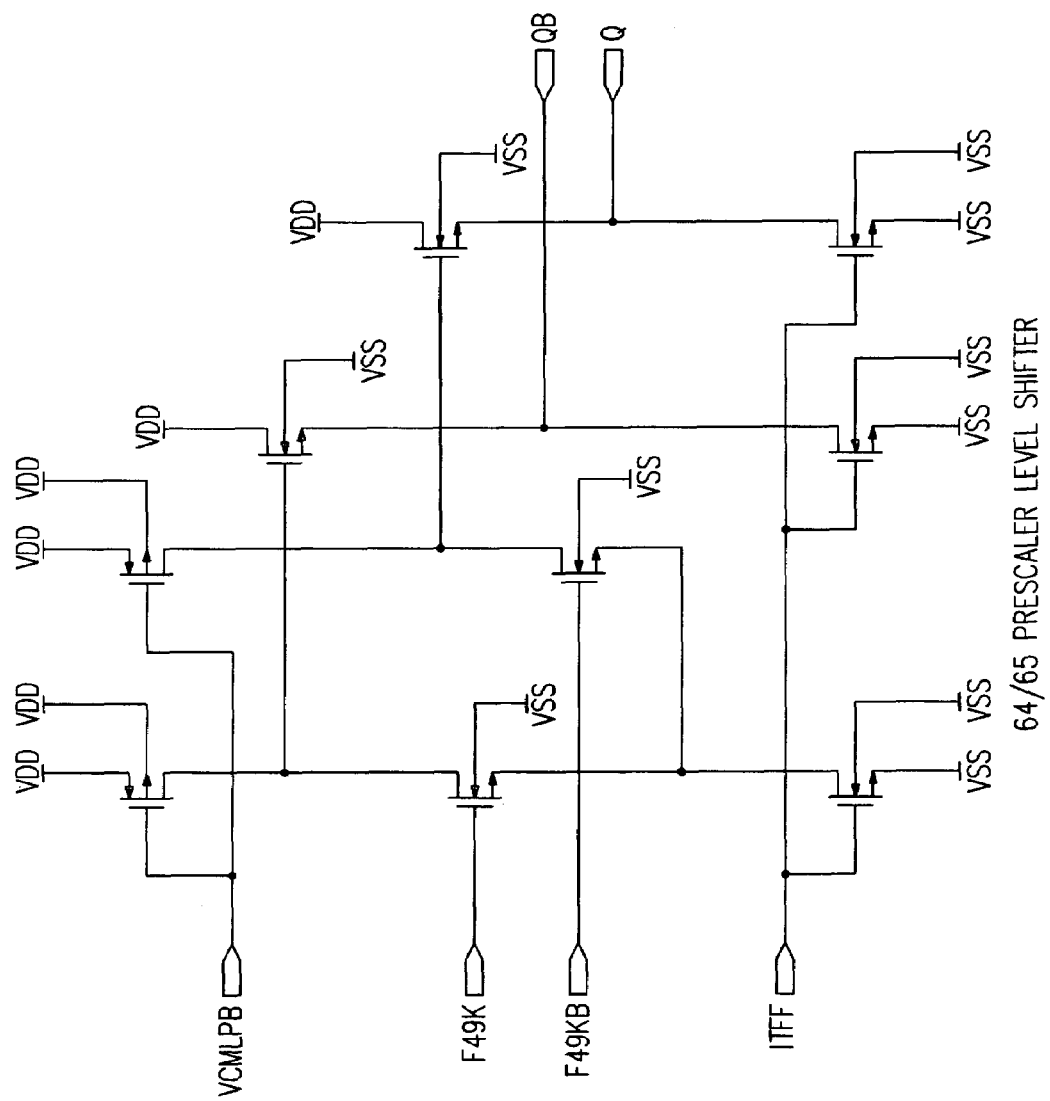
Figure 50:
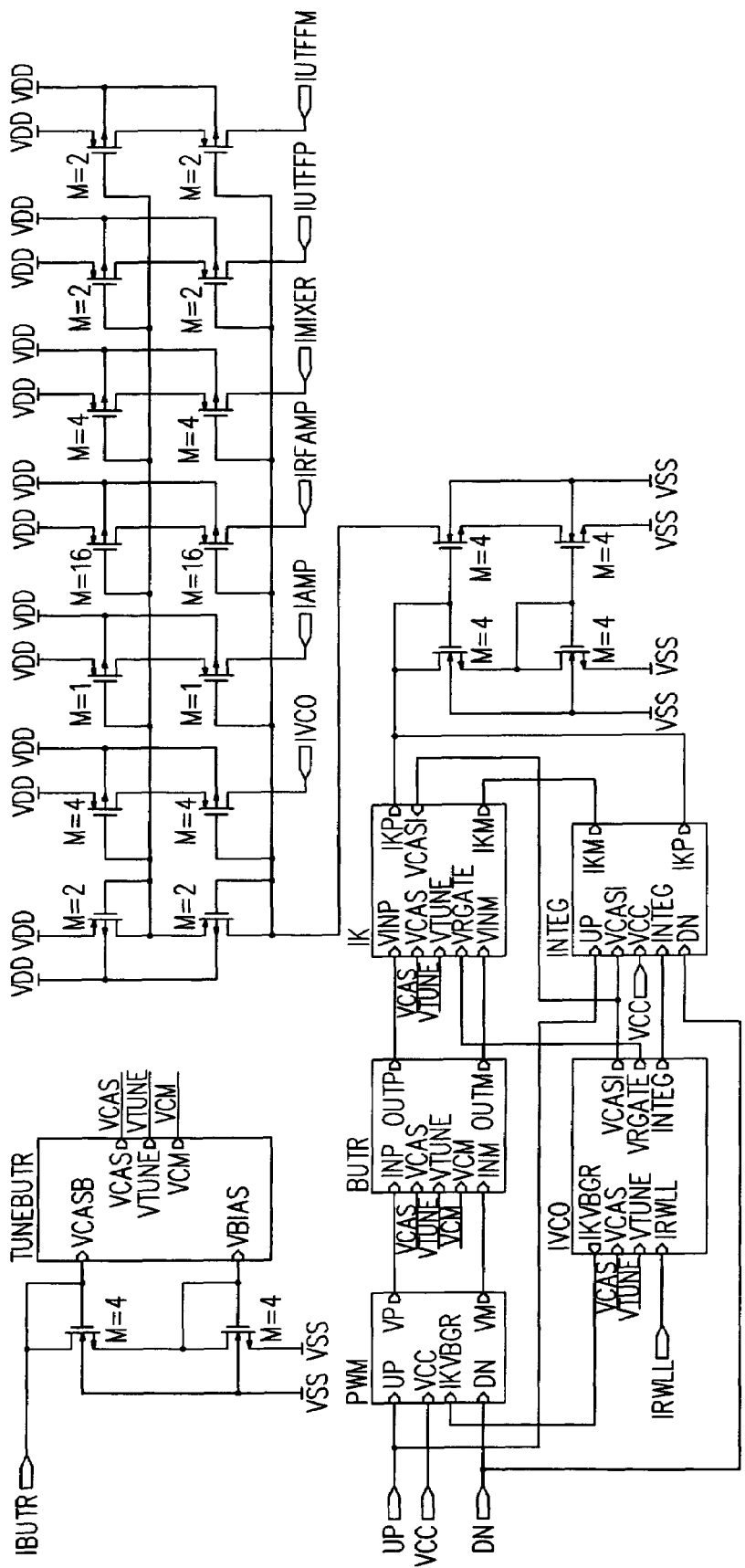
Figure 51:
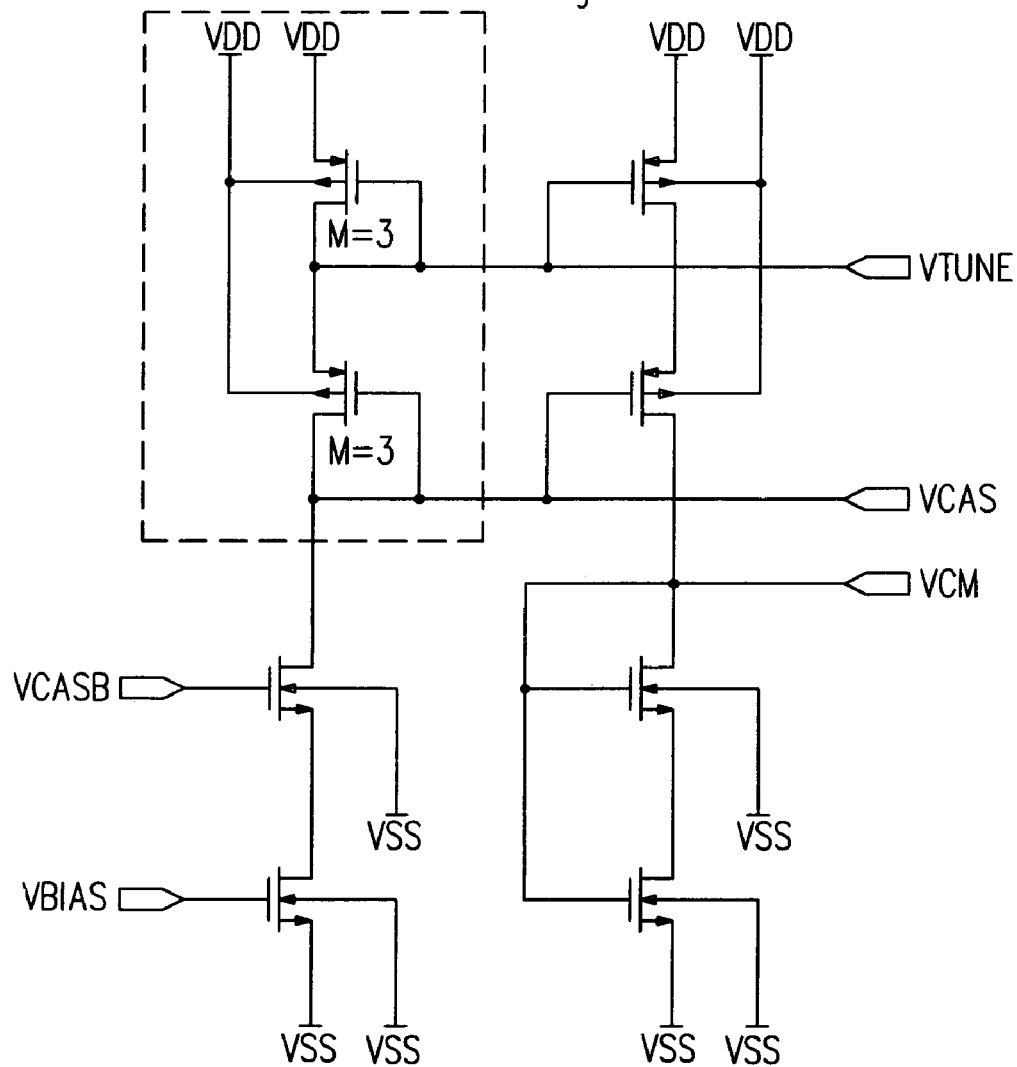
Figure 52:
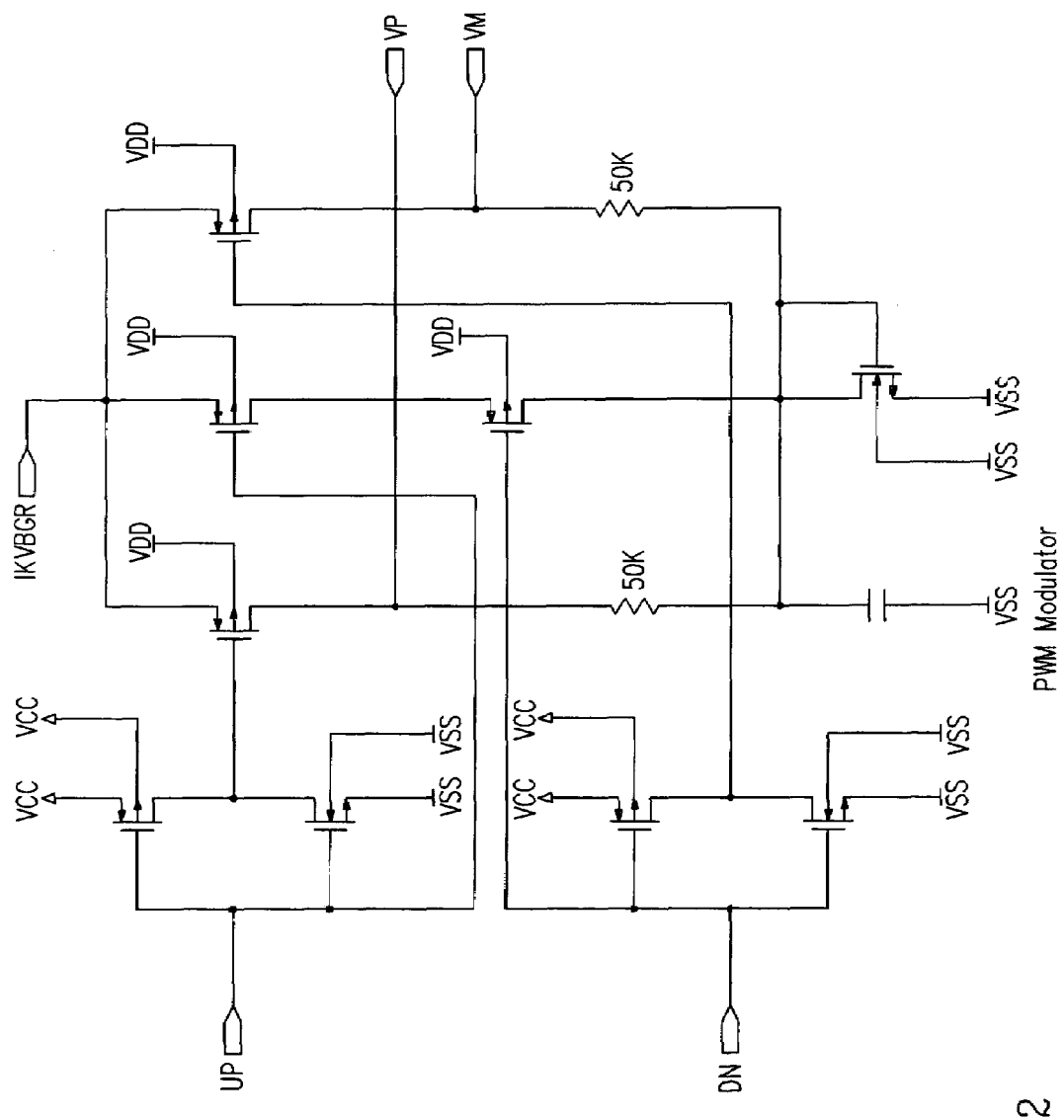
Figure 53:
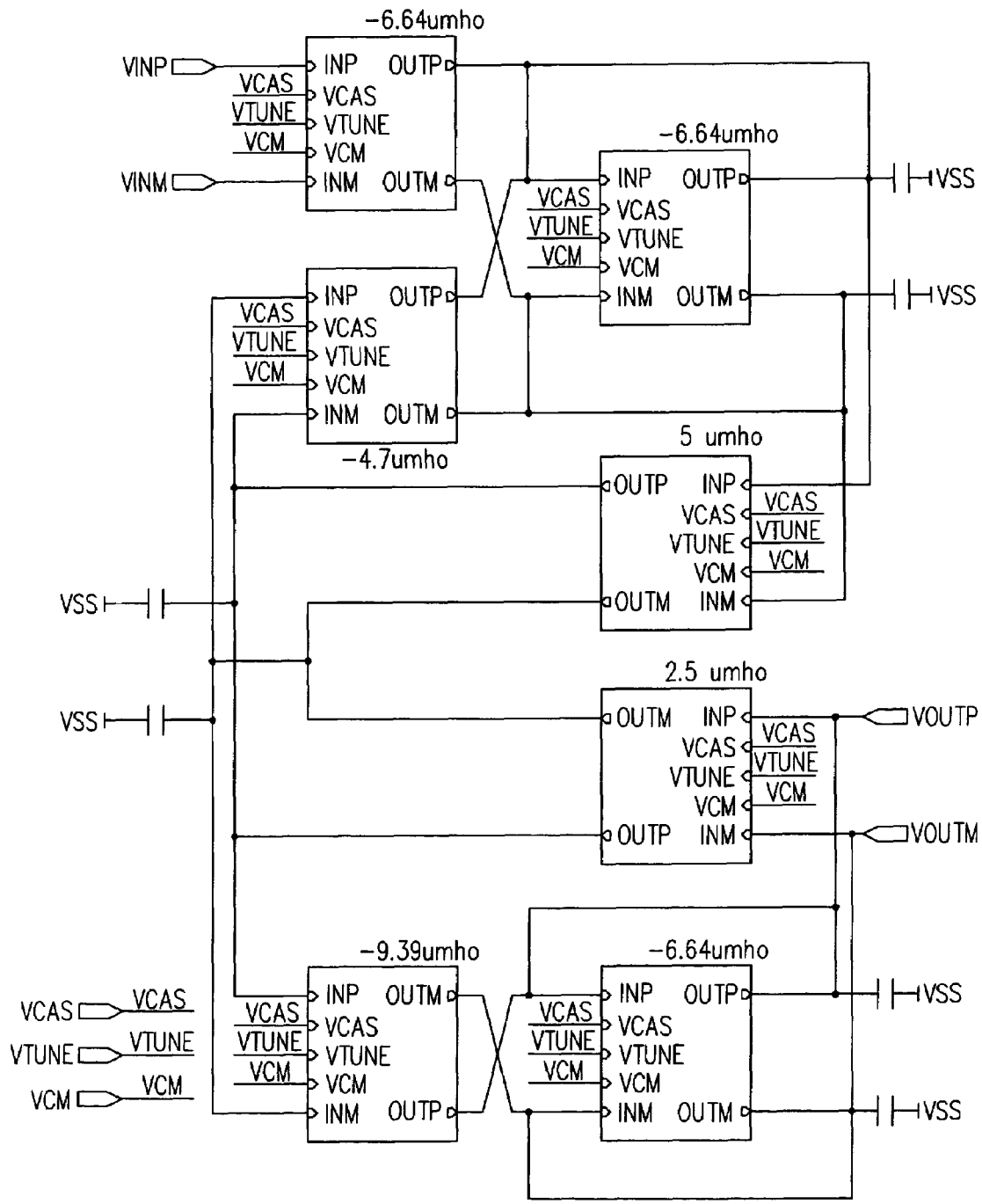
Figure 54:
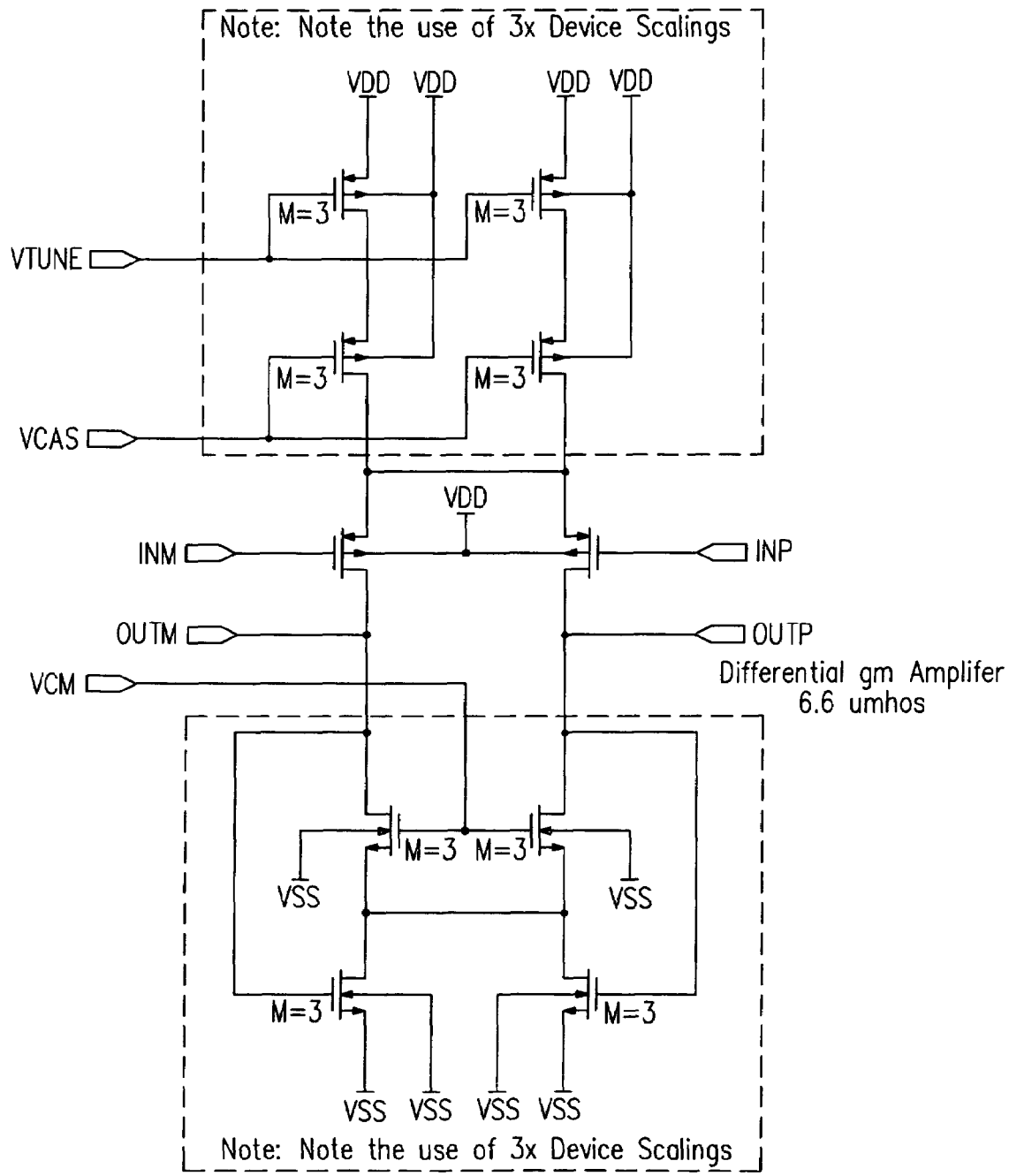
Figure 55:
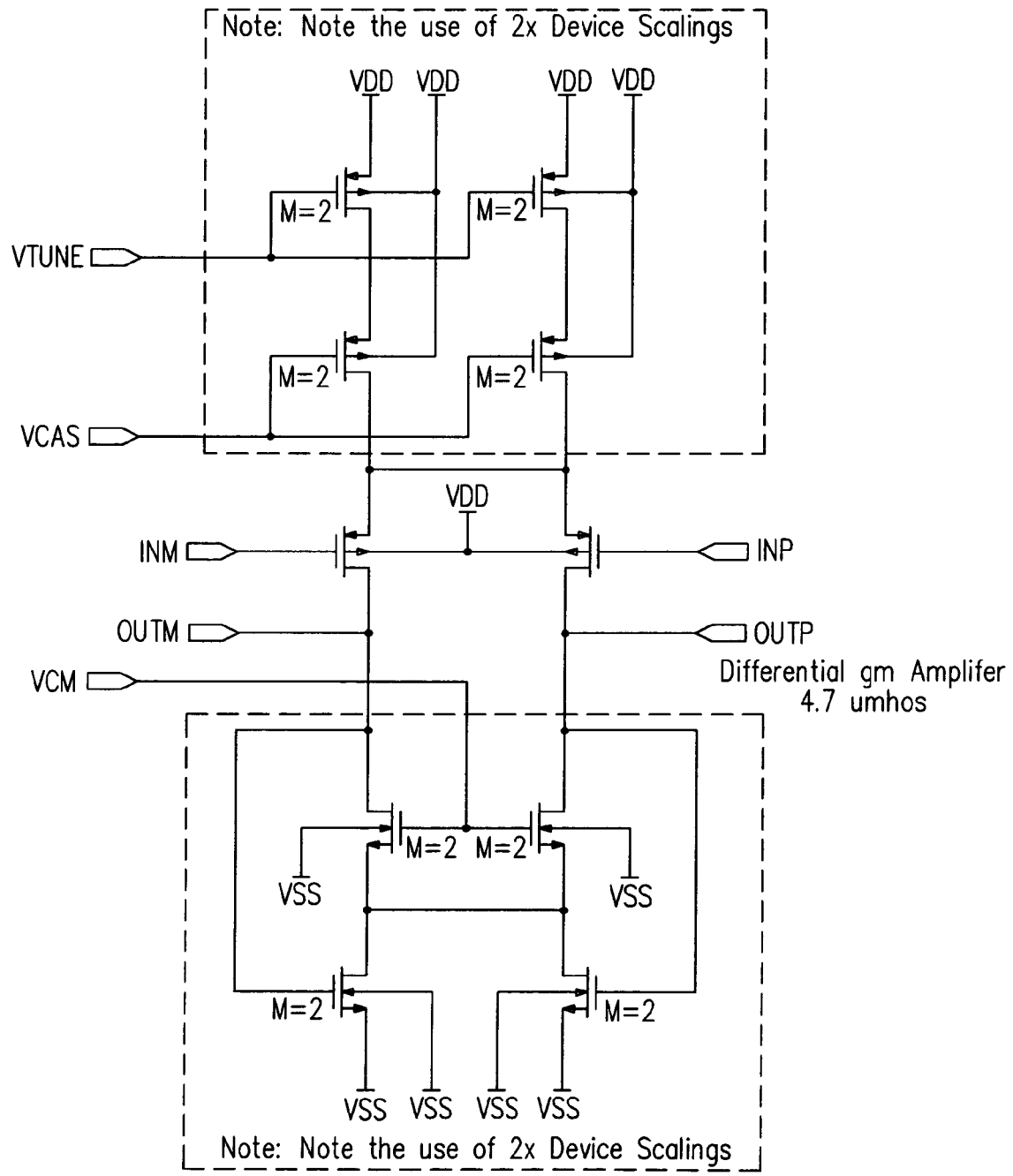
Figure 56:
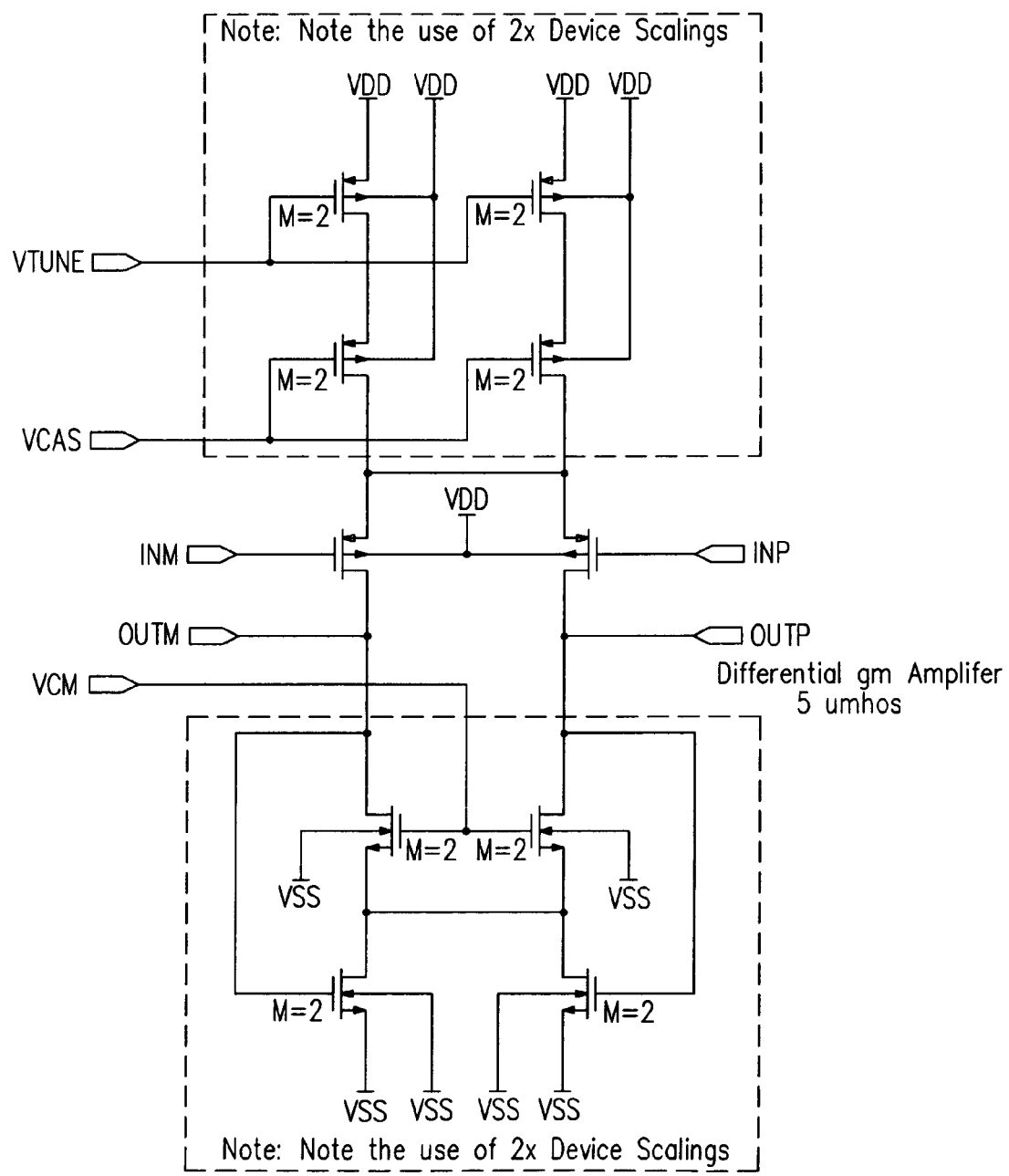
Figure 57:
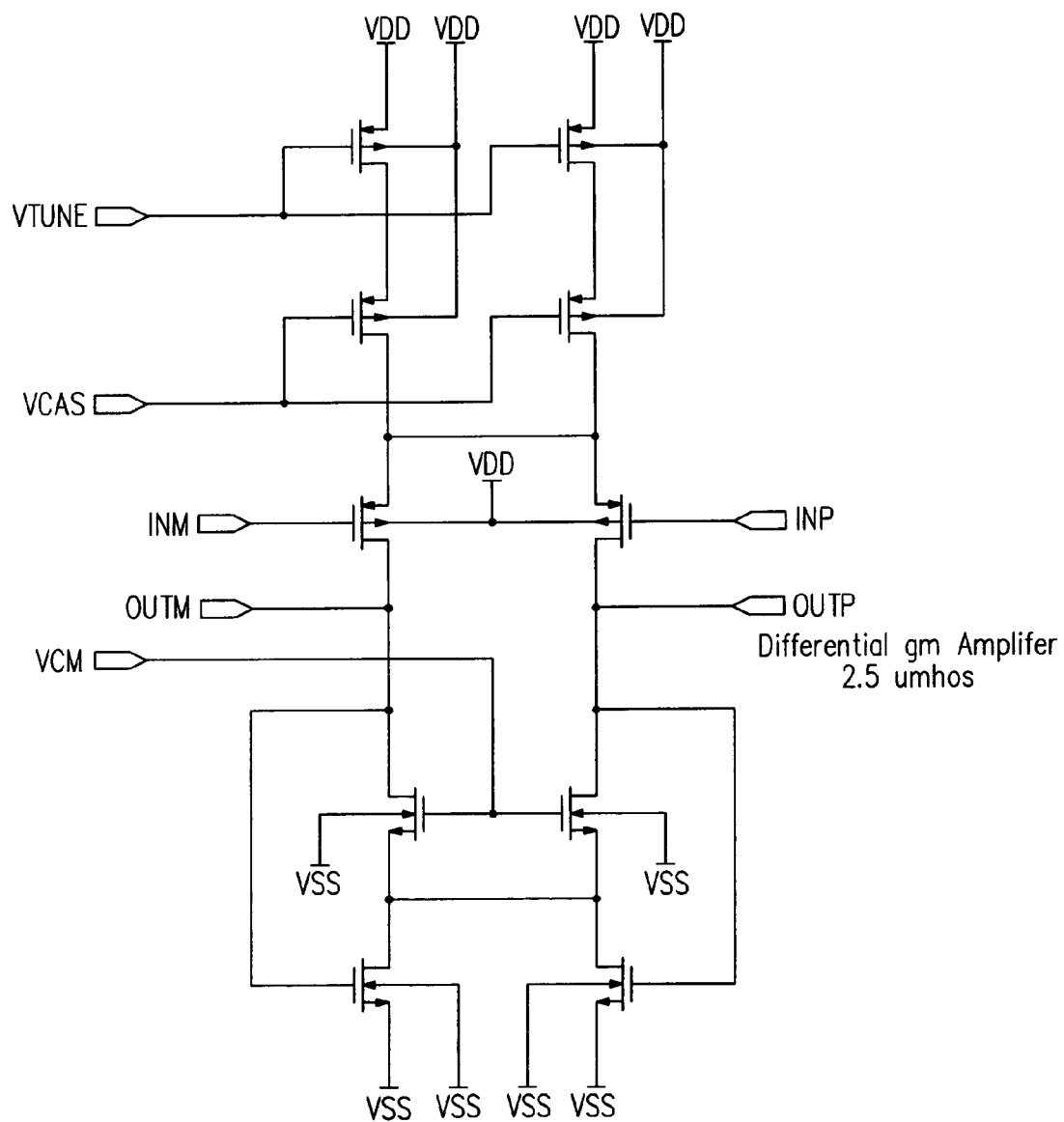
Figure 58:
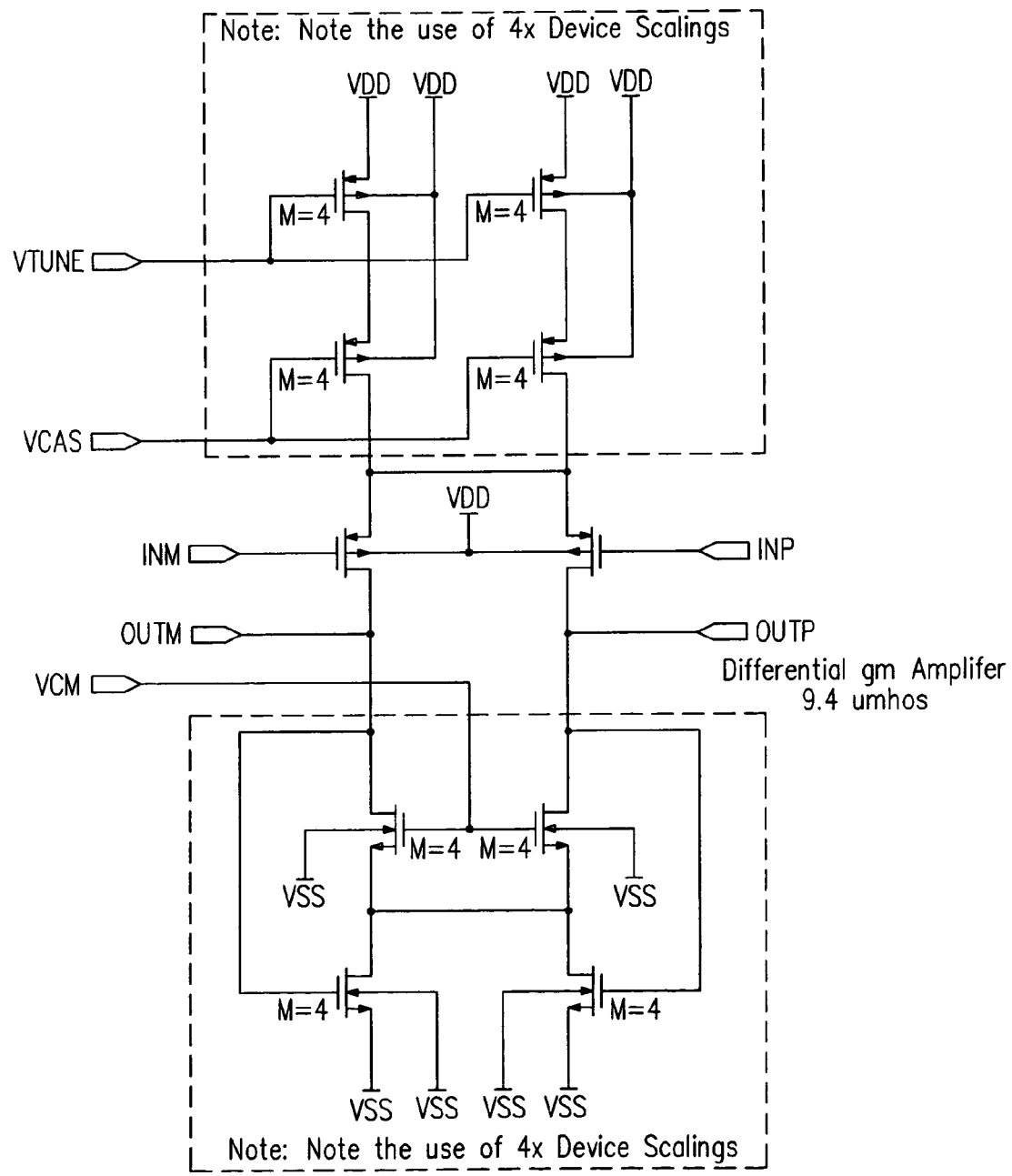
Figure 59:
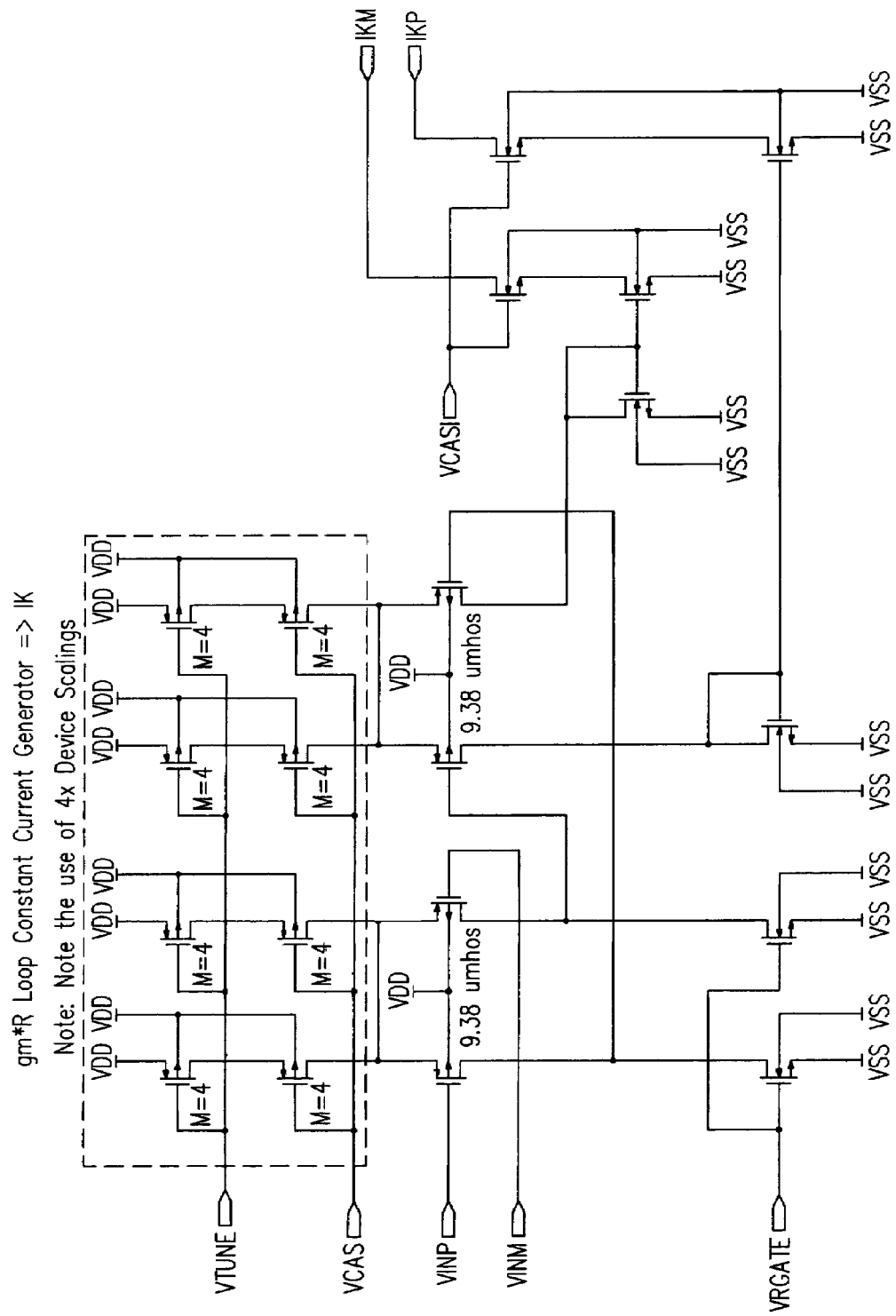
Figure 60:
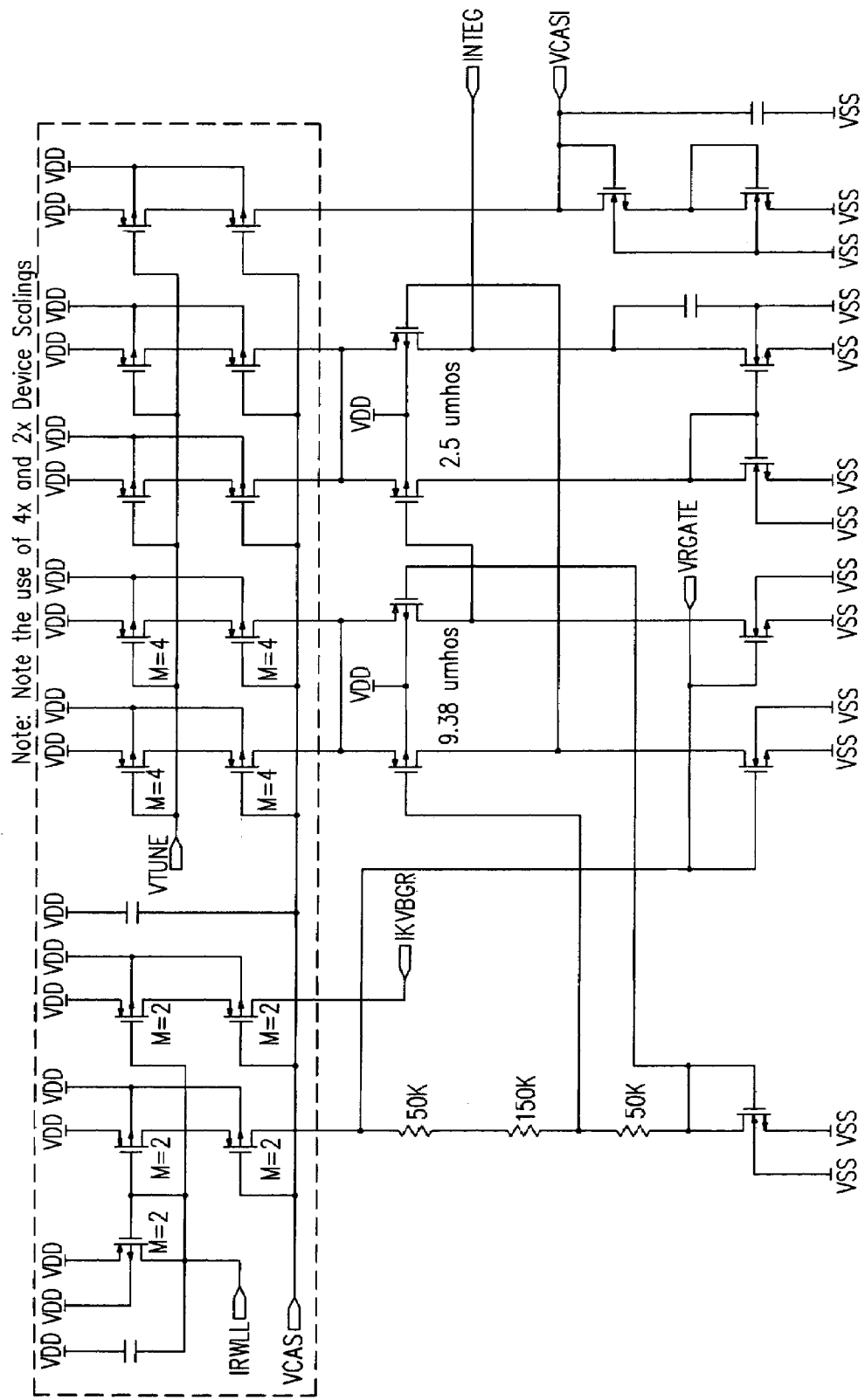
Figure 61:
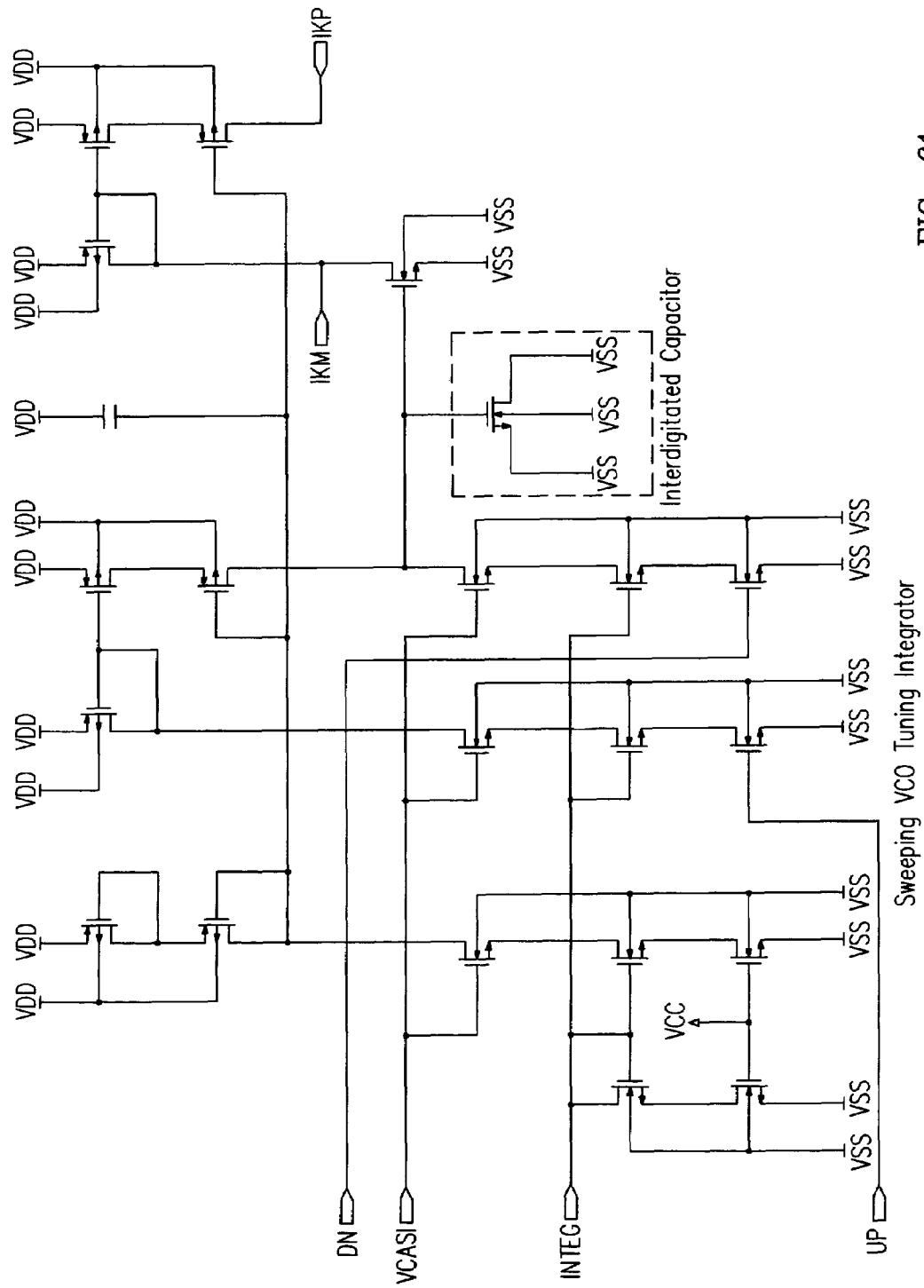
Figure 62:
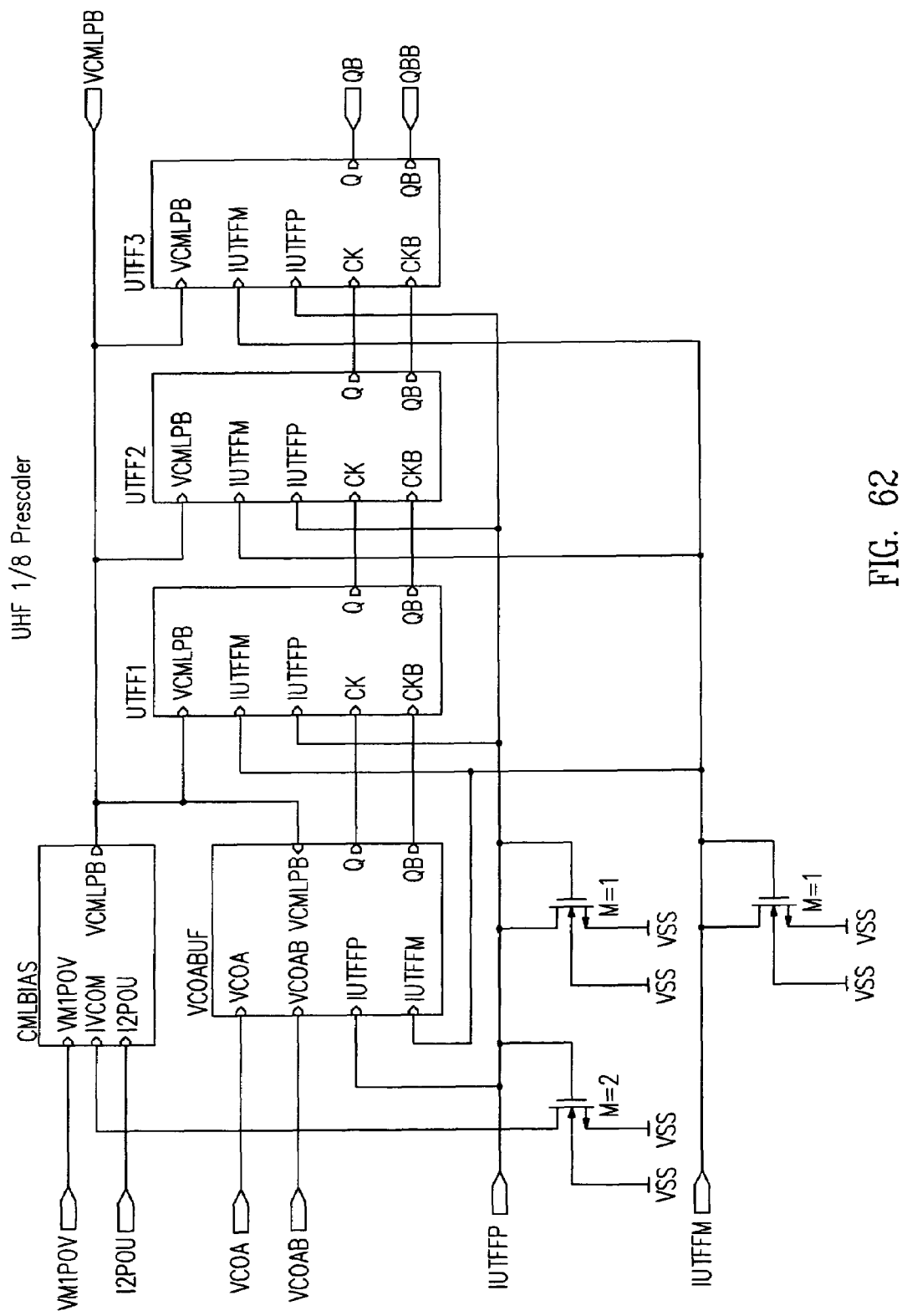
Figure 63:
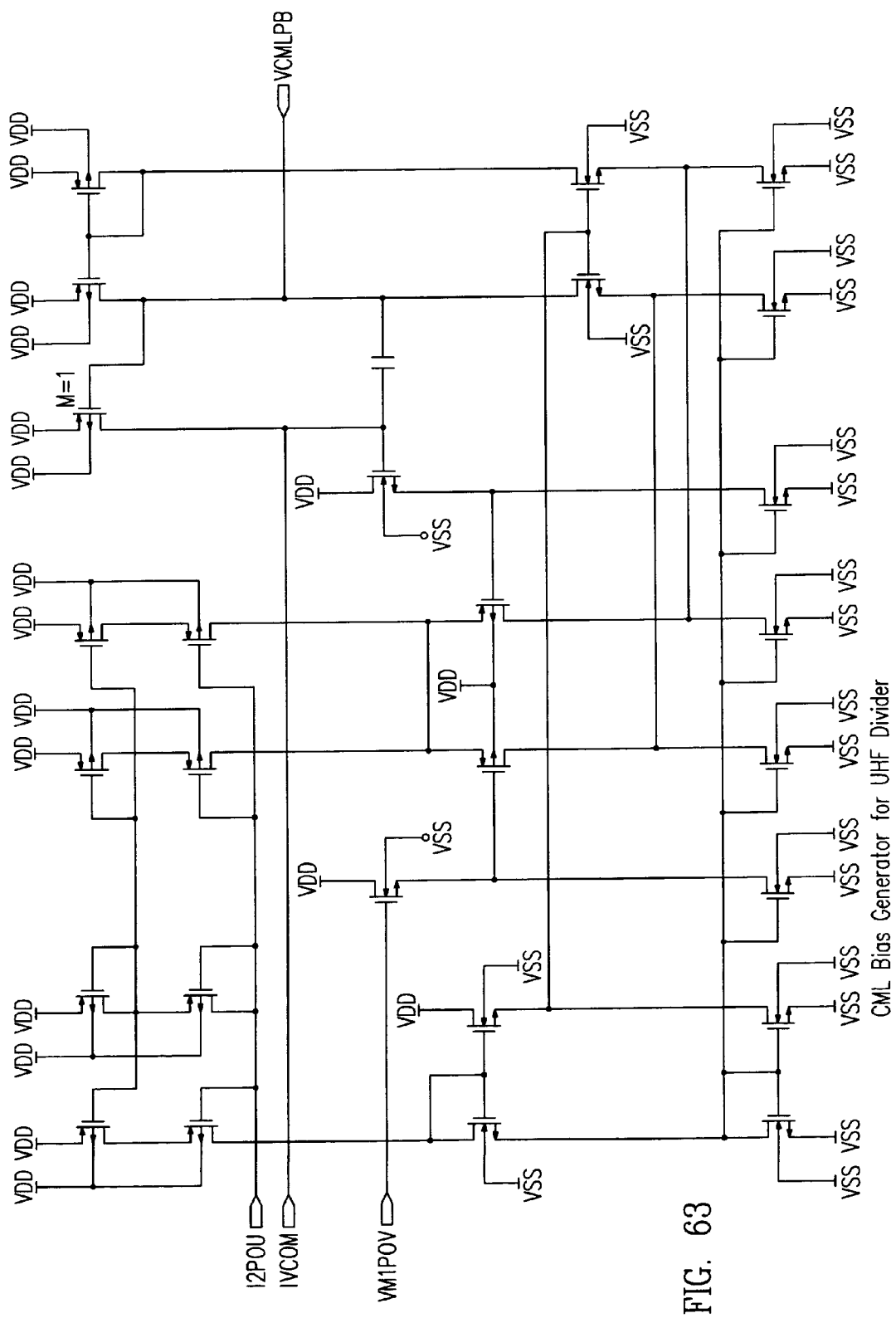
Figure 64:
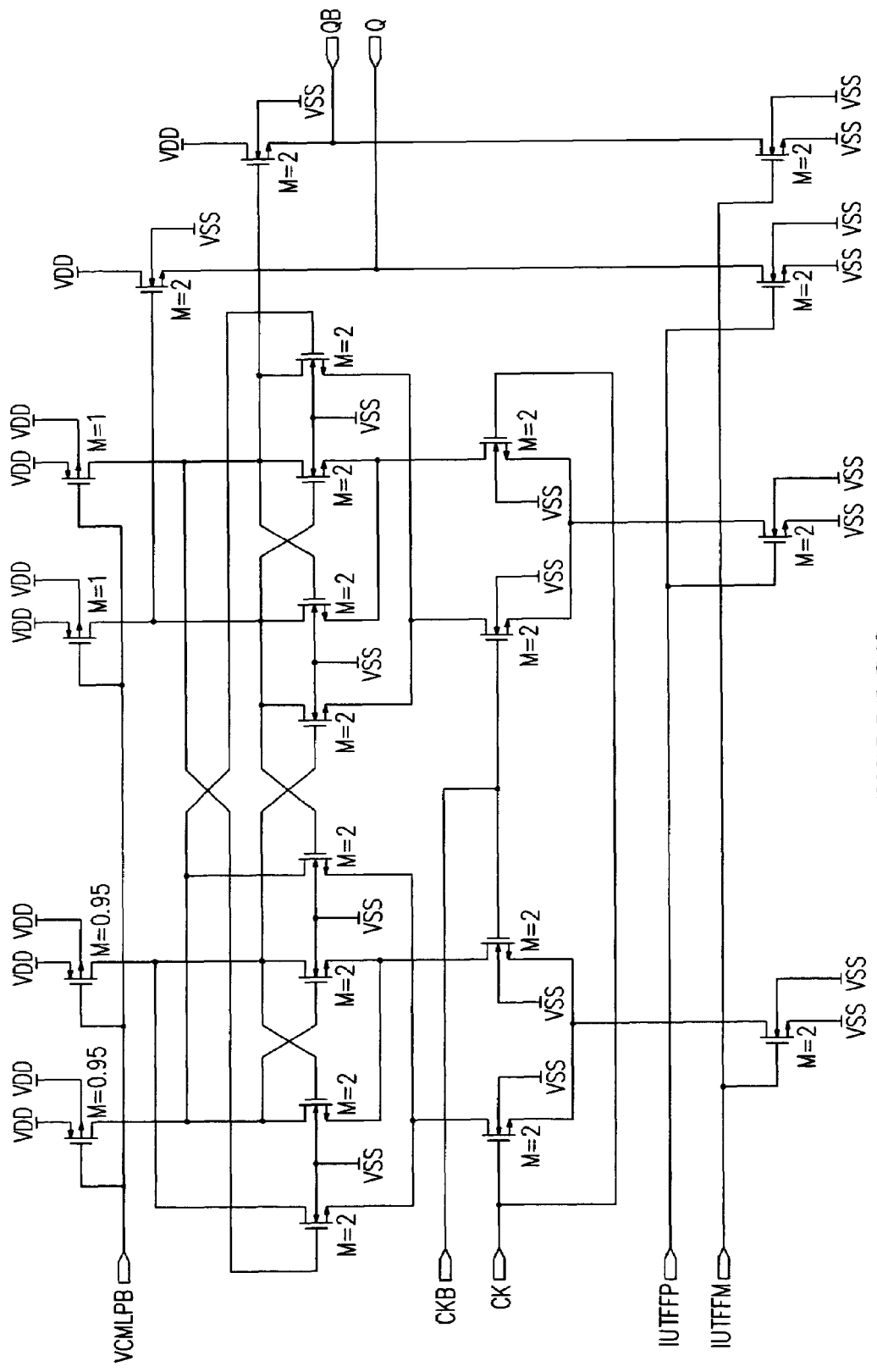
Figure 65:
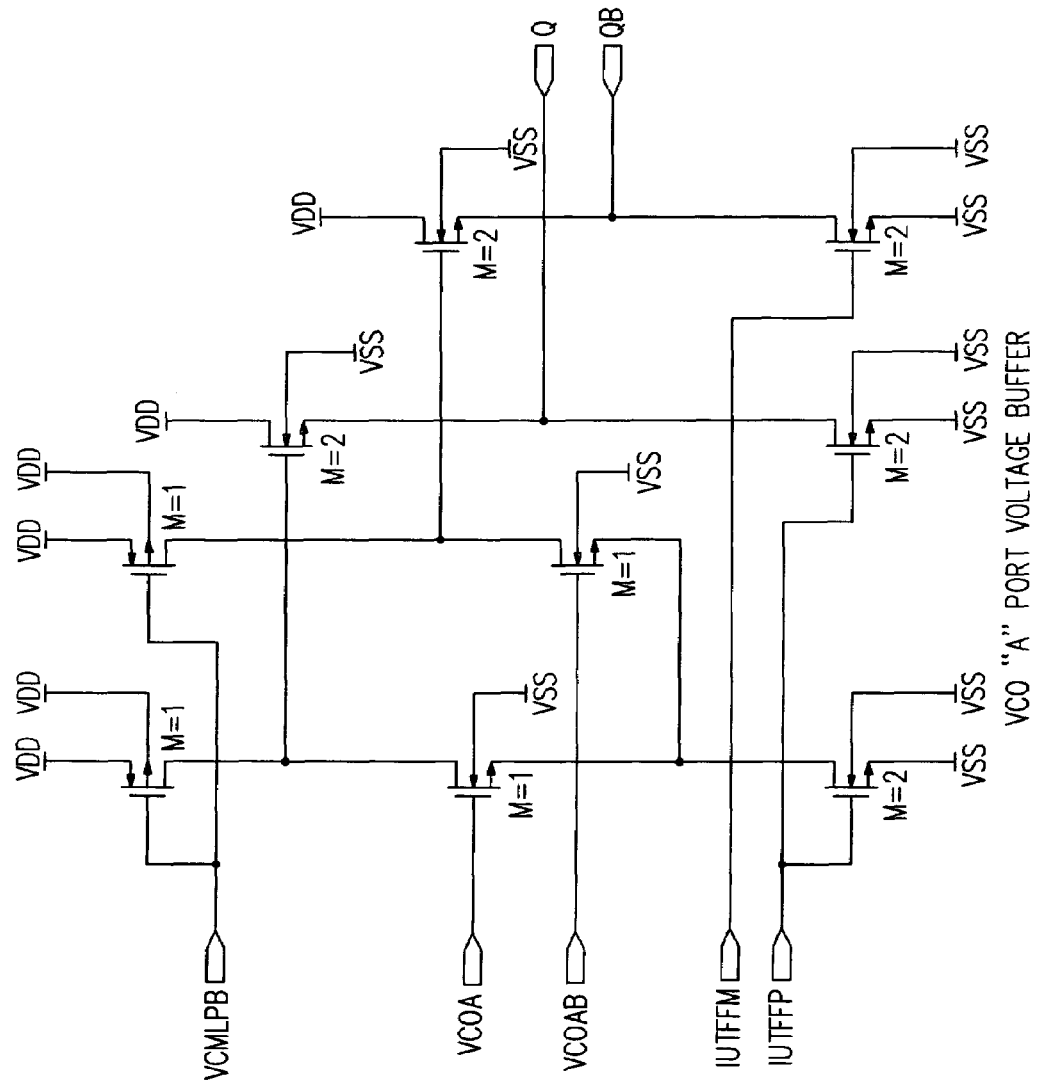
Figure 66A:
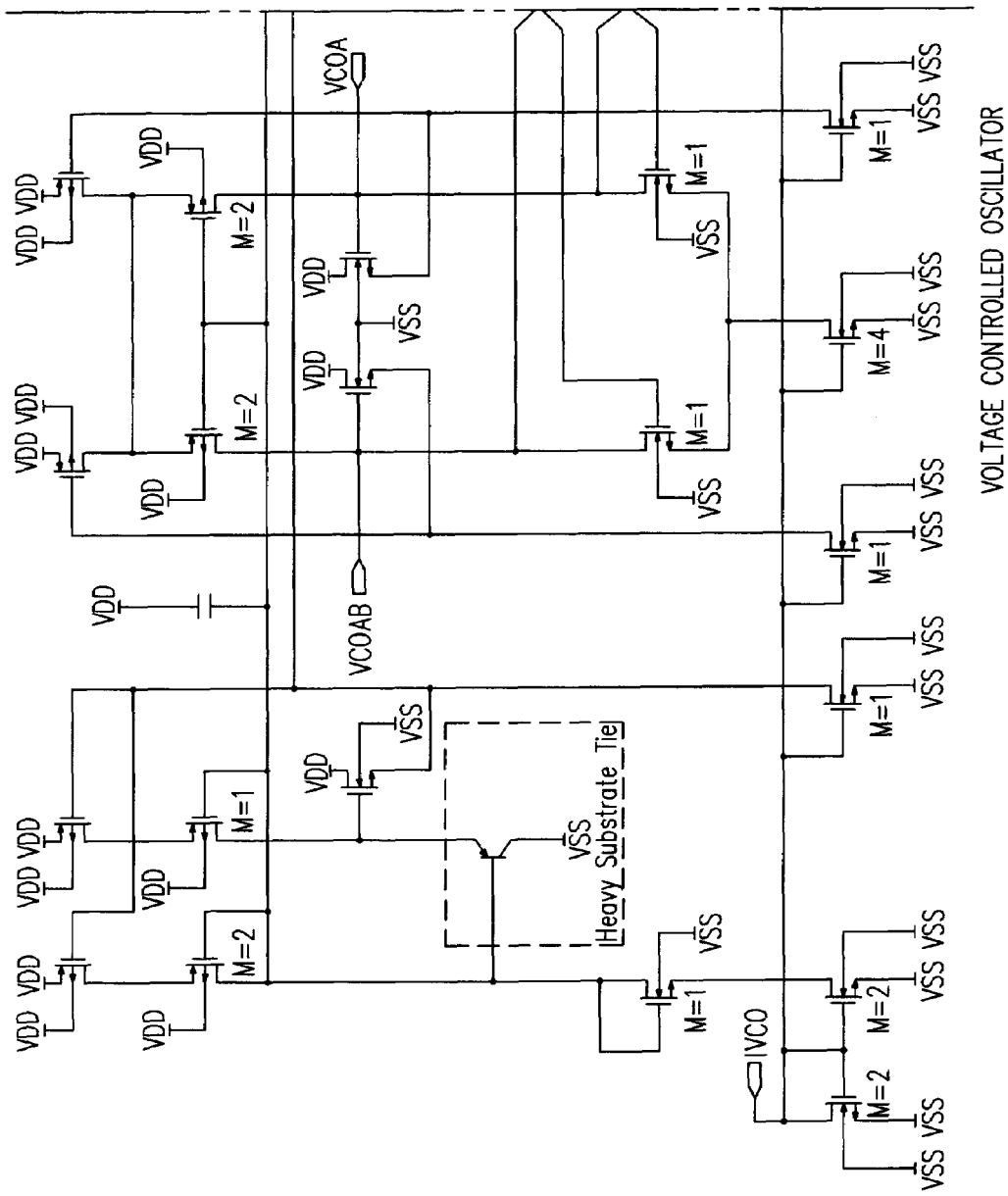
Figure 66B:
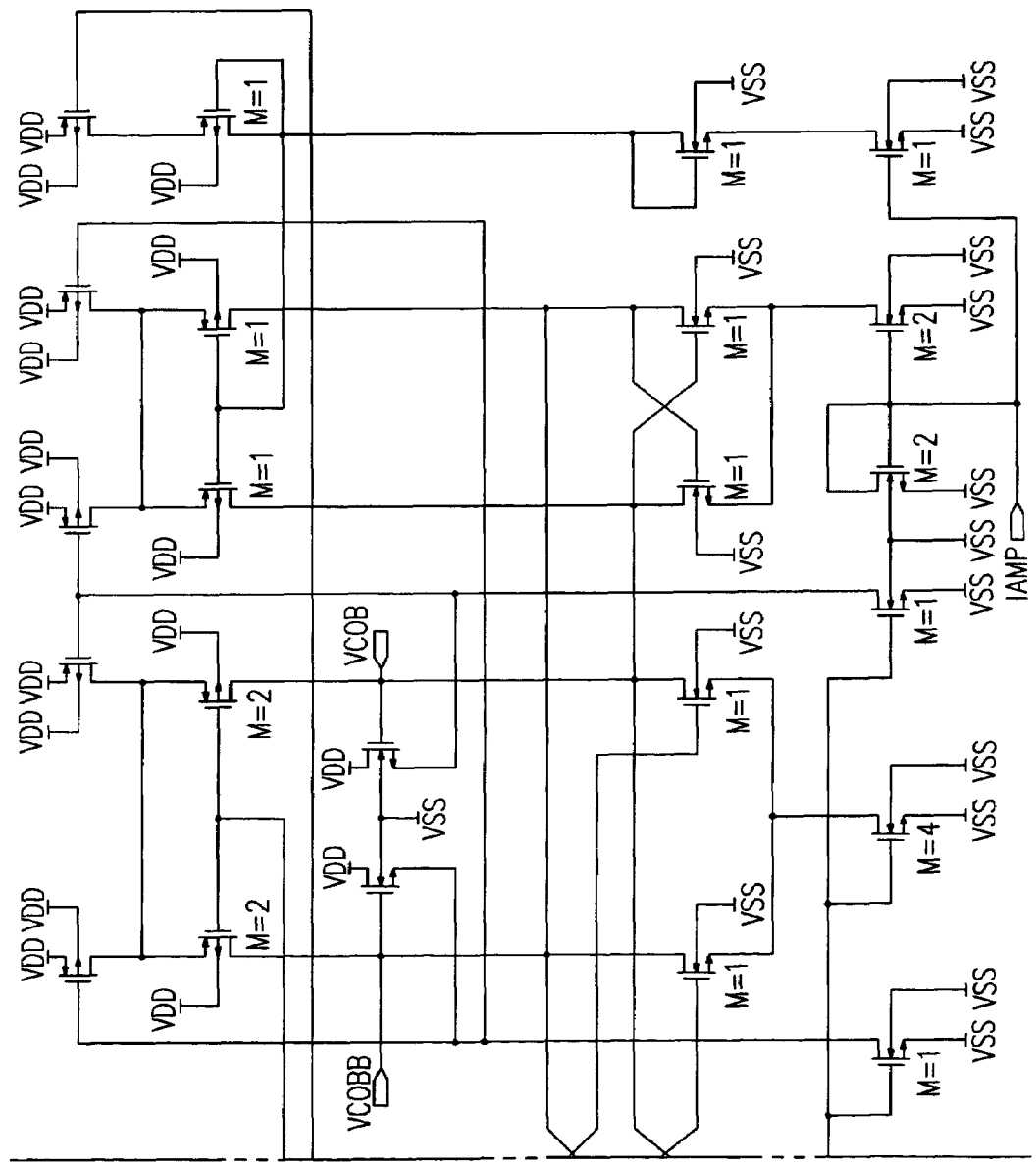
Figure 67:
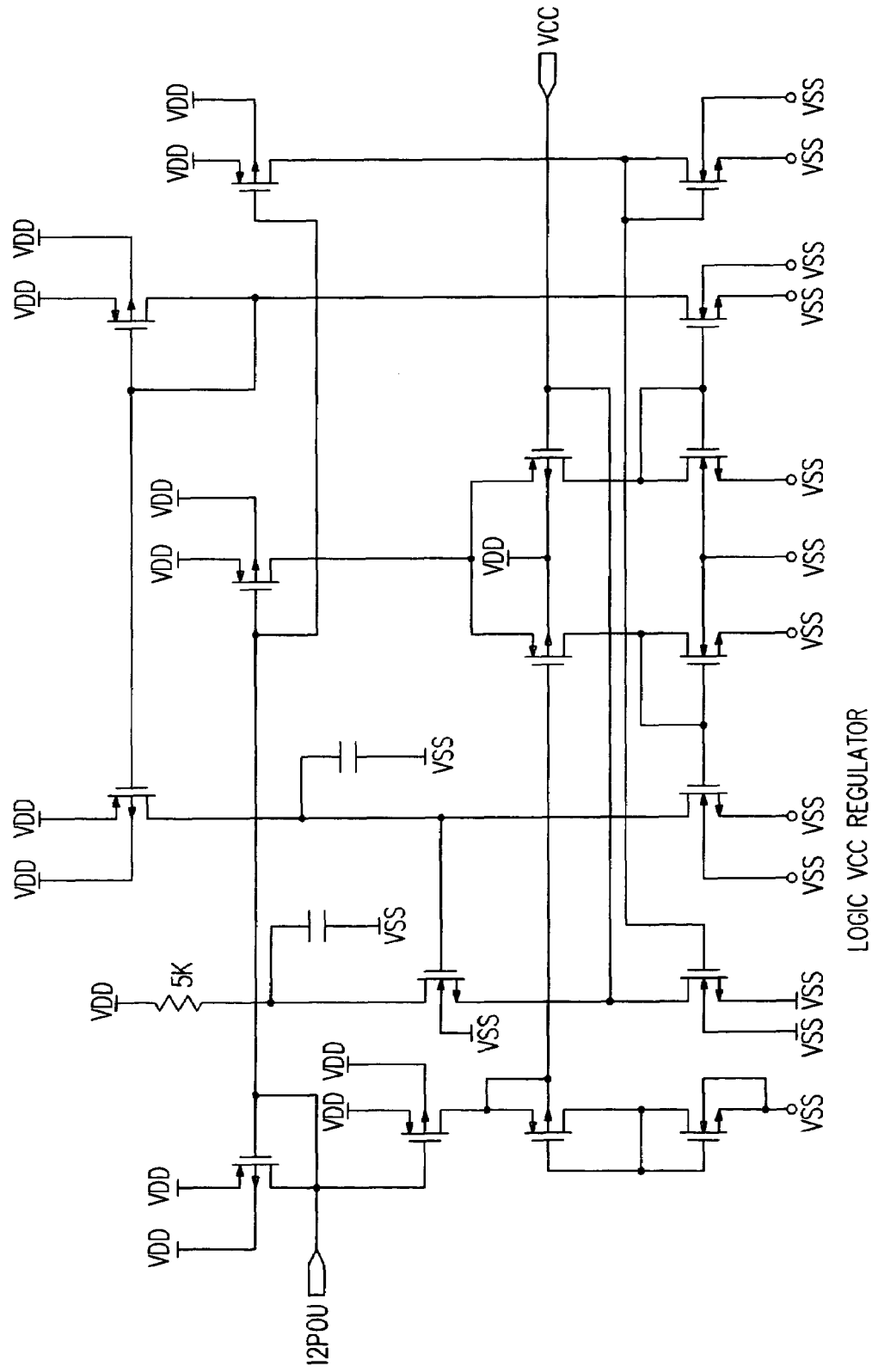
Figures 68, 69:
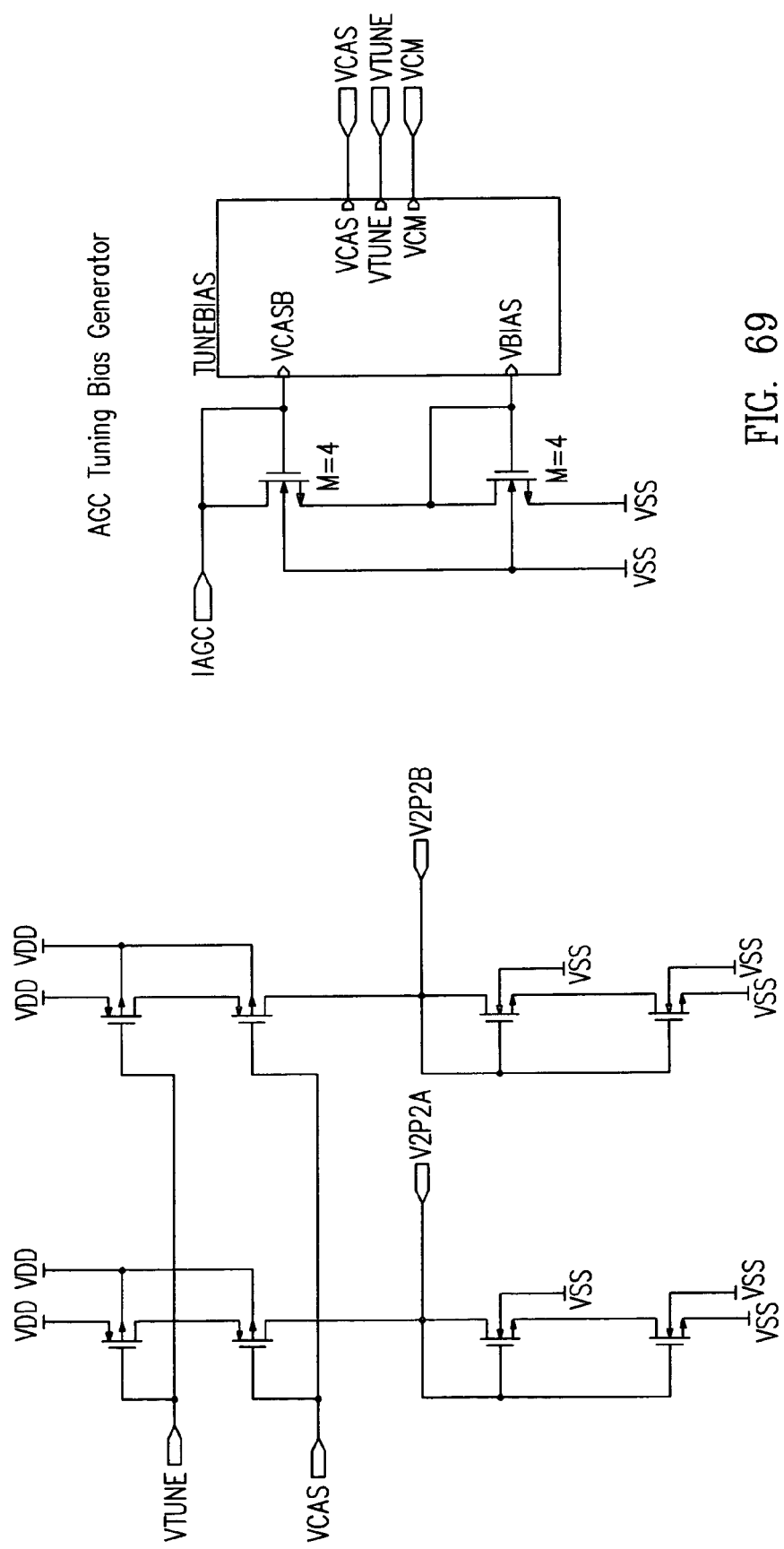
Figure 70:
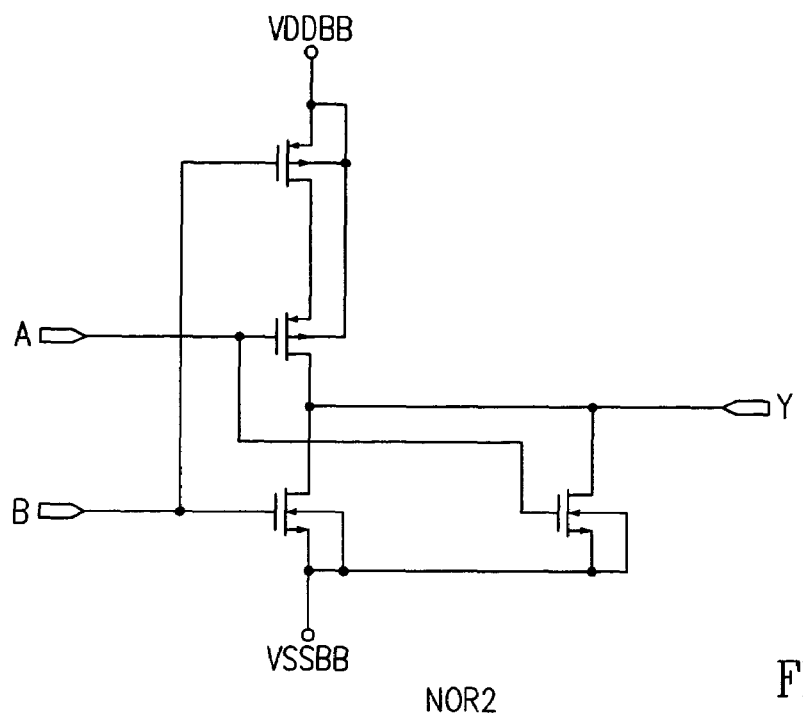
Figure 71:
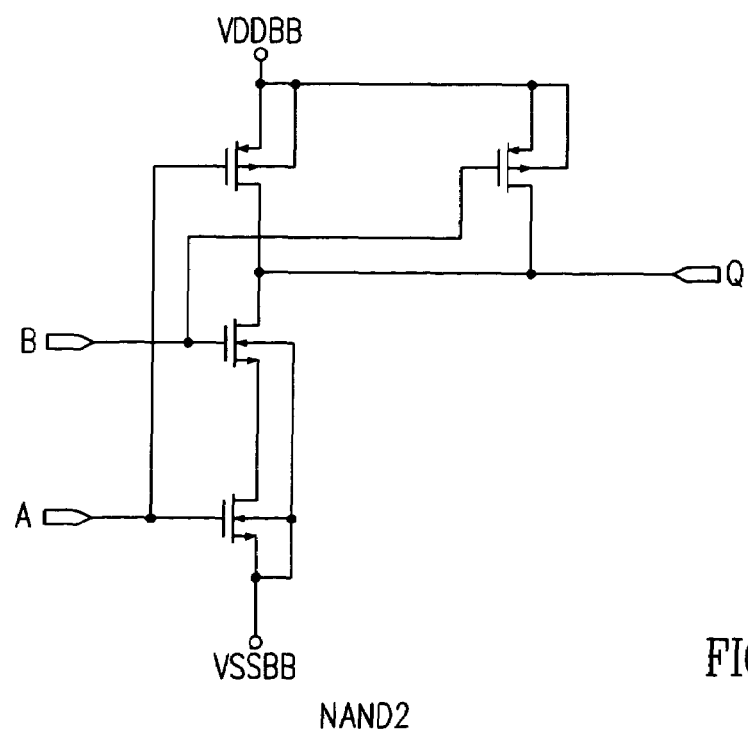
Figure 72:
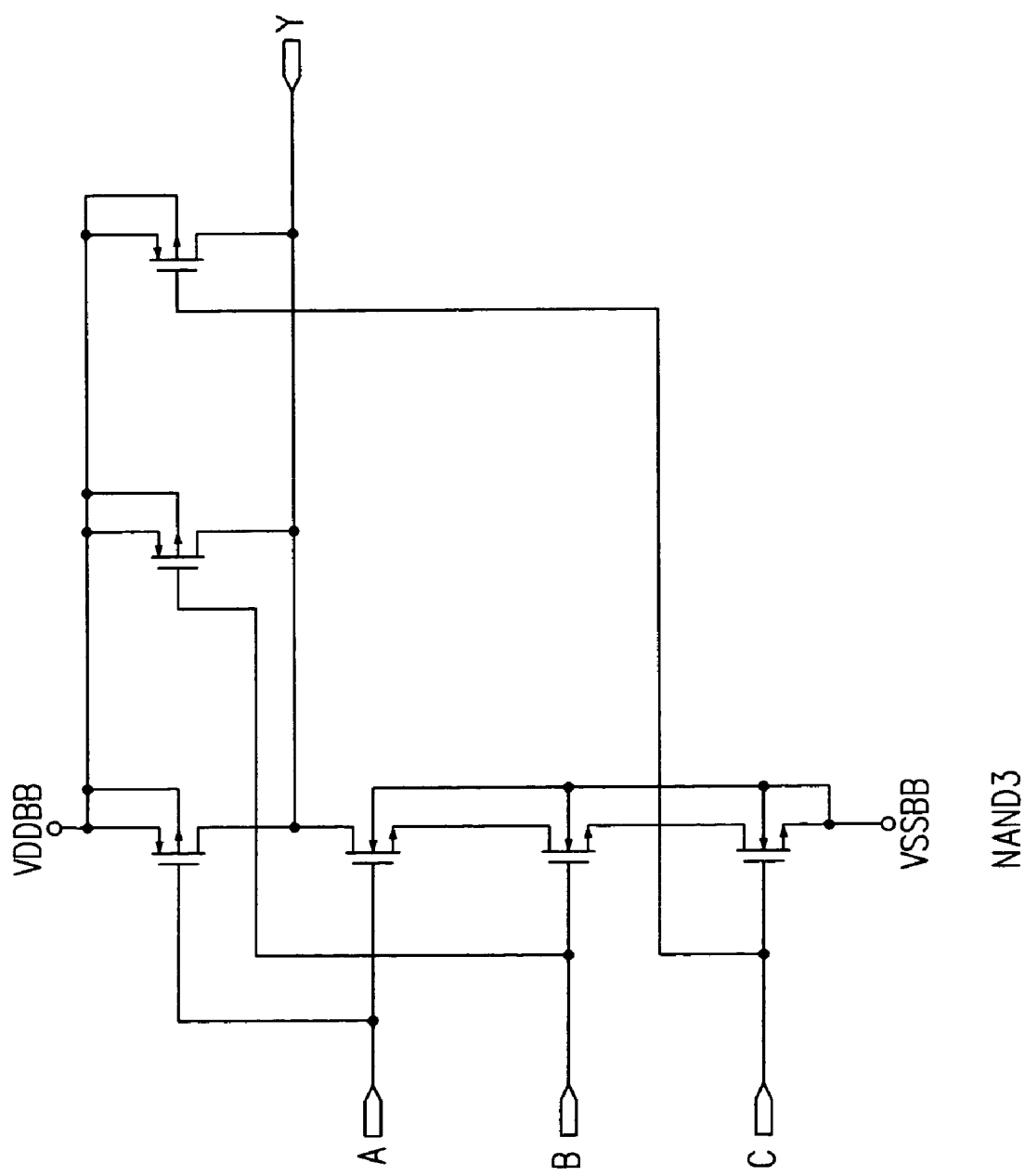
Figure 73:
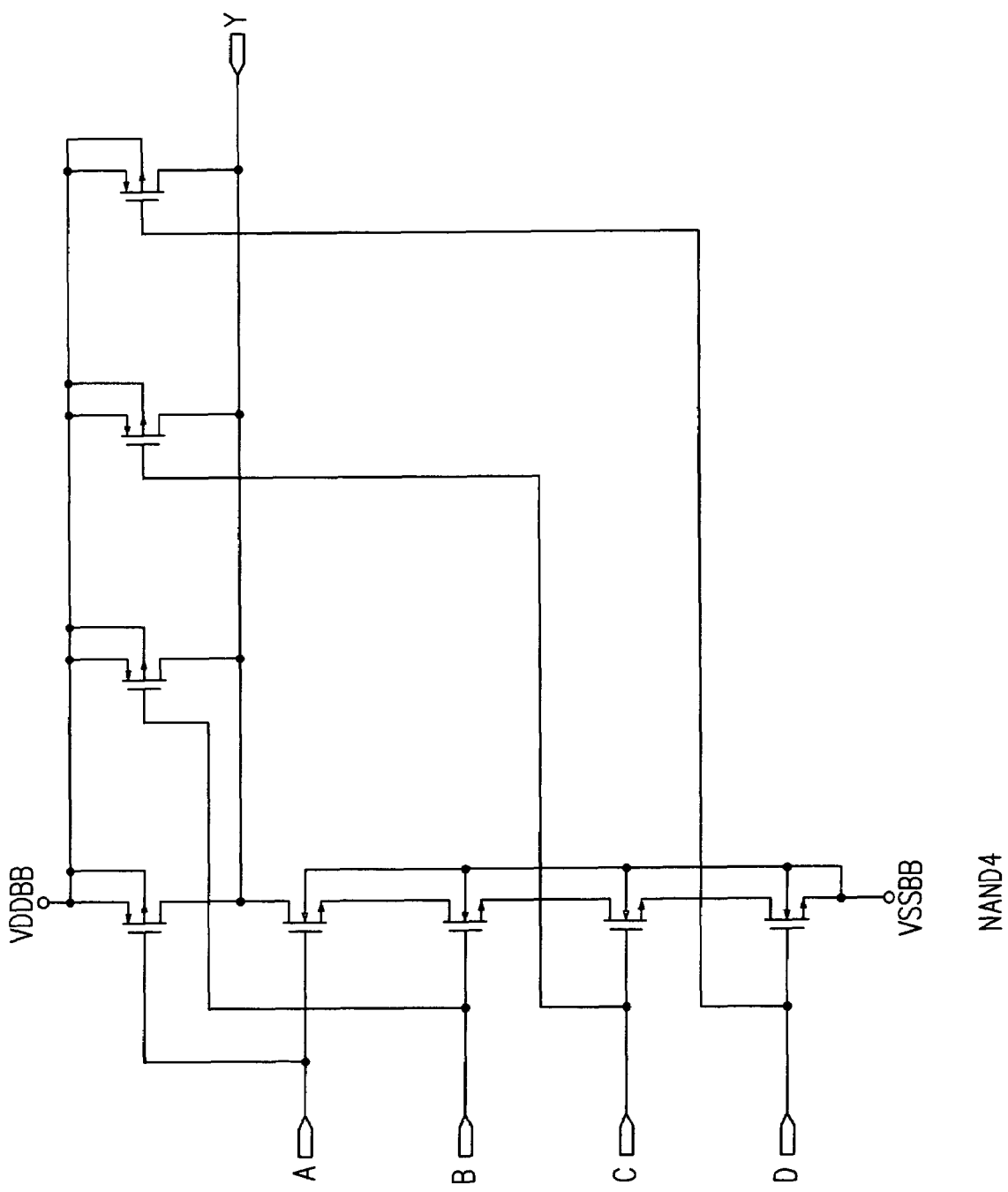

Schematic Diagrams of the various functional units in FIG. 1 are provided as FIGS. 4-76. These schematic diagrams are easily understood by those skilled in the art. All circuitry is formed on a single chip.

CONCLUSION

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for operating an integrated circuit (IC), the method comprising:
   receiving a modulated radio frequency (RF) signal at an input terminal of the IC;
   varying a local oscillator in the IC across a range of frequencies at a sweeping rate higher than a data rate of the modulated RF signal to generate a local oscillator output;
   mixing the local oscillator output with the modulated radio frequency signal using a mixer in the IC to generate a frequency translated signal;
   filtering the frequency translated signal using a filter in the IC to pass a selected range of frequencies as a modulated intermediate frequency (IF) signal; and
   demodulating the modulated IF signal using a demodulator in the IC to generate a data output from the modulated RF signal.

2. The method of claim 1, wherein the local oscillator comprises a divider, an RF oscillator, and a reference oscillator forming a phase-lock-loop (PLL), and wherein varying the local oscillator comprises:
   generating a reference frequency using the reference oscillator;
   dividing an output of the RF oscillator by a division factor provided by the divider to generate a divided frequency;
   dynamically altering the division factor provided by the divider;
   adjusting the output of the RF oscillator to cause frequency lock between the divided frequency and the reference frequency; and
   providing the output of the RF oscillator as the local oscillator output.

3. The method of claim 2, wherein generating the reference frequency comprises supplying a timing signal from a timing device to the reference oscillator, wherein the timing device is external to the IC.

4. The method of claim 1, wherein the local oscillator comprises a divider and an RF oscillator, and wherein varying the local oscillator comprises dynamically altering a division factor provided by the divider, the division factor being applied to a frequency provided by the RF oscillator to sweep the local oscillator output through the range of frequencies.

5. A method for operating a radio receiver formed as a monolithic integrated circuit (IC) chip, the method comprising:
   supplying a control signal to a local oscillator in the monolithic IC chip to select an output from the local oscillator having either a fixed frequency or a varying frequency;

mixing an input radio frequency (RF) signal with the output from the local oscillator using a mixer in the monolithic IC chip to generate a frequency translated signal;

filtering the frequency translated signal using an intermediate frequency (IF) filter of a superheterodyne receiver in the monolithic IC chip to generate an IF signal; and demodulating the IF signal using a demodulator in the monolithic IC chip to generate a data signal, wherein said superheterodyne receiver and said demodulator both being formed using CMOS transistors and no bipolar transistors.

6. The method of claim 5, wherein the output from the local oscillator comprises a band of frequencies about 2-3% around a transmit frequency of the input RF signal.

7. A method for operating a radio receiver formed as a monolithic integrated circuit (IC), the method comprising:

supplying a control signal to a local oscillator in the monolithic IC to select an output from the local oscillator having either a fixed frequency or a varying frequency;

mixing an input radio frequency (RF) signal with the output from the local oscillator using a mixer in the monolithic IC to generate a frequency translated signal;

filtering the frequency translated signal using an intermediate frequency (IF) filter in the monolithic IC to generate an IF signal; and demodulating the IF signal using a demodulator in the monolithic IC to generate a data signal, wherein the demodulator comprises a baseband filter, and wherein demodulating the IF signal comprises:

applying a first control signal to a first bandwidth selection pin of the monolithic IC to adjust a bandwidth of the baseband filter; and filtering the IF signal using the baseband filter as a lowpass filter.

8. The method of claim 7, wherein demodulating the IF signal further comprises applying a second control signal to a second bandwidth selection pin of the monolithic IC, wherein the first control signal and the second control signal determine the bandwidth of the baseband filter.

9. A method for operating a radio receiver formed as a monolithic integrated circuit (IC) chip, the method comprising:

filtering an input radio frequency (RF) signal using an intermediate frequency (IF) filter circuit in an all-CMOS superheterodyne receiver having no bipolar transistors in the monolithic IC chip to generate an IF filtered output; and demodulating the IF filtered output using an all-CMOS demodulator having no bipolar transistors in the monolithic IC chip to generate a digital data signal.

10. The method of claim 9, further comprising performing logic functions on the digital data signal using a decoder in the monolithic IC chip to generate binary data at a data output terminal of the monolithic IC chip.

11. The method of claim 10, wherein performing logic functions on the digital data signal comprises performing a decoding operation involving a changing code scheme.

12. The method of claim 9, wherein filtering the input RF signal comprises:

providing a timing signal from a timing device to a local oscillator (LO) circuit in the monolithic IC chip, the timing device being external to the monolithic IC chip;

generating a LO output signal based on the timing signal using the LO circuit;

mixing the input RF signal with the local oscillator (LO) output signal using a mixer in the monolithic IC chip to generate a frequency translated signal; and filtering the frequency translated signal using an IF filter in the IF filter circuit.

13. The method of claim 9, wherein the digital data signal has a DC component, the method further comprising filtering the DC component from the digital data signal using a low pass filter that includes a capacitor that is external to the monolithic IC chip.

14. The method of claim 9, further comprising controlling a gain of the all-CMOS superheterodyne receiver using an automatic gain control (AGC) circuit that monitors a magnitude of the IF filtered output.

15. The method of claim 9, further comprising providing a bias voltage to the all-CMOS superheterodyne receiver and the all-CMOS demodulator using a bias supply circuit.

16. The method of claim 15, wherein the all-CMOS superheterodyne receiver and the all-CMOS demodulator are formed using a plurality of pFET transistors and a plurality of nFET transistors, each of the plurality of pFET transistors having a first threshold voltage and each of the plurality of nFET transistors having a second threshold voltage, and wherein the bias voltage is approximately equal to the first threshold voltage plus the second threshold voltage.

17. The method of claim 9, wherein the all-CMOS superheterodyne receiver comprises a local oscillator (LO), a mixer, and a sweep generator, and wherein filtering the input RF signal comprises:

generating a varying frequency output from a local oscillator in the all-CMOS superheterodyne receiver;

mixing the input RF signal with the LO output signal using a mixer in the all-CMOS superheterodyne receiver to generate a frequency translated signal; and filtering the frequency translated signal using an IF filter in the IF filter circuit.

18. The method of claim 17, wherein generating the varying frequency output from the local oscillator comprises varying a frequency of the local oscillator at a rate higher than a data rate of the input RF signal.

19. The method of claim 9, wherein the all-CMOS demodulator comprises an amplitude modulation (AM) demodulator or an ON-OFF keyed (OOK) demodulator.

20. The method of claim 9, wherein the all-CMOS superheterodyne receiver is configured to operate in the ISM band.

21. The method of claim 9, further comprising generating a bias signal for controlling filtering characteristics of the IF filter circuit, wherein generating the bias signal comprises:

generating a reference frequency using a reference oscillator in the monolithic IC;

generating a control signal to cause a phase locked loop (PLL) circuit in the monolithic IC chip to achieve frequency lock with the reference frequency; and supplying the control signal to the IF filter circuit as the bias signal.

22. A method for decoding a radio frequency (RF) signal, the method comprising:

providing the RF signal to a monolithic integrated circuit (IC) chip having no bipolar transistors;

generating a local oscillator signal using an all-CMOS local oscillator in the monolithic IC chip;

mixing the local oscillator signal with the RF signal using an all-CMOS mixer in the monolithic IC chip to generate a frequency translated signal;

filtering the frequency translated signal using an all-CMOS filtering circuit of a superhetrodyne receiver having no bipolar transistors in the monolithic IC chip to generate a filtered output; and demodulating the filtered output using an all-CMOS demodulator having no bipolar transistors in the monolithic IC chip to generate a digital data signal.

23. The method of claim 22, wherein mixing the local oscillator signal with the RF signal comprises varying the local oscillator signal across a range of frequencies at a sweeping rate higher than a data rate of the RF signal.

24. The method of claim 23, wherein varying the local oscillator signal comprises:

dividing an output of an RF oscillator in the local oscillator by a division factor to generate a divided frequency;

dynamically altering the division factor;

adjusting the output of the RF oscillator to cause the divided frequency to match a reference frequency; and providing the output of the RF oscillator as the local oscillator signal.

25. The method of claim 24, wherein the reference frequency is process and temperature independent, the method further comprising:

generating a control signal to cause a phase-locked-loop (PLL) circuit in the monolithic IC chip to achieve frequency lock with the reference frequency; and providing the control signal as a bias signal to the all-CMOS local oscillator and the all-CMOS filtering circuit for controlling characteristics of the all-CMOS local oscillator and the all-CMOS filtering circuit.

26. The method of claim 24, wherein adjusting the output of the all-CMOS RF oscillator comprises:

providing a phase-locked-loop (PLL) in the local oscillator that includes the RF oscillator; and adjusting the output of the RF oscillator to achieve frequency lock between the divided frequency and the reference frequency.

27. The method of claim 22, wherein mixing the local oscillator signal with the RF signal comprises maintaining the local oscillator signal at a fixed frequency.

28. The method of claim 22, further comprising filtering a DC component from the digital data signal using a low pass filter that includes a capacitor that is external to the monolithic IC chip.

29. The method of claim 22, further comprising controlling a gain of the all-CMOS filtering circuit using an automatic gain control (AGC) circuit that monitors a magnitude of the filtered output.

30. The method of claim 22, wherein the all-CMOS local oscillator, the all-CMOS mixer, the all-CMOS filtering circuit, and the all-CMOS demodulator are formed using a plurality of pFET transistors and a plurality of nFET transistors, each of the plurality of pFET transistors having a first threshold voltage and each of the plurality of nFET transistors having a second threshold voltage, the method further comprises providing a bias voltage to the all-CMOS local oscillator, the all-CMOS mixer, the all-CMOS filtering circuit, and the all-CMOS demodulator using a bias supply circuit, the bias voltage being approximately equal to the first threshold voltage plus the second threshold voltage.

31. The method of claim 22, wherein the all-CMOS filtering circuit comprises an intermediate frequency bandpass filter.

32. The method of claim 22, wherein the all-CMOS filtering circuit comprises a lowpass filter.

33. The method of claim 22, further comprising providing the digital data signal to a decoder within the monolithic integrated circuit chip.

34. The method of claim 22, further comprising providing the digital data signal to a circuit integrated within the monolithic integrated circuit, said circuit being selected from the group of an arithmetic logic unit circuit, a processor circuit, and a programmable logic circuit.

* * * * *

UNITED STATES PATENT AND TRADEMARK OFFICE
CERTIFICATE OF CORRECTION

PATENT NO.       : 7,299,029 B2
APPLICATION NO.  : 10/661879
DATED            : November 20, 2007
INVENTOR(S)      : Joseph S. Elder et al.

It is certified that error appears in the above-identified patent and that said Letters Patent is hereby corrected as shown below:

Title Page, Item (56)
Page 2, OTHER PUBLICATIONS, insert;

-- Khorram, S. et al., "A CMOS Limiting Amplifier & Logarithmic Signal-Strength Indicator," Integrated Circuits & Systems Laboratory, Electrical Engineering Department, University of California, Los Angeles, 19 pages.

Rofougaran, A., et al., "A 900 MHz CMOS LC-Oscillator with Quadrature Outputs," presented at the 1996 Int'l. Solid-State Circuits Conference, 10 pages.

Rudell, Jacques C., "CMOS VLSI Frequency Translation for Multi-Standard Wireless Communication Transceivers," Qualifying Examination, University of California, Berkeley, April 8, 1996, pp. 1-24.

Chang, Glenn et al., "An Agile, Low-Power CMOS Digitally Synthesized 0-13 MHz Sinewave Generator," Integrated Circuits & Systems Laboratory, Electrical Engineering Department, University of California, Los Angeles, 14 pages. --

Column 17, line 6, replace "superhetrodyne" with -- superheterodyne --.

Column 19, line 2, replace "superhetrodyne" with -- superheterodyne --.

Signed and Sealed this

Fourth Day of November, 2008

JON W. DUDAS
*Director of the United States Patent and Trademark Office*